(12) United States Patent
Choi et al.

(10) Patent No.: US 11,114,511 B2
(45) Date of Patent: Sep. 7, 2021

(54) DISPLAY DEVICE

(71) Applicant: SAMSUNG DISPLAY CO., LTD., Yongin-si (KR)

(72) Inventors: Wonjun Choi, Yongin-si (KR); Iljoo Kim, Yongin-si (KR); Deokjung Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/853,853

(22) Filed: Apr. 21, 2020

(65) Prior Publication Data
US 2021/0057490 A1 Feb. 25, 2021

(30) Foreign Application Priority Data
Aug. 21, 2019 (KR) .................. 10-2019-0102458

(51) Int. Cl.
  *G06F 3/044* (2006.01)
  *H01L 27/32* (2006.01)
  *H01L 51/52* (2006.01)
(52) U.S. Cl.
  CPC ............ *H01L 27/323* (2013.01); *G06F 3/044* (2013.01); *H01L 27/322* (2013.01); *H01L 27/3276* (2013.01); *H01L 51/5246* (2013.01); *H01L 51/5284* (2013.01); *H01L 51/5293* (2013.01)
(58) Field of Classification Search
  CPC ..... G06F 3/044; H01L 27/322; H01L 27/323; H01L 27/3234; H01L 27/3276; H01L 51/5246; H01L 51/5281; H01L 51/5284; H01L 51/5293

USPC .................. 345/156, 170–178, 690–696
See application file for complete search history.

(56) References Cited

U.S. PATENT DOCUMENTS

| | | | |
|---|---|---|---|
| 10,466,822 B2 | 11/2019 | Kim et al. | |
| 2011/0122348 A1* | 5/2011 | Sakai | G02F 1/133512 349/110 |
| 2017/0287992 A1* | 10/2017 | Kwak | G06F 1/1626 |
| 2018/0107052 A1 | 4/2018 | Jiang et al. | |
| 2018/0342700 A1* | 11/2018 | Cai | H01L 51/5256 |
| 2019/0064968 A1* | 2/2019 | Liu | G06F 3/0443 |
| 2019/0073509 A1* | 3/2019 | Chien | G02F 1/13338 |

(Continued)

FOREIGN PATENT DOCUMENTS

| | | |
|---|---|---|
| KR | 10-1701368 | 2/2017 |
| KR | 10-2017-0079859 | 7/2017 |

(Continued)

*Primary Examiner* — Tony O Davis
(74) *Attorney, Agent, or Firm* — F. Chau & Associates, LLC

(57) ABSTRACT

A display device includes a display panel comprising two pixels spaced apart from each other and a transmission area between the two pixels. An input sensing section is disposed on the display panel and comprises sensing electrodes and trace lines electrically connected to the sensing electrodes. A metal layer is on the display panel. The metal layer is disposed between the two pixels and surrounds the transmission area. The metal layer comprises a first hole located in the transmission area. The first hole has a first width. An optical functional section is on the metal layer. The optical functional section includes a second hole that overlaps the first hole. The second hole has a second width that is greater than the first width.

36 Claims, 43 Drawing Sheets

(56) References Cited

U.S. PATENT DOCUMENTS

| | | | | |
|---|---|---|---|---|
| 2019/0214601 A1* | 7/2019 | Park | | H01L 51/5234 |
| 2019/0393444 A1* | 12/2019 | Nam | | H01L 51/5253 |
| 2020/0104562 A1* | 4/2020 | Sung | | H01L 27/323 |
| 2020/0106045 A1* | 4/2020 | Han | | H01L 27/3246 |
| 2020/0110495 A1* | 4/2020 | Han | | G06F 3/0412 |
| 2020/0117307 A1* | 4/2020 | Jin | | G06F 3/045 |
| 2020/0117334 A1* | 4/2020 | Li | | G06F 3/04164 |
| 2020/0124910 A1* | 4/2020 | Hwang | | G02F 1/1339 |
| 2020/0133415 A1* | 4/2020 | Choi | | G06F 3/044 |
| 2020/0161582 A1* | 5/2020 | Choi | | H01L 27/326 |
| 2020/0174295 A1* | 6/2020 | Baek | | G02F 1/1339 |
| 2020/0176551 A1* | 6/2020 | Park | | H01L 27/3276 |
| 2020/0176709 A1* | 6/2020 | Moon | | H01L 51/5253 |
| 2020/0210005 A1* | 7/2020 | Kim | | G06F 3/0412 |
| 2020/0212138 A1* | 7/2020 | Lee | | H01L 51/447 |
| 2020/0235180 A1* | 7/2020 | Park | | H01L 27/3258 |
| 2020/0243610 A1* | 7/2020 | Han | | H01L 51/5281 |
| 2020/0266246 A1* | 8/2020 | Bok | | H01L 51/5228 |
| 2020/0287164 A1* | 9/2020 | Choi | | H01L 51/5237 |
| 2020/0295112 A1* | 9/2020 | Kim | | H01L 51/56 |
| 2020/0303478 A1* | 9/2020 | Lee | | H01L 51/5092 |
| 2020/0303677 A1* | 9/2020 | Lee | | H01L 27/3225 |
| 2020/0312933 A1* | 10/2020 | Lee | | H01L 27/3225 |
| 2020/0312934 A1* | 10/2020 | Bae | | H01L 27/3265 |
| 2020/0328375 A1* | 10/2020 | Won | | H01L 27/323 |
| 2020/0343312 A1* | 10/2020 | Ryu | | G09G 3/3266 |
| 2020/0343478 A1* | 10/2020 | Hwang | | G06F 3/0412 |
| 2020/0357869 A1* | 11/2020 | Choi | | H01L 51/56 |
| 2020/0379601 A1* | 12/2020 | Takiguchi | | G06T 7/70 |
| 2020/0380236 A1* | 12/2020 | He | | G06F 3/044 |
| 2020/0380239 A1* | 12/2020 | Lee | | G06K 9/2027 |
| 2020/0380915 A1* | 12/2020 | Yoon | | G09G 3/3225 |
| 2020/0381486 A1* | 12/2020 | Jeong | | H01L 27/3276 |
| 2020/0381660 A1* | 12/2020 | Lee | | H01L 51/5253 |
| 2020/0394381 A1* | 12/2020 | Ryu | | G06K 9/00013 |
| 2020/0395433 A1* | 12/2020 | Sung | | H01L 27/3276 |
| 2020/0403040 A1* | 12/2020 | Park | | H01L 51/5284 |
| 2020/0408630 A1* | 12/2020 | Zhao | | H04N 7/18 |

FOREIGN PATENT DOCUMENTS

| | | |
|---|---|---|
| KR | 10-2018-0063633 | 6/2018 |
| KR | 10-2018-0082572 | 6/2018 |
| KR | 10-1957671 | 3/2019 |

* cited by examiner

DISPLAY DEVICE

CROSS-REFERENCE TO RELATED APPLICATION

This application claims priority under 35 U.S.C. § 119 to Korean Patent Application No. 10-2019-0102458, filed on Aug. 21, 2019 in the Korean Intellectual Property Office, the disclosure of which is incorporated by reference in its entirety herein.

1. TECHNICAL FIELD

One or more exemplary embodiments relate to display devices, and more particularly, to a display device including a transmission area.

2. DISCUSSION OF RELATED ART

Display devices have been incorporated in an increasingly wide variety of electronic devices. As display devices have become thinner and lighter, there has been a corresponding increase in the range of use for the display devices.

The size of the display area of display devices has increased and various functions have been added to display devices. Display devices having display areas which include various functions other than image display have been developed.

SUMMARY

A display device may include, within a display area, a transmission area capable of transmitting light as an area for adding various functions. When the display device comprises the transmission area, a light-emitting diode may be damaged by external light that is incident upon the transmission area, and a structure around the transmission area may be relatively weak to external static electricity. One or more exemplary embodiments include a high-quality display device. However, the one or more embodiments are only examples, and the scope of the disclosure is not limited thereto.

Additional aspects will be set forth in part in the description which follows and, in part, will be apparent from the description, or may be learned by practice of the presented embodiments of the disclosure According to one or more exemplary embodiments, a display device includes a display panel comprising two pixels spaced apart from each other and a transmission area between the two pixels. An input sensing section is disposed on the display panel and comprises sensing electrodes and trace lines electrically connected to the sensing electrodes. A metal layer is on the display panel. The metal layer is disposed between the two pixels and surrounds the transmission area. The metal layer comprises a first hole located in the transmission area. The first hole has a first width. An optical functional section is on the metal layer. The optical functional section includes a second hole that overlaps the first hole. The second hole has a second width that is greater than the first width.

The display device may further include an optical functional section that is on the metal layer and includes a second hole that overlaps the first hole and has a width that is greater than a first width of the first hole.

The optical functional section may cover only a portion of the metal layer.

The optical functional section may include a polarizer, a retarder, a destructive interference structure, or a structure of a color filter and a black matrix.

The metal layer may include a material that is same as a material of the trace lines.

The metal layer may include molybdenum (Mo), magnesium (Mg), silver (Ag), titanium (Ti), copper (Cu), aluminum (Al), or an alloy of thereof.

The display device may further include one or more lines arranged outside the metal layer.

The one or more lines may include a plurality of material portions spaced apart from each other with an opening portion therebetween and arranged along an external edge of the metal layer.

The at least one line may include a first line including a plurality of first material portions spaced apart from each other with a first opening portion therebetween and arranged along an external edge of the metal layer, and a second line arranged along the external edge of the metal layer while being spaced apart from the first line and including a plurality of second material portions spaced apart from each other with a second opening portion therebetween.

The first opening portion may overlap one of the plurality of second material portions in a radial direction away from a center of the transmission area, and the second opening portion may overlap one of the plurality of first material portions in the radial direction away from the center of the transmission area.

The display device may further include a dummy electrode located between neighboring sensing electrodes. The first opening portion or the second opening portion may be arranged adjacent to the dummy electrode.

The display panel may include a substrate; a display layer on the substrate and including the two pixels; and an encapsulation substrate on the display layer.

The display layer may include a hole corresponding to the transmission area, and an upper surface of the substrate and a lower surface of the encapsulation substrate may face each other through the hole of the display layer.

The metal layer may include a plurality of material portions spaced apart from each other.

The display device may further include a window on the optical functional section; and a transparent adhesion layer between the optical functional section and the window.

The window may include a light-shielding unit that overlaps a portion of the metal layer.

At least one of the substrate or the encapsulation member may include a glass material.

In an exemplary embodiment, a display device includes a display panel comprising two pixels spaced apart from each other and a first area between the two pixels. An input sensing section is on the display panel and comprises sensing electrodes and trace lines electrically connected to the sensing electrodes. A metal layer is on the display panel. The metal layer is disposed between the two pixels and surrounding the first area. The metal layer comprises a first hole located in the first area.

According to an exemplary embodiment of the present inventive concepts, a display device includes a display layer having a plurality of pixels disposed in a second area of the display device. A first area is disposed between two adjacent pixels in the second area. The first area includes a transmission area and a component disposed in the first area. A third area is disposed between the second area and the first area. A metal layer is disposed in the third area. The metal layer has a first hole located in the transmission area. The first hole has a first width. The display layer includes a second hole located in the transmission area having a second width that is less than the first width. An optical functional section is disposed on the metal layer. The optical functional section comprises a third hole that overlaps the second hole and first hole. The third hole has a third width that is greater than the first width. The first hole, second hole and third hole form a fourth hole that prevents a field of view restriction for the component.

BRIEF DESCRIPTION OF THE DRAWINGS

The above and other aspects, features, and advantages of certain exemplary embodiments of the present inventive concepts will be more apparent from the following description taken in conjunction with the accompanying drawings, in which.

DETAILED DESCRIPTION OF EXEMPLARY EMBODIMENTS

Figure 1:
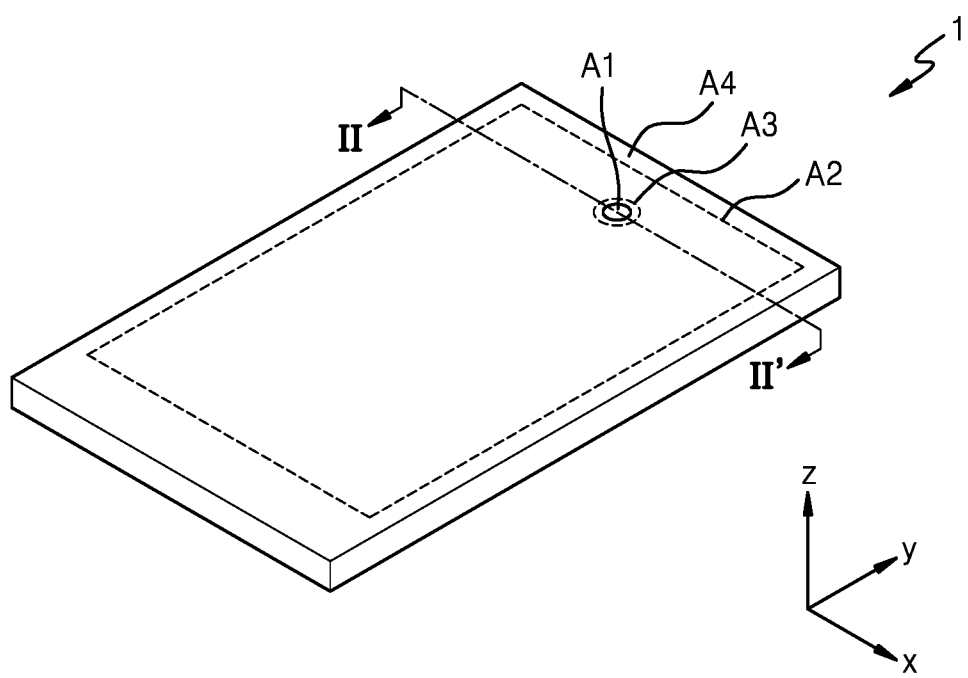
FIG. 1 is a perspective view of a display device according to an exemplary embodiment of the present inventive concepts.

Reference will now be made in detail to embodiments, examples of which are illustrated in the accompanying drawings, wherein like reference numerals refer to like elements throughout. In this regard, exemplary embodiments of the present inventive concepts may have different forms and should not be construed as being limited to the descriptions set forth herein. Accordingly, the exemplary embodiments are merely described below, by referring to the figures, to explain aspects of the present inventive concepts. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

One or more exemplary embodiments of the present inventive concepts will be described below in more detail with reference to the accompanying drawings. Those components that are the same or are in correspondence are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, intervening layers, regions, or components may be present.

Sizes of elements in the drawings may be exaggerated for convenience of explanation. For example, since sizes and thicknesses of components in the drawings are arbitrarily illustrated for convenience of explanation, the following exemplary embodiments are not limited thereto.

When a certain exemplary embodiment may be implemented differently, a specific process order may be performed differently from the described order. For example, two consecutively described processes may be performed substantially at the same time or performed in an order opposite to the described order.

It will also be understood that when a layer, region, or component is referred to as being "connected" or "coupled" to another layer, region, or component, it can be directly connected or coupled to the other layer, region, or component or intervening layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present.

FIG. 1 is a schematic perspective view of a display device 1 according to an exemplary embodiment.

Referring to FIG. 1, the display device 1 may include a first area A1 and a second aa A2 surrounding the first area A1. In the second area A2, a plurality of pixels, for example, an array of pixels, may be arranged, and an image may be displayed on the display device via light emitted by the array of pixels in accordance with an image signal. The second area A2 may correspond to an active area capable of displaying an image (e.g., a display area). In an exemplary embodiment, the first area A1 may be entirely surrounded by the second area A2. For example, as shown in the exemplary embodiment of FIG. 1, the first area A1 may be circular-shaped and may be surrounded on all of its sides (e.g., in the X and/or Y directions) by the second area A2. However, exemplary embodiments of the present inventive concepts are not limited thereto. For example, in other embodiments, the first area A1 may have a variety of different shapes and positions and the first area A1 may not be surrounded on all sides by the second area A2. The first area A1 may be configured to receive a component capable of providing various functions to the display device 1. For example, in an exemplary embodiment, the component may includes a camera or a sensor that uses light and the first area A1 may correspond to a transmission area that may transmit or receive light, such as light of the sensor or light that travels toward the camera.

As shown in the exemplary embodiment of FIG. 1, a third area A3 may be included between the first area A1 and the second area A2. The third area A3 may be a non-display area in which no pixels are arranged. The display device 1 may also include a fourth area A4 that surrounds the second area A2. The fourth area A4 may also be a non-display area in which no pixels are arranged. In the fourth area A4, various types of wires, a circuit, and the like may be arranged. The fourth area A4 may surround all sides of the second area A2. For example, as shown in the exemplary embodiment of FIG. 1, the second area A2 may be rectangular and the fourth area A4 may surround all four sides of the second area A2 (e.g., in the X and/or Y directions).

Each pixel of the plurality of pixels of the display device 1 may include a light-emitting diode as a display element that emits light of a certain color. In an exemplary embodiment, the light-emitting diode may include an organic light-emitting diode including an organic material, as an emission layer. However, exemplary embodiments of the present inventive concepts are not limited thereto. In another exemplary embodiment, the light-emitting diode may include an inorganic light-emitting diode. Alternatively, the light-emitting diode may include quantum dots. For convenience of explanation, an embodiment in which a light-emitting diode includes an organic light-emitting diode will now be described.

In the exemplary embodiment of FIG. 1, the first area A1 is positioned at a central portion of the second area A2 in a width direction (e.g., the X direction). However, exemplary embodiments of the present inventive concepts are not limited thereto. For example, in another exemplary embodiment, the first area A1 may be arranged to be offset to the left or right side in the width direction of the display device 1. The first area A1 may be positioned at various locations, such as being arranged on an upper side, a center, or a lower side in a length direction (e.g., the Y direction) of the display device 1. In exemplary embodiments in which the first area A1 is positioned at an edge of the second area A2, the fourth area A4 may surround at least one side of the first area A1 and the second area A2 may not surround each of the sides of the first area A1.

In the exemplary embodiment of FIG. 1, the display device 1 includes a single first area A1. However, in other exemplary embodiments, the display device 1 may include a plurality of first areas A1.

Figure 2A:
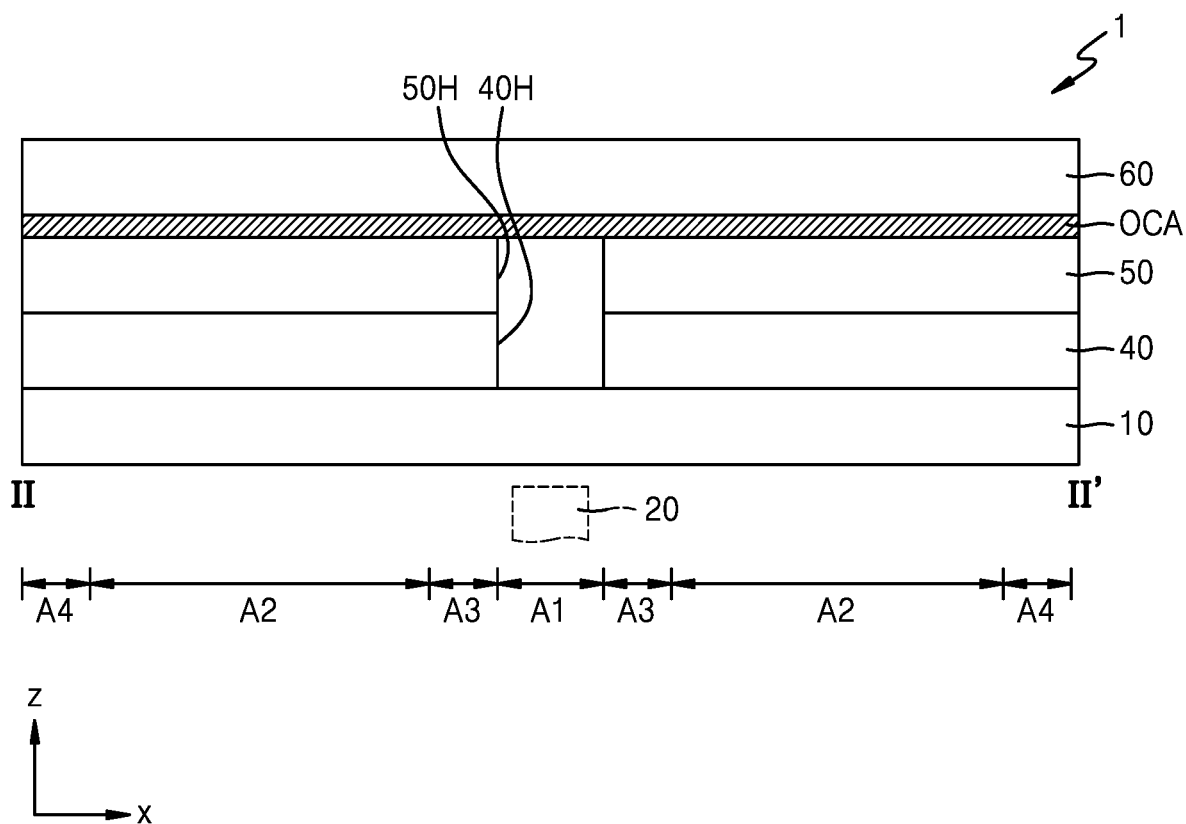
FIGS. 2A and 2B are cross-sectional views of a display device taken along line II-II' of FIG. 1 according to exemplary embodiments of the present inventive concepts.
Figure 2B:
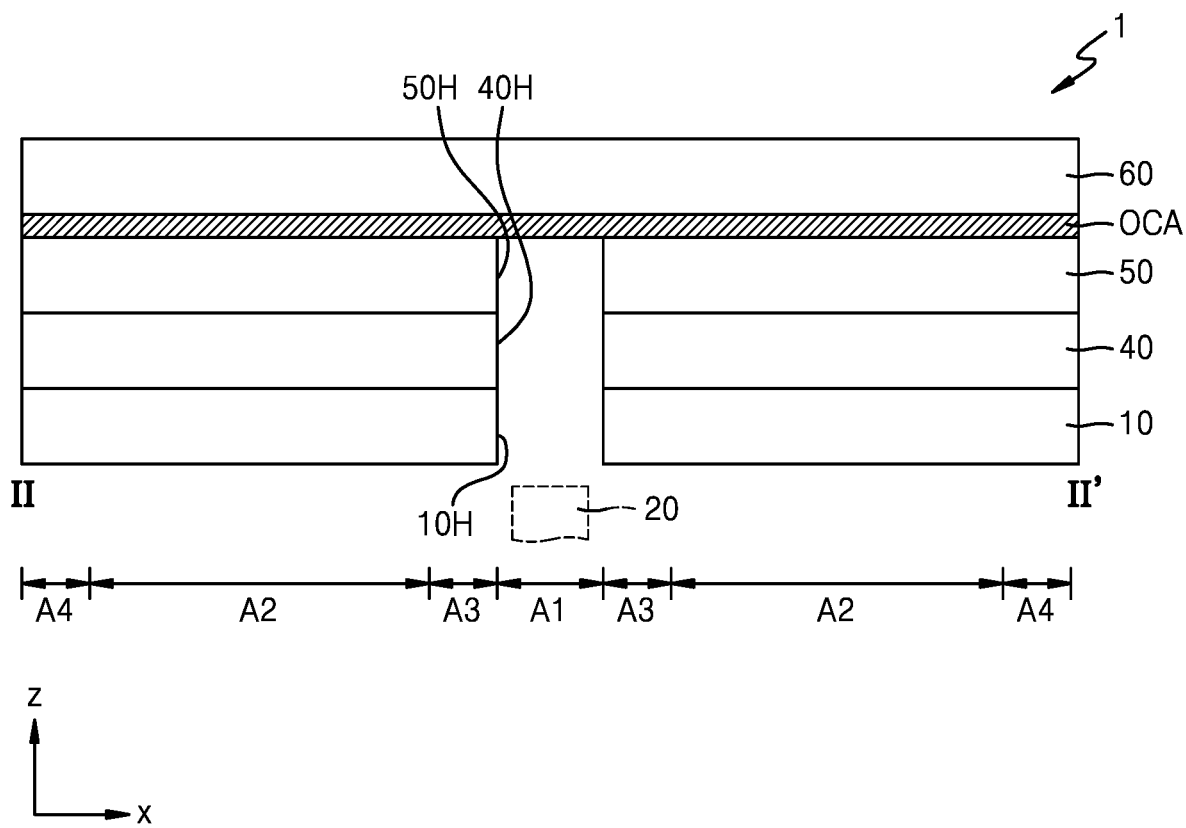

FIGS. 2A and 2B are schematic cross-sectional views of the display device 1 according to exemplary embodiments, and may each correspond to a cross-section taken along line II-II' of FIG. 1.

Referring to FIG. 2A, the display device 1 may include a display panel 10, an input sensing section 40, and an optical functional section 50 sequentially arranged on the display panel 10 (e.g., in the Z direction). A window 60 may cover the optical functional section 50, the input sensing section 40 and the display panel 10. For example, as shown in the exemplary embodiment of FIG. 2A, the window may be disposed directly on the optical functional section 50 (e.g., in the Z direction). An adhesion layer, such as an optical clear adhesive OCA may couple the window 60 to a component therebelow, such as the optical functional section 50. In an exemplary embodiment, the display device 1 may be included in any of various electronic apparatuses such as mobile phones, tablet personal computers (PCs), notebook computers, smartwatches, etc.

The display panel 10 may include a plurality of diodes arranged in the second area A2. The input sensing section 40 may obtain coordinate information according to an external input, such as a touch event (e.g., a touch input from the user's finger). The input sensing section 40 may include a sensing electrode (or a touch electrode) and trace lines connected to the sensing electrode. The input sensing section 40 may be arranged on the display panel 10. In an exemplary embodiment, the input sensing section 40 may sense an external input according to a mutual cap (capacitive) method or a self cap method.

In an exemplary embodiment, the input sensing section 40 may be formed directly on the display panel 10 (e.g., in the Z direction). Alternatively, the input sensing section 40 may be separately formed and then secured to the display panel 10 via the adhesion layer, such as an OCA. As shown in the exemplary embodiment of FIG. 2A, the input sensing section 40 may be formed directly on the display panel 10 and the adhesion layer may not be provided between the input sensing section 40 and the display panel 10.

In an exemplary embodiment, the optical functional section 50 may include an anti-reflection layer. The anti-reflection layer may reduce the reflectivity of light, such as external light incident from an external source toward the display panel 10 through the window 60. In an exemplary embodiment, the anti-reflection layer may include a phase retarder and a polarizer. The phase retarder may be of a film type or liquid coating type, and may include a λ/2 phase retarder and/or λ/4 phase retarder. However, exemplary embodiments of the present inventive concepts are not limited thereto. The polarizer may also be of a film type or liquid coating type. The film type may include a stretchable synthetic resin film, and the liquid coating type may include liquid crystals arranged in a predetermined arrangement. The phase retarder and the polarizer may further include protective films, respectively. However, exemplary embodiments of the present inventive concepts are not limited thereto.

According to another exemplary embodiment, the anti-reflection layer may include a black matrix and color filters. The color filters may be arranged based on the arrangement of the colors of light beams emitted by the pixels of the display panel 10. In another exemplary embodiment, the anti-reflection layer may include a destructive interference structure. The destructive interference structure may include a first reflection layer and a second reflection layer arranged on different layers. The first reflected light and second reflected light that are reflected by the first reflection layer and the second reflection layer, respectively, may destructively interfere with each other, and thus the reflectance of external light may be reduced.

In an exemplary embodiment, the optical functional section 50 may include a lens layer. The lens layer may improve the emission efficiency or reduce the color deviation of the light emitted from the display panel 10. The lens layer may include a layer having a concave or convex lens shape, and/or include a plurality of layers respectively having different refractive indexes. In an exemplary embodiment, the optical functional section 50 may include both the anti-reflection layer and the lens layer, or may include only one of the anti-reflection layer and the lens layer.

The input sensing section 40 and the optical functional section 50 may each include holes. For example, as shown in the exemplary embodiments of FIG. 2A, the input sensing section 40 may include a first hole 40H that passes from a top surface of the input sensing section 40 to a bottom surface of the input sensing section 40. The optical functional section 50 may include a second hole 50H that passes from a top surface of the optical functional section 50 to a bottom surface of the optical functional section 50. The first hole 40H and the second hole 50H may be arranged in the first area A1 and may overlap each other (e.g., in the Z direction). In an exemplary embodiment, the width of the first hole 40H and the second hole 50H (e.g., length in the X direction) may correspond to the width of the first area A1.

In the exemplary embodiment shown in FIG. 2A, the first hole 40H and the second hole 50H completely overlap each other (e.g., in the Z direction). However, in other exemplary embodiments, the first hole 40H and the second hole 50H may only partially overlap each other (e.g., in the Z direction). According to another exemplary embodiment, as shown in FIG. 2B, the display panel 10 may include a third hole 10H in addition to the first hole 40H of the input sensing section 40, and the second hole 50H of the optical functional section 50. The third hole 10H is arranged in the first area A1 and is overlapped by the first hole 40H and the second hole 50H (e.g., in the Z direction). For example, as shown in the exemplary embodiment of FIG. 2B, the third hole 10H may be fully overlapped by the first hole 40H and the second hole 50H. However, exemplary embodiments of the present inventive concepts are not limited thereto. The third hole 10H may have a width (e.g., length in the X direction) that corresponds to the width of the first area A1. In an exemplary embodiment in which the adhesion layer between the window 60 and the optical functional section 50 includes an OCA, the adhesion layer may not include a hole in the first area A1.

A component 20 may be located in the first area A1. For example, as shown in the exemplary embodiment of FIGS. 2A, 2B, the component may be positioned in the first area A1 under the display panel 10 and the hole 10H of the display panel. In an exemplary embodiment, the component 20 may include an electronic element. For example, the component 20 may be an electronic element that uses light or sounds. For example, the electronic element may include a sensor that receives and uses light, such as an infrared sensor, a camera that receives light and captures an image, a sensor that outputs and senses light or sound to measure a distance or recognize a fingerprint or the like, a small lighting element that outputs light, a speaker that outputs sound, etc. An electronic element using light may use light in various wavelength bands, such as visible light, infrared light, and ultraviolet light. An electronic element using sound may use a sound in various frequency bands, such as ultrasound. According to some exemplary embodiments, the first area A1 may be a transmission area for transmitting light that is output from the component 20 to the outside or travels from the outside toward the component 20.

According to another exemplary embodiment in which the display device 1 is used as a smartwatch or an instrument panel for automobiles, the component 20 may be a member such as a horological element (e.g., a needle of a clock) or a needle indicating predetermined information (e.g., a velocity of a vehicle, etc.). In exemplary embodiments in which the display device 1 includes a needle of a clock or an instrument panel for automobiles, the component 20 may be exposed to the outside through the window 60, and the window 60 may include an opening in the first area A1 that overlaps the holes of the optical functional section 50, the input sensing section 40 and/or display panel 10 (e.g., in the Z direction). For example, the opening may have a width corresponding to the first area A1.

As described above, the component 20 may include an element(s) that adds a function to the display device 1 or may include an element such as an accessory that increases an aesthetic value of the display panel 10.

Figure 3A:
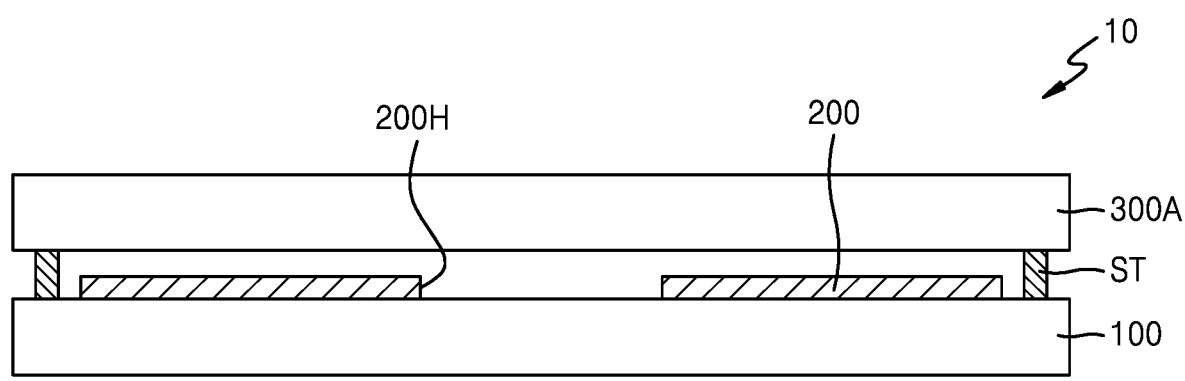
FIGS. 3A through 3C are cross-sectional views of a display panel according to exemplary embodiments of the present inventive concepts.
Figure 3A:
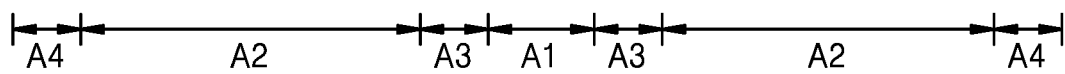
Figure 3A:
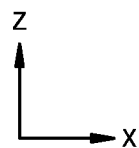
Figure 3B:
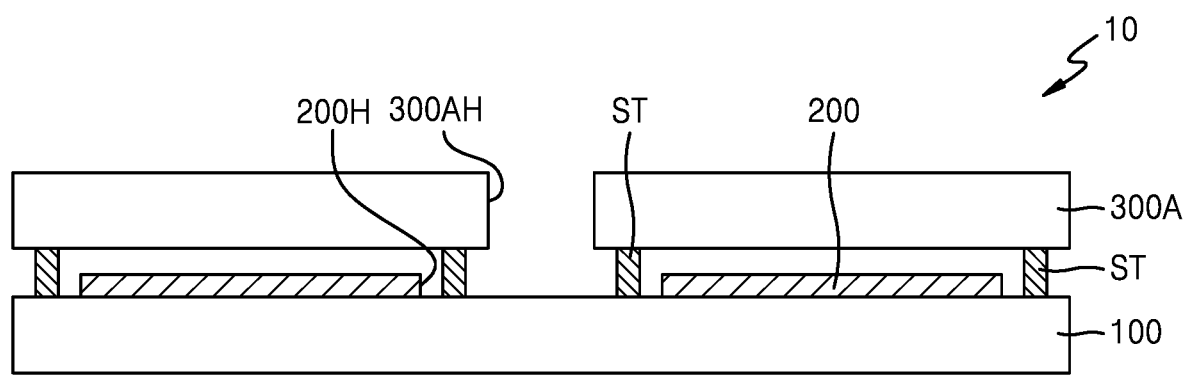
Figure 3C:
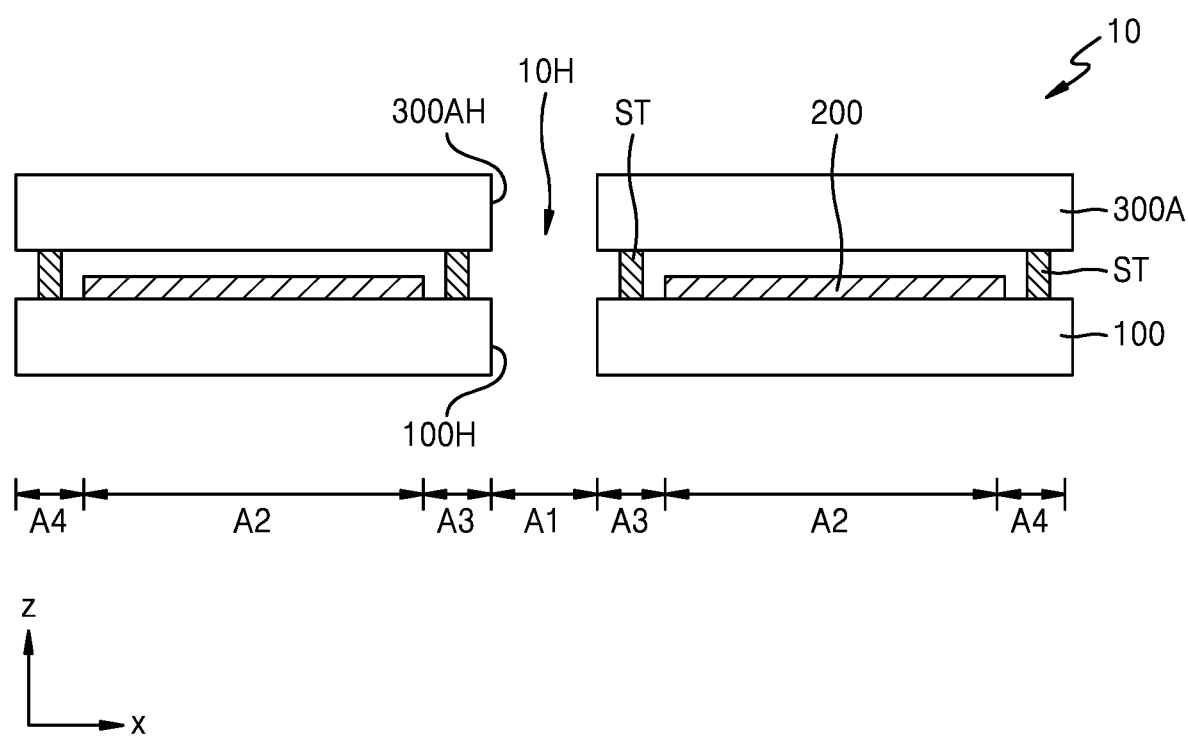

FIGS. 3A through 3C are schematic cross-sectional views of the display panel 10, according to exemplary embodiments of the present inventive concepts.

Referring to FIGS. 3A through 3C, the display panel 10 includes a display layer 200 disposed on a substrate 10. For example, as shown in the exemplary embodiments of FIGS.

3A-3C, the display layer 200 may be disposed directly on the substrate 100 (e.g., in the Z direction). In an exemplary embodiment, the substrate 10 may include a glass material or may include a polymer resin. For example, the substrate 100 may include a glass material mainly containing $SiO_2$, or a resin such as reinforced plastic.

The display layer 200 may be located in the second area A2, and may include a plurality of pixels. Each of the plurality of pixels included in the display layer 200 may include a pixel circuit and a display element electrically connected to the pixel circuit. The pixel circuit may include at least one transistor and at least one storage capacitor, and the display element may include a light-emitting diode, such as an organic light-emitting diode (OLED), etc.

The display layer 200 may be covered by an encapsulation substrate 300A. In an exemplary embodiment, the encapsulation substrate 300A may include a glass material or may include a polymer resin. For example, the encapsulation substrate 300A may include a glass material mainly containing $SiO_2$, or a resin such as reinforced plastic. The encapsulation substrate 300A may be arranged to face the substrate 100, and a sealant ST may be disposed between the substrate 100 and the encapsulation substrate 300A (e.g., in the Z direction). The sealant ST may be located in the fourth area A4 and may entirely surround the display layer 200 between the substrate 100 and the encapsulation substrate 300A (e.g., in the X and/or Y directions). For example, the second area A2 may be entirely surrounded by the sealant ST when viewed from the Z direction.

A portion of the display layer 200, for example, a portion in the first area A1, may be removed. For example, as shown in the exemplary embodiment of FIG. 3A the display layer 200 may include a fourth hole 200H that has a width (e.g., length in the X direction) that corresponds to the width of the first region A1 and third region A3. In addition to the pixel circuits and the display elements, the display layer 200 may further include insulating layers. The insulating layers may be arranged between wires connected to each pixel circuit, between electrodes, and/or between the electrodes of the display elements. For example, the fourth hole 200H may be formed by respective holes of the insulating layers included in the display layer 200 that overlap each other (e.g., in the Z direction). The fourth hole 200H of the display layer 200 may be formed to completely pass through the display layer 200 from its top surface to its bottom surface.

Referring to FIG. 3B, the encapsulation substrate 300A of the display panel 10 may include a fifth hole 300AH located in the first area A1. The fifth hole 300AH may penetrate the encapsulation substrate 300A from its top surface to its bottom surface. The fifth hole 300AH of the encapsulation substrate 300A may overlap the fourth hole 200H of the display layer 200 (e.g., in the Z direction). For example, as shown in the exemplary embodiment of FIG. 3B, the fifth hole 300AH may have a width (e.g., length in the X direction) that corresponds with the width of the first area A1. The sealant ST may be between the substrate 100 and the encapsulation substrate 300A (e.g., in the Z direction). As shown in the exemplary embodiment of FIG. 3B, the sealant ST may be located in the third area A3 in addition to the fourth area A4 to prevent the infiltration of an external foreign material into the display layer 20 via the fifth hole 300AH. The display layer 200 may be located in a space defined by the substrate 100, the encapsulation substrate 300A, the sealant ST of the third area A3, and the sealant ST of the fourth area A4.

Referring to FIG. 3C, the substrate 100 of the display panel 10 may also include a sixth hole 100H located in the first area A1. For example, the sixth hole 10H may have a width (e.g., length in the X direction) that corresponds to the width of the first area A1. The sixth hole 100H of the substrate 100, the fourth hole 200H of the display layer 200, and the fifth hole 300AH of the encapsulation substrate 300A may overlap each other (e.g., in the Z direction). The fourth hole 200H, the fifth hole 300AH, and the sixth hole 100H overlapping each other in the first area A1 may collectively form a third hole 10H formed in the display panel 10.

Figure 4A:
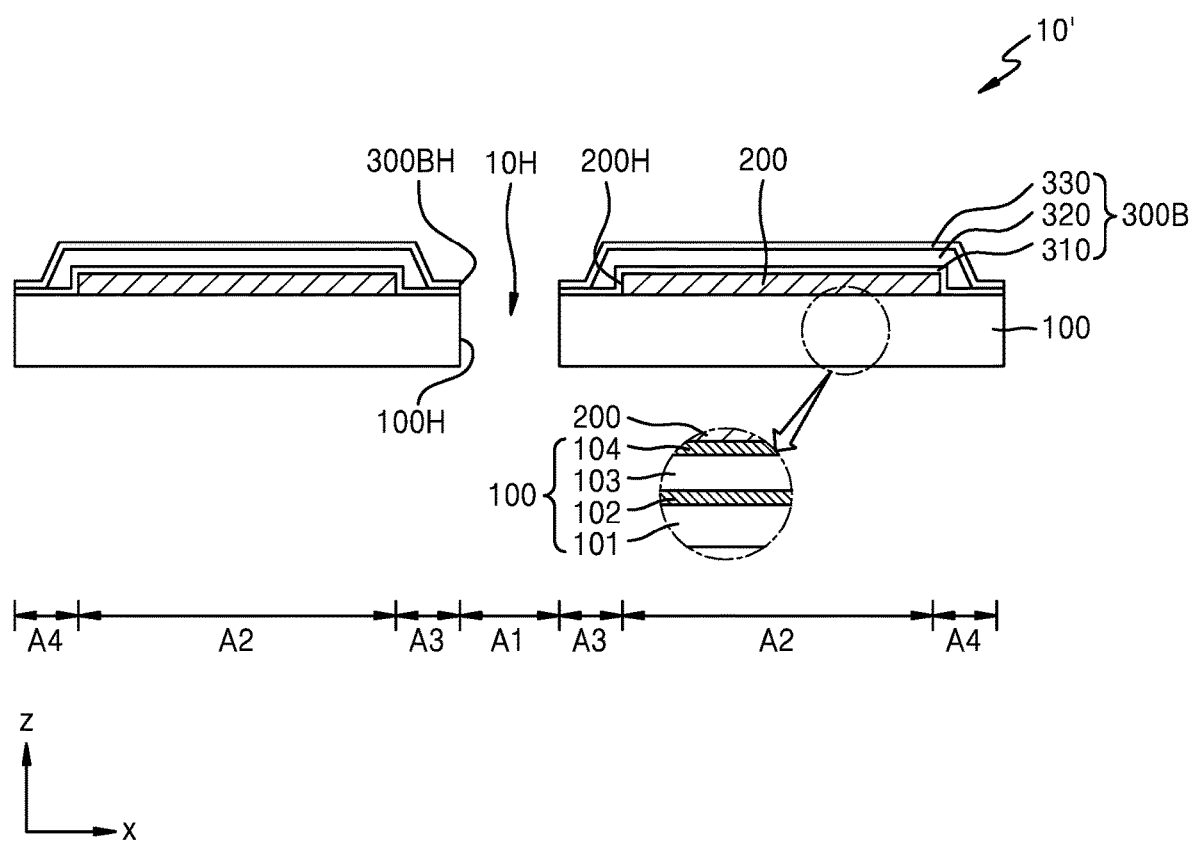
FIGS. 4A through 4C are cross-sectional views of a display panel according to exemplary embodiments of the present inventive concepts.
Figure 4B:
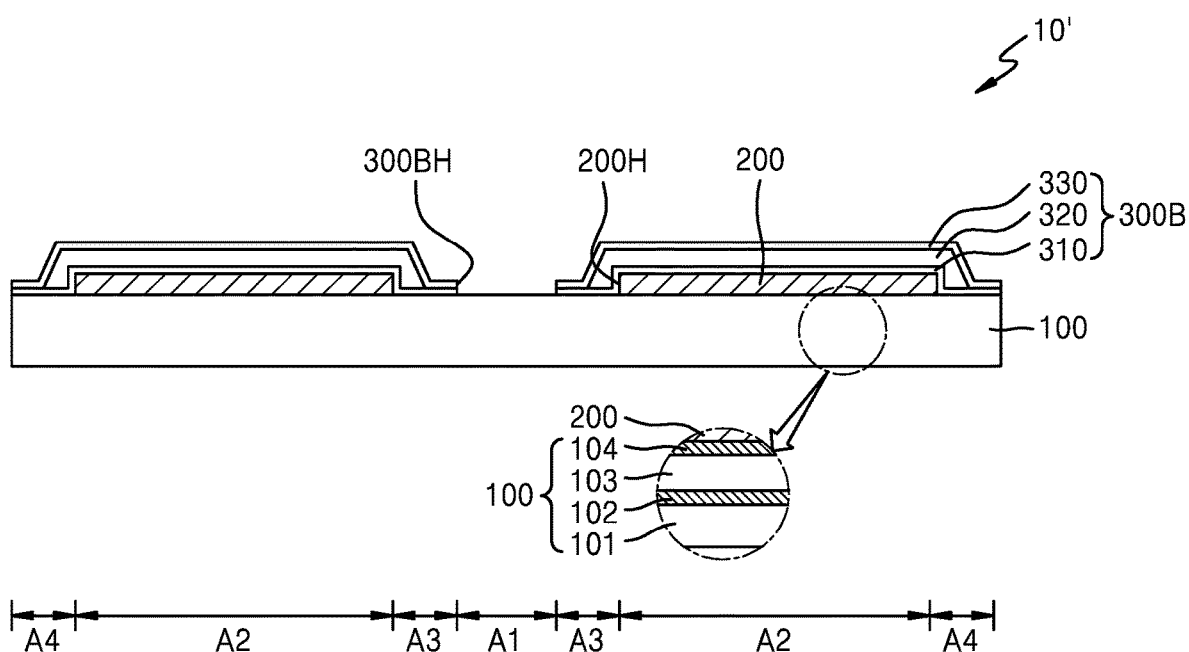
Figure 4C:
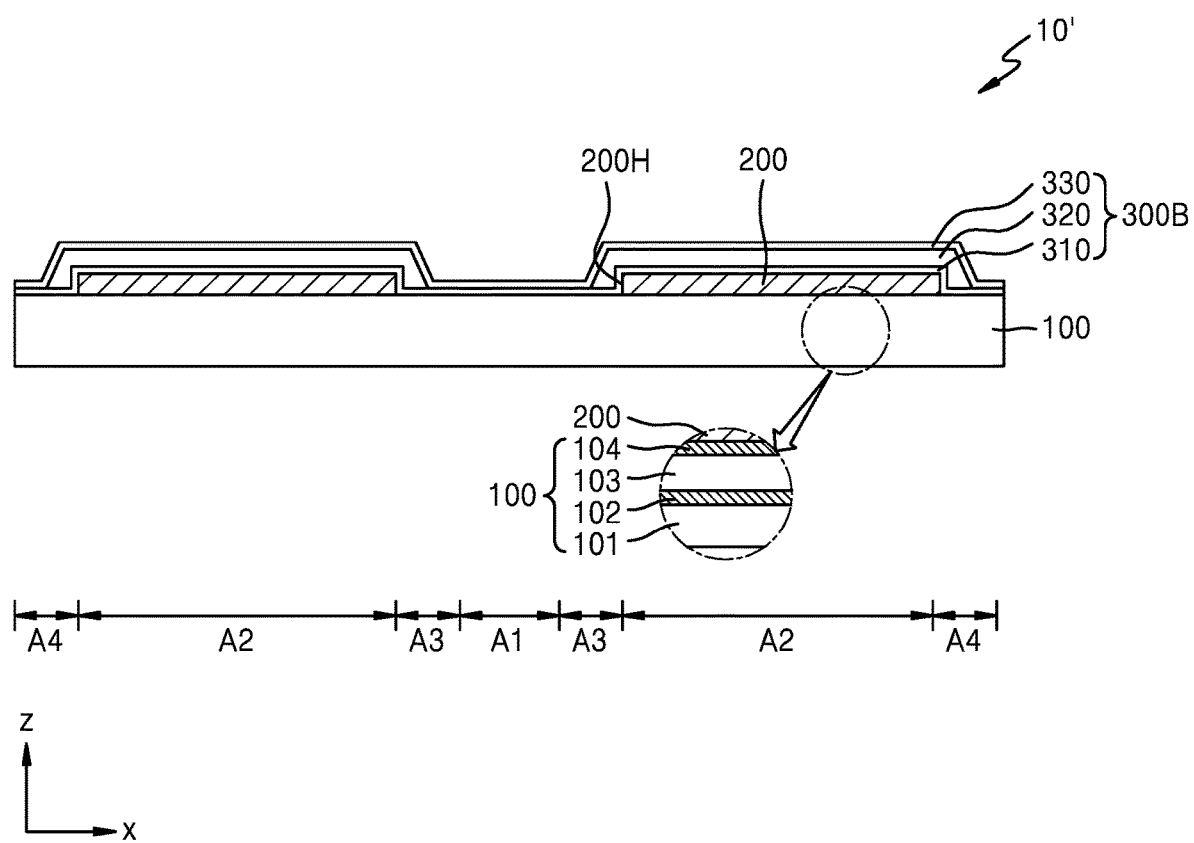

FIGS. 4A through 4C are schematic cross-sectional views of a display panel 10', according to exemplary embodiments of the present inventive concepts.

Referring to FIG. 4A, the display layer 200 may be arranged on the substrate 100, and the display layer 200 may be covered by an encapsulation member formed of a thin-film encapsulation layer 300B. The thin-film encapsulation layer 300B may include at least one inorganic encapsulation layer and at least one organic encapsulation layer. For example, as shown in the exemplary embodiment of FIG. 4A, the thin-film encapsulation layer may include first and second inorganic encapsulation layers 310 and 330 and an organic encapsulation layer 320 therebetween. However, exemplary embodiments of the present inventive concepts are not limited thereto and the thin-film encapsulation layer may have various configurations. In an exemplary embodiment, each of the first and second inorganic encapsulation layer 310 and 330 may include one or more inorganic insulating materials. For example, the inorganic insulating materials may include at least one compound selected from aluminum oxide, titanium oxide, tantalum oxide, hafnium oxide, zinc oxide, silicon oxide, silicon nitride, and/or silicon oxynitride. The organic encapsulation layer 320 may include a polymer-based material. For example, in an exemplary embodiment, the polymer-based material may include at least one compound selected from an acrylic resin, an epoxy-based resin, polyimide, and polyethylene. For example, the organic encapsulation layer 320 may include an acrylic resin, such as polymethyl methacrylate or polyacrylic acid. However, exemplary embodiments of the present inventive concepts are not limited thereto.

In an exemplary embodiment, the substrate 100 may include polymer resin and may be a multi-layer. For example, the substrate 100 may include a first base layer 101, a first barrier layer 102, a second base layer 103, and a second barrier layer 104 which are sequentially stacked.

Each of the first and second base layers 101 and 103 may include polymer resin. For example, the first and second base layers 101 and 103 may each include polymer resin, such as at least one compound selected from polyethersulfone, polyarylate, polyacrylate, polyetherimide, polyethylene naphthalate, polyethylene terephthalate, polyphenylene sulfide, polyimide, polycarbonate, cellulose triacetate, or cellulose acetate propionate.

The first and second barrier layers 102 and 104 may each be a barrier layer preventing infiltration of external foreign materials and may be a single layer or a multilayer including an inorganic material, such as silicon nitride, silicon oxynitride, or silicon oxide.

In exemplary embodiments in which the display panel 10' includes the substrate 100 and the thin-film encapsulation layer 300B each being a multi-layer, the flexibility of the display panel 10' may be improved.

Referring to FIG. 4A, the thin-film encapsulation layer 300B may include a seventh hole 300BH located in the first area A1. For example, as shown in the exemplary embodiment of FIG. 4A, the seventh hole 300BH may have a width (e.g., length in the X direction) that corresponds to the width of the first area A1. The seventh hole 300BH may overlap the sixth hole 100H of the substrate 100 and the fourth hole 200H of the display layer 200 (e.g., in the Z direction). The fourth hole 200H, the sixth hole 100H, and the seventh hole 30BH overlapping each other may form a third hole 10H of the display panel 10'.

According to another exemplary embodiment, as shown in FIG. 4B, the thin-film encapsulation layer 300B and the display layer 200 may include the seventh hole 300BH and the fourth hole 200H located in the first area A1. However, the substrate 100 may not include a hole. Alternatively, as shown in the exemplary embodiment of FIG. 4C, the fourth hole 200H may be located in the first area A1 and the thin-film encapsulation layer 300B and the substrate 100 may not include a hole.

Figure 5:
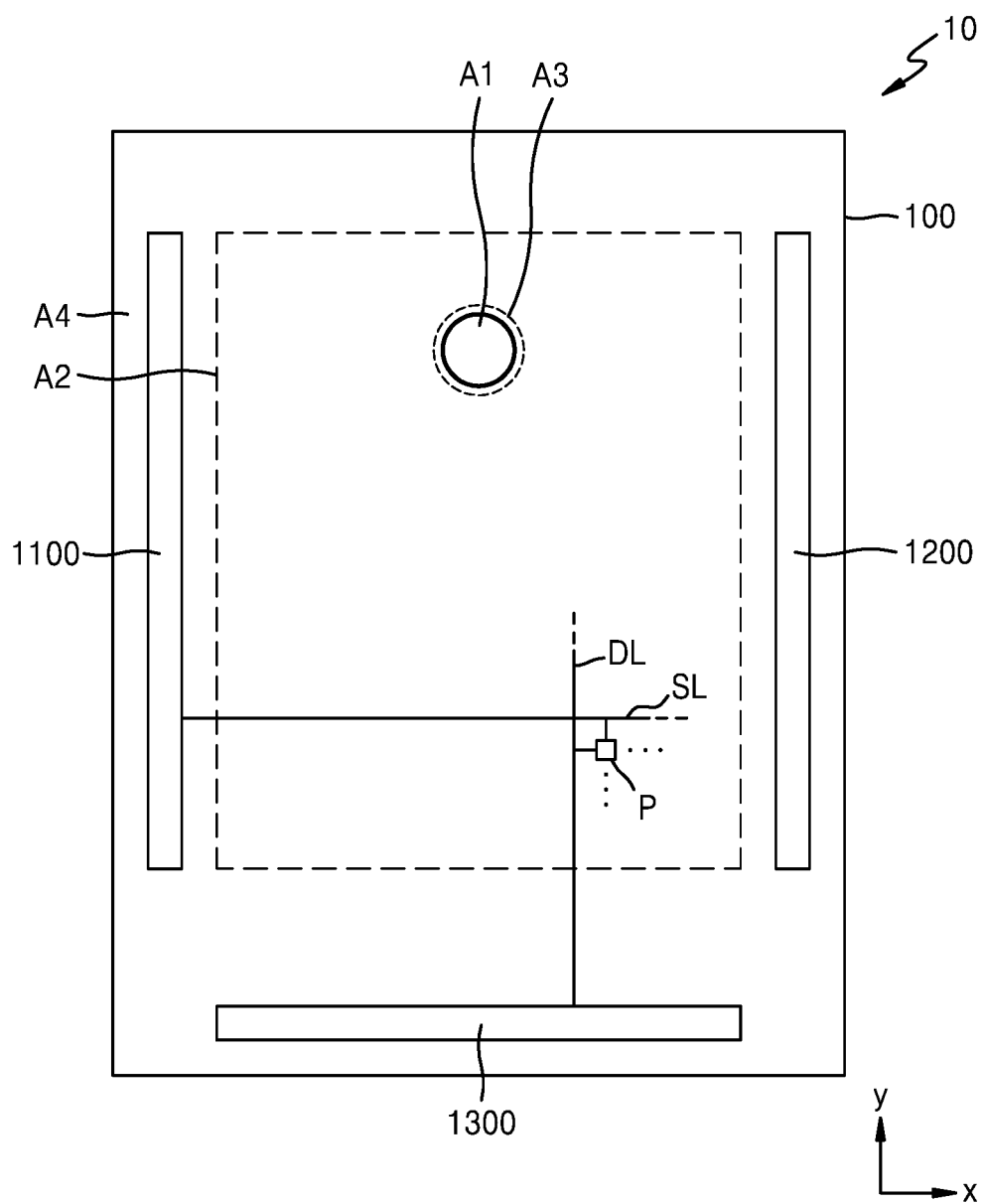
FIG. 5 is a top plan view of a display panel according to an exemplary embodiment of the present inventive concepts.
Figure 6:
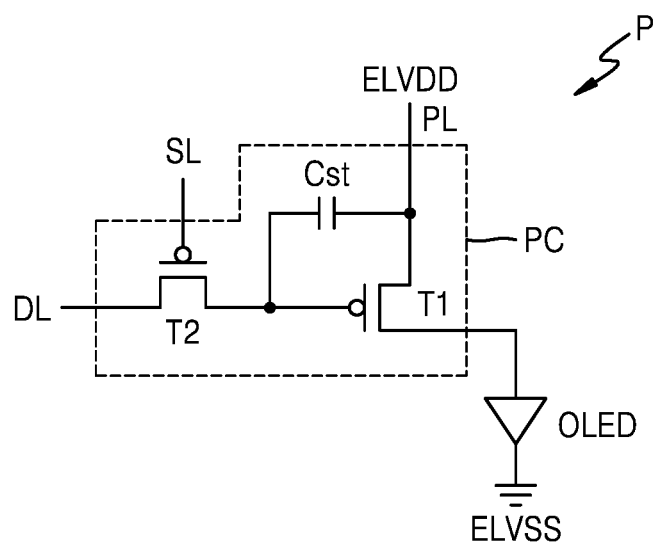
FIG. 6 is an equivalent circuit diagram of one pixel of a display panel according to an exemplary embodiment of the present inventive concepts.

FIG. 5 is a schematic plan view of the display panel 10 according to an exemplary embodiment of the present inventive concepts, and FIG. 6 is a schematic equivalent circuit diagram of one pixel P of the display panel 10 according to an exemplary embodiment of the present inventive concepts.

In the exemplary embodiment of FIG. 5, the form of the display panel 10 may be substantially the same as the form of the display device 1 described above with reference to FIG. 1. For example, the display panel 10 may include the first area A1, the second area A2 surrounding the first area A, the third area A3 between the first area A1 and the second area A2, and the fourth area A4 surrounding the second area A2.

The display panel 10 may include a plurality of pixels P arranged in the second area A2. However, FIG. 5 shows only a single pixel P for convenience of explanation. As shown in FIG. 6, each of the pixels P may include a pixel circuit PC and an organic light-emitting diode OLED as a display element connected to the pixel circuit PC. The pixel circuit PC may include a first transistor T1, a second transistor T2, and a storage capacitor Cst. In an exemplary embodiment, each of the pixels P may emit, for example, red light, green light, or blue light, or may emit red light, green light, blue light, or white light, via the organic light-emitting diode OLED. However, exemplary embodiments of the present inventive concepts are not limited thereto. The first transistor T1 and the second transistor T2 may be implemented using thin-film transistors.

The second transistor T2, which is a switching transistor, may be connected to a scan line SL and a data line DL. The second transistor T2 may transmit a data voltage received via the data line DL to the first transistor T based on a switching voltage received via the scan line SL. The storage capacitor Cst may be connected to the second transistor T2 and a driving voltage line PL. The storage capacitor Cst may store a voltage corresponding to a difference between a voltage received from the second transistor T2 and a first power supply voltage ELVDD supplied to the driving voltage line PL.

The first transistor T1, which is a driving transistor, may be connected to the driving voltage line PL and the storage capacitor Cst. The first transistor T1 may control a driving current flowing from the driving voltage line PL to the organic light-emitting diode OLED, in accordance with a voltage value stored in the storage capacitor Cst. The organic light-emitting diode OLED may emit light having a certain level of brightness in accordance with the magnitude of the driving current. An opposite electrode (e.g., a cathode) of the organic light-emitting diode OLED may receive a second power supply voltage ELVSS.

Although the exemplary embodiment of FIG. 6 includes a pixel circuit PC having two transistors and one storage capacitor, exemplary embodiments of the present inventive concepts are not limited thereto. For example, the number of transistors and the number of storage capacitors may vary according to a design of the pixel circuit PC. Furthermore, while the first transistor T1 and the second transistor T2 of the exemplary embodiment of FIG. 6 each have a single gate electrode, in other exemplary embodiments, at least one of the first transistor T1 and the second transistor T2 may have a dual gate electrode, etc.

Referring back to FIG. 5, the third area A3 may surround the first area A1. The third area A3 is an area in which a display element such as an organic light-emitting diode is not arranged. Signal lines configured to provide signals to pixels P in the second area A2 may be arranged around the first area A1 and may be disposed in or traverse the third area A3. The fourth area A4 may include a first scan driver 1100 and a second scan driver 1200 each providing a scan signal to each of the pixels P, a data driver 1300 providing a data signal to each of the pixels P, and main power wires for providing first and second power supply voltages may be arranged. For example, the first scan driver 1100 may be arranged in the fourth area A4 on a left edge (e.g., in the X direction) of the substrate 100. The second scan driver 1200 may be arranged in the fourth area A4 on a right edge (e.g., in the X direction) of the substrate 100. The first scan driver 100 and the second scan driver 1200 may each be located in the fourth area A4, and may be respectively arranged on opposing sides (e.g., left and right sides in the X direction) of the second area A2 with the second area A2 therebetween. However, exemplary embodiments of the present inventive concepts are not limited thereto. For example, in other exemplary embodiments, the display panel 10 may include only a first scan driver 1100. Furthermore, the arrangement of the first scan driver 1100 and/or second scan driver 1200 in the fourth area A4 may vary.

In FIG. 5, the data driver 1300 is located on one edge of the substrate 100, such as a bottom edge (e.g., in the Y direction) of the substrate 100. However, exemplary embodiments of the present inventive concepts are not limited thereto. For example, in another exemplary embodiment, the data driver 1300 may be located on a flexible printed circuit board (FPCB) that is electrically connected to a pad arranged on one side of the display panel 10.

Figure 7:
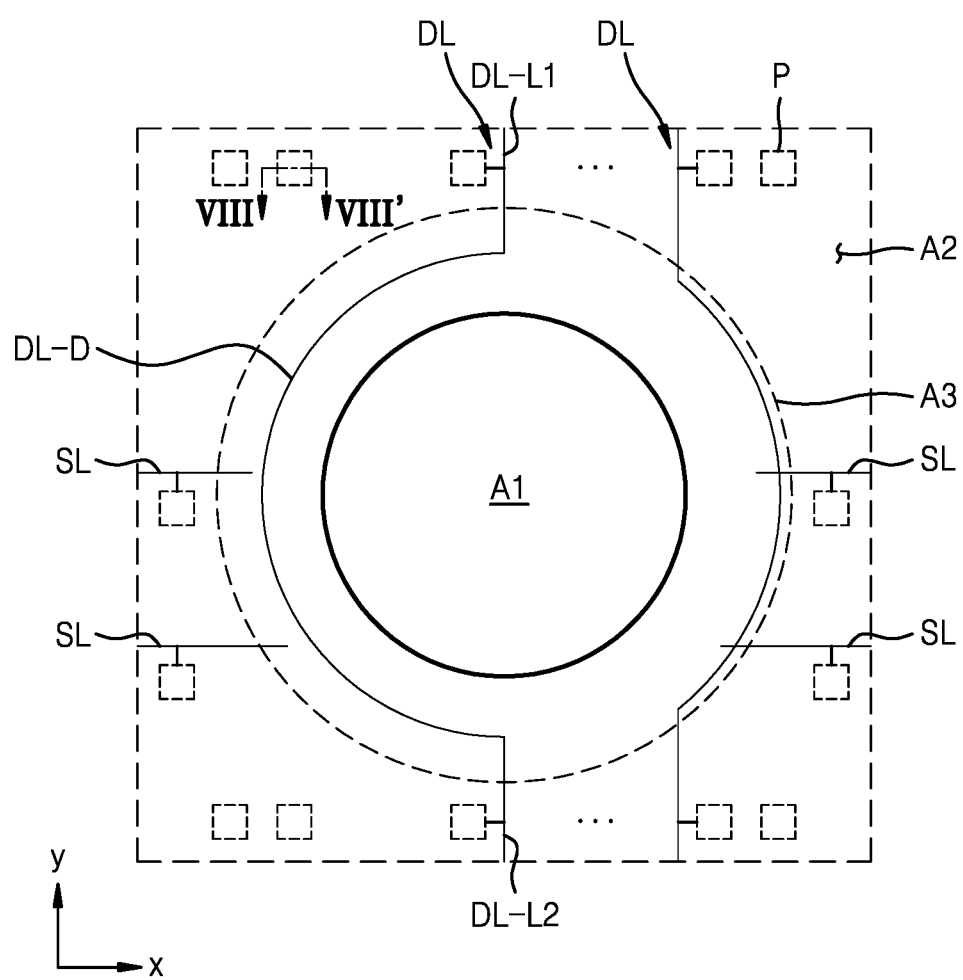
FIG. 7 is a top plan view of a portion of a display panel according to an exemplary embodiment of the present inventive concepts.

FIG. 7 is a top plan view of a portion of a display panel according to an exemplary embodiment of the present inventive concepts.

Referring to FIG. 7, some of the pixels P formed in the second area A2 may be spaced apart from each other around the first area A1. For example, as shown in the exemplary embodiment of FIG. 7, the first area A1 may be located between two pixels P that are arranged in the X direction. The first area A1 may also be located between two pixels P that are arranged in the Y direction of FIG. 7.

The two pixels P arranged in the Y direction with the first area A1 therebetween may be electrically connected to the same data line DL, and the data line DL may be bent or curved in the third area A3. For example, a portion of the data line DL may be bent or curved and extend along an edge of the first area A1 in the third area A3. For example, as shown in the exemplary embodiment of FIG. 7, a portion of the data line DL may have a similar curvature as the edge of the first area A1 and may extend along the perimeter of the first area A1 in a manner so that the distance between the data line DL and the first area A1 remains substantially constant within the third area A3. However, exemplary embodiments of the present inventive concepts are not limited thereto. The data line DL may include first and second portions DL-L1 and DL-L2 extending in the Y direction and traversing the second area A2, and a third portion DL-D connected to the first and second portions DL-L1 and DL-L2 and extending along the circular arc of the first area A1 within the third area A3.

In an exemplary embodiment, the two pixels P arranged in the X direction with the first area A1 therebetween may be electrically connected to different scan lines SL, respectively. For example, scan lines SL on the left side (e.g., in the X direction) of the first area A1 may be electrically connected to the first scan driver 1100 described above with reference to FIG. 5, and scan lines SL on the right side (e.g., in the X direction) of the first area A1 may be electrically connected to the second scan driver 1200 described above with reference to FIG. 5. In embodiments in which the display panel 10 includes two scan driving circuits as shown in FIG. 5, the pixels P on both sides of the first area A1 (e.g. lateral sides in the X direction) may be electrically connected to scan lines SL that are spaced apart from each other.

According to another exemplary embodiment, when the second scan driving circuit 1200 is omitted, the two pixels P arranged in the X direction with the first area A1 therebetween may be connected to the same scan line, and the scan line may include a portion extending in the circular arc direction of the first area A1 within the third area A3 (e.g., similar to the third portion DL-D of the data line DL).

Figure 8:
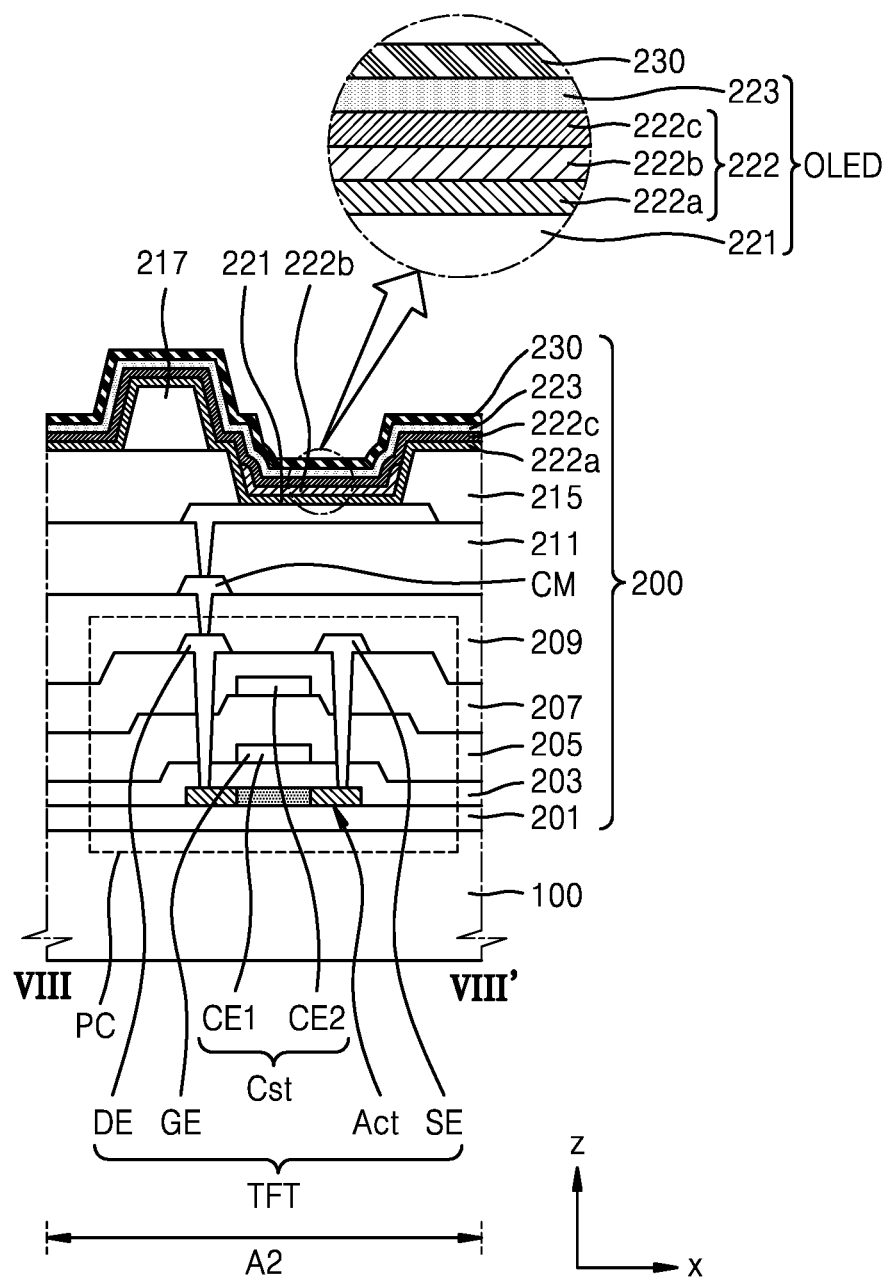
FIG. 8 is a cross-sectional view of a pixel taken along line VIII-VIII' of FIG. 7 according to an exemplary embodiment of the present inventive concepts.

FIG. 8 is a cross-sectional view of a pixel according to an exemplary embodiment, and may correspond to a cross-section taken along line VIII-VIII' of FIG. 7.

Referring to FIG. 8, the pixel circuit PC may be arranged on the substrate 100, and the organic light-emitting diode OLED electrically connected to the pixel circuit PC may be arranged on the pixel circuit PC. As described above with reference to FIGS. 3A through 3C and FIGS. 4A through 4C, in an exemplary embodiment, the substrate 100 may include, for example, a glass material or a polymer resin. The substrate 100 may be a single layer or multiple layers.

A buffer layer 201 to prevent infiltration of impurities into a semiconductor layer Act of a thin-film transistor TFT may be arranged on the substrate 100. For example, as shown in the exemplary embodiment of FIG. 8, a bottom surface of the buffer layer may directly contact a top surface of the substrate 100. In an exemplary embodiment, the buffer layer 201 may include an inorganic insulating material such as at least one compound selected from silicon nitride, silicon oxynitride, or silicon oxide, and may be a single layer or multiple layers including the inorganic insulating material.

The pixel circuit PC may be arranged on the buffer layer 201. The pixel circuit PC may include the thin-film transistor TFT and the storage capacitor Cst. The thin-film transistor TFT may include the semiconductor layer Act, a gate electrode GE, a source electrode SE, and a drain electrode DE. The thin-film transistor TFT of FIG. 8 may correspond to one of the transistors described above with reference to FIG. 6, such as the driving transistor. According to the exemplary embodiment of FIG. 8, the thin-film transistor TET is a top gate type in which the gate electrode GE is arranged on the semiconductor layer ACT with a gate insulating layer 203 therebetween. In this embodiment, the display device may be a top emission-type display device. However, according to another exemplary embodiment, the thin-film transistor TFT may be a bottom gate type and the display device may be a bottom emission-type display device. In another exemplary embodiment, the display device may be a dual emission-type display device.

In an exemplary embodiment, the semiconductor layer Act may include polysilicon. Alternatively, the semiconductor layer Act may include, for example, at least one compound selected from amorphous silicon, an oxide semiconductor, or an organic semiconductor. The gate electrode GE may include a low resistance metal material. The gate electrode GE may include at least one conductive material selected from molybdenum (Mo), aluminum (Al), copper (Cu), and titanium (Ti), and may be formed as a multi-layer or single layer including the aforementioned materials.

The gate insulating layer 203 is disposed between the semiconductor layer ACT and the gate electrode GE. For example, a bottom surface of the gate insulating layer 203 may directly contact a top surface of the semiconductor layer and a top surface of the gate insulating layer 203 may directly contact a bottom surface of the gate electrode GE. The gate insulating layer 203 may include an inorganic insulating material such as at least one compound selected from silicon oxide, silicon nitride, silicon oxynitride, aluminum oxide, titanium oxide, tantalum oxide, and hafnium oxide. The gate insulating layer 203 may be a single layer or multi-layer including the aforementioned materials.

The source electrode SE and the drain electrode DE may include a highly conductive material. For example, each of the source electrode SE and the drain electrode DE may include a conductive material including at least one compound selected from Mo, Al, Cu, and Ti, and may be a multi-layer or single layer including the aforementioned materials. According to an exemplary embodiment, each of the source electrode SE and the drain electrode DE may be formed as a multi-layer of Ti/Al/Ti.

The storage capacitor Cst may include a lower electrode CE1 and an upper electrode CE2 overlapping each other with a first interlayer insulating layer 205 therebetween. The storage capacitor Cst and the thin-film transistor TFT may overlap each other (e.g., in the Z direction). As shown in the exemplary embodiment of FIG. 8, the gate electrode GE of the thin-film transistor TFT is the lower electrode CE1 of the storage capacitor Cst. However, in another exemplary embodiment, the storage capacitor Cst and the thin-film transistor TFT may not overlap each other (e.g., in the Z direction). The storage capacitor Cst may be covered by a second interlayer insulating layer 207. For example, as shown in the exemplary embodiment of FIG. 8, the second interlayer insulating layer 207 may be disposed directly on the storage capacitor Cst (e.g., in the Z direction).

In an exemplary embodiment, the first interlayer insulating layer 205 and the second interlayer insulating layer 207 may each include an inorganic insulating material such as at least one compound selected from silicon oxide, silicon nitride, silicon oxynitride, aluminum oxide, titanium oxide, tantalum oxide, and hafnium oxide. Each of the first interlayer insulating layer 205 and the second interlayer insulating layer 207 may be a single layer or multi-layer including the aforementioned materials.

The pixel circuit PC including the thin-film transistor TFT and the storage capacitor Cst may be covered with a first organic insulating layer 209. For example, as shown in the exemplary embodiment of FIG. 8, the first organic insulating layer 209 may be disposed directly on the second interlayer insulating layer 207 and the source electrode SE and drain electrode DE (e.g., in the Z direction). The first organic insulating layer 209 is a planarization insulating layer, and an upper surface thereof may have an substantially flat surface (e.g., extending in the X direction parallel to an upper surface of the substrate 100). In an exemplary embodiment, the first organic insulating layer 209 may include an organic insulating material, such as a commercial polymer (such as polymethyl methacrylate (PMMA) or polystyrene (PS)), a polymer derivative having a phenol-based group, an acryl-based polymer, an imide-based polymer, an arylether-based polymer, an amide-based polymer, a fluorine-based polymer, a p-xylene-based polymer, a vinyl alcohol-based polymer, or a blend thereof. According to an exemplary embodiment, the first organic insulating layer 209 may include polyimide.

A contact metal CM may be on the first organic insulating layer 209. The contact metal CM may include a conductive material including at least compound selected from Mo, Al, Cu, and Ti, and may be formed as a multi-layer or single layer including the aforementioned materials. In an exemplary embodiment, the contact metal CM may include the same material as the material included in the source electrode SE or the drain electrode DE of the thin-film transistor TFT. According to an exemplary embodiment, the contact metal CM may be formed as a multi-layer of Ti/Al/Ti.

A second organic insulating layer 211 may be disposed on the contact metal CM. For example, as shown in the exemplary embodiment of FIG. 8, the second organic insulating layer 211 may be disposed directly on the contact metal CM and the first organic insulating layer 209 (e.g. in the Z direction). An upper surface of the second organic insulating layer 211 may include a substantially flat surface (e.g., extending in the X direction parallel to an upper surface of the substrate 100). In an exemplary embodiment, the second organic insulating layer 211 may include an organic insulating material, such as a commercial polymer (such as polymethyl methacrylate (PMMA) or polystyrene (PS)), a polymer derivative having a phenol-based group, an acryl-based polymer, an imide-based polymer, an arylether-based polymer, an amide-based polymer, a fluorine-based polymer, a p-xylene-based polymer, a vinyl alcohol-based polymer, or a blend thereof. According to an exemplary embodiment, the second organic insulating layer 211 may include polyimide. In an exemplary embodiment, an inorganic insulating layer may be further arranged between the first organic insulating layer 209 and the second organic insulating layer 211.

A pixel electrode 221 may be disposed on the second organic insulating layer 211. For example, as shown in the exemplary embodiment of FIG. 8, the pixel electrode 221 may be disposed directly on the organic insulating layer 211 (e.g., in the Z direction). In an exemplary embodiment, the pixel electrode 221 may include at least one conductive oxide, such as indium tin oxide (ITO), indium zinc oxide (IZO), zinc oxide (ZnO), indium oxide (InO), indium gallium oxide (IGO), or aluminum zinc oxide (AZO). According to another exemplary embodiment, the pixel electrode 221 may include a reflection layer including, for example at least one compound selected from silver (Ag), magnesium (Mg), aluminum (Al), platinum (Pt), palladium (Pd), gold (Au), nickel (Ni), neodymium (Nd), iridium (Ir), chromium (Cr), or a compound of these materials. According to another exemplary embodiment, the pixel electrode 221 may further include a film formed of at least one compound selected from ITO, IZO, ZnO, or $In_2O_3$ above/below the aforementioned reflection layer.

A pixel defining layer 215 may be disposed on the pixel electrode 221. For example, as shown in the exemplary embodiment of FIG. 8, the pixel defining layer 215 may be disposed directly on the pixel electrode 221 (e.g., in the Z direction). The pixel defining layer 215 may include an opening via which an upper surface of the pixel electrode 221 is exposed. For example, the opening may be formed in a central portion of the pixel electrode 221. The pixel defining layer 215 may cover an edge of the pixel electrode 221. For example, the pixel defining layer may cover lateral edges of the pixel electrode 221 (e.g., in the X direction). In an exemplary embodiment, the pixel defining layer 215 may include an organic insulating material. Alternatively, the pixel defining layer 215 may include an inorganic insulating material, such as at least one compound selected from silicon nitride, silicon oxynitride, or silicon oxide. Alternatively, the pixel defining layer 215 may include an organic insulating material and an inorganic insulating material.

An intermediate layer 222 may include an emission layer 222b. The emission layer 222b may include, for example, an organic material. The emission layer 222b may include a low molecular or high molecular organic material that emits light of a certain color. The intermediate layer 222 may include a first functional layer 222a below the emission layer 222b, and/or a second functional layer 222c above the emission layer 222b. For example, as shown in the exemplary embodiment of FIG. 8, a top surface of the first functional layer 222a may contact a bottom surface of the emission layer 222b. A top surface of the emission layer 222b may contact a bottom surface of the second functional layer 222c.

The first functional layer 222a may be a single layer or multiple layers. For example, in an exemplary embodiment, the first functional layer 222a includes a high molecular organic material. The first functional layer 222a may be a hole transport layer (HTL) having a single-layered structure, and may include poly-(3,4)-ethylene-dihydroxy thiophene (PEDOT) and/or polyaniline (PANI). In an exemplary embodiment in which the first functional layer 222a includes a low molecular weight material, the first functional layer 222a may include a hole injection layer (HIL) and a hole transport layer (HTL).

In an exemplary embodiment, the display device, the intermediate layer 222 may not include the second functional layer 222c. For example, when the first functional layer 222a and the emission layer 222b include high molecular weight materials, the second functional layer 222c may be formed. The second functional layer 222c may be a single layer or multiple layers. The second functional layer 222c may include an electron transport layer (ETL) and/or an electron injection layer (EIL).

The emission layer 222b of the intermediate layer 222 may be arranged in each pixel in the second area A2. The emission layer 222b may be arranged to overlap the opening of the pixel defining layer 215 or/and the pixel electrode 221 (e.g., in the Z direction). Each of the first and second functional layers 222a and 222c of the intermediate layer 222 may be a single body, and accordingly may be formed not only in the second area A2 but also in the third area A3 described above with reference to FIG. 5.

In an exemplary embodiment, an opposite electrode 223 may include a conductive material having a low work function. For example, the opposite electrode 223 may include a (semi)transparent layer including, for example, at least one compound selected from silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) and an alloy of these materials. Alternatively, the opposite electrode 223 may further include a layer, such as ITO, IZO, ZnO, or $In_2O_3$, on the (semi)transparent layer including any of the above-described materials. In an exemplary embodiment, the opposite electrode 223, which is a single body, may be formed to extend (e.g., in the X direction) to cover a plurality of pixel electrodes 221 within the second area A2. In an exemplary embodiment, the intermediate layer 222 and the opposite electrode 223 may be formed via thermal deposition. However, exemplary embodiments of the present inventive concepts are not limited thereto.

A spacer 217 may be disposed on the pixel defining layer 215. For example, a bottom surface of the spacer 217 may directly contact a top surface of the pixel defining layer 215. In an exemplary embodiment, the spacer 217 may include an organic insulating material such as polyimide. Alternatively, the spacer 217 may include an inorganic insulating material such as silicon nitride or silicon oxide, or may include an inorganic insulating material and an organic insulating material.

According to an exemplary embodiment, the spacer 217 may include a material that is different from the material included in the pixel defining layer 215. Alternatively, the spacer 217 may include the same material as the material included in the pixel defining layer 215. In this embodiment, the pixel defining layer 215 and the spacer 217 may be formed together, such as in a mask process using a halftone mask or the like. According to an exemplary embodiment, the pixel defining layer 215 and the spacer 217 may both include polymide.

A capping layer 230 may be located on the opposite electrode 223. For example, as shown in the exemplary embodiment of FIG. 8, the capping layer 230 may be disposed directly on the opposite electrode (e.g., in the Z direction). In an exemplary embodiment, the capping layer 230 may include lithium fluoride (LiF), an inorganic material, or/and an organic material. According to another exemplary embodiment, the capping layer 230 may be omitted.

Figure 9:
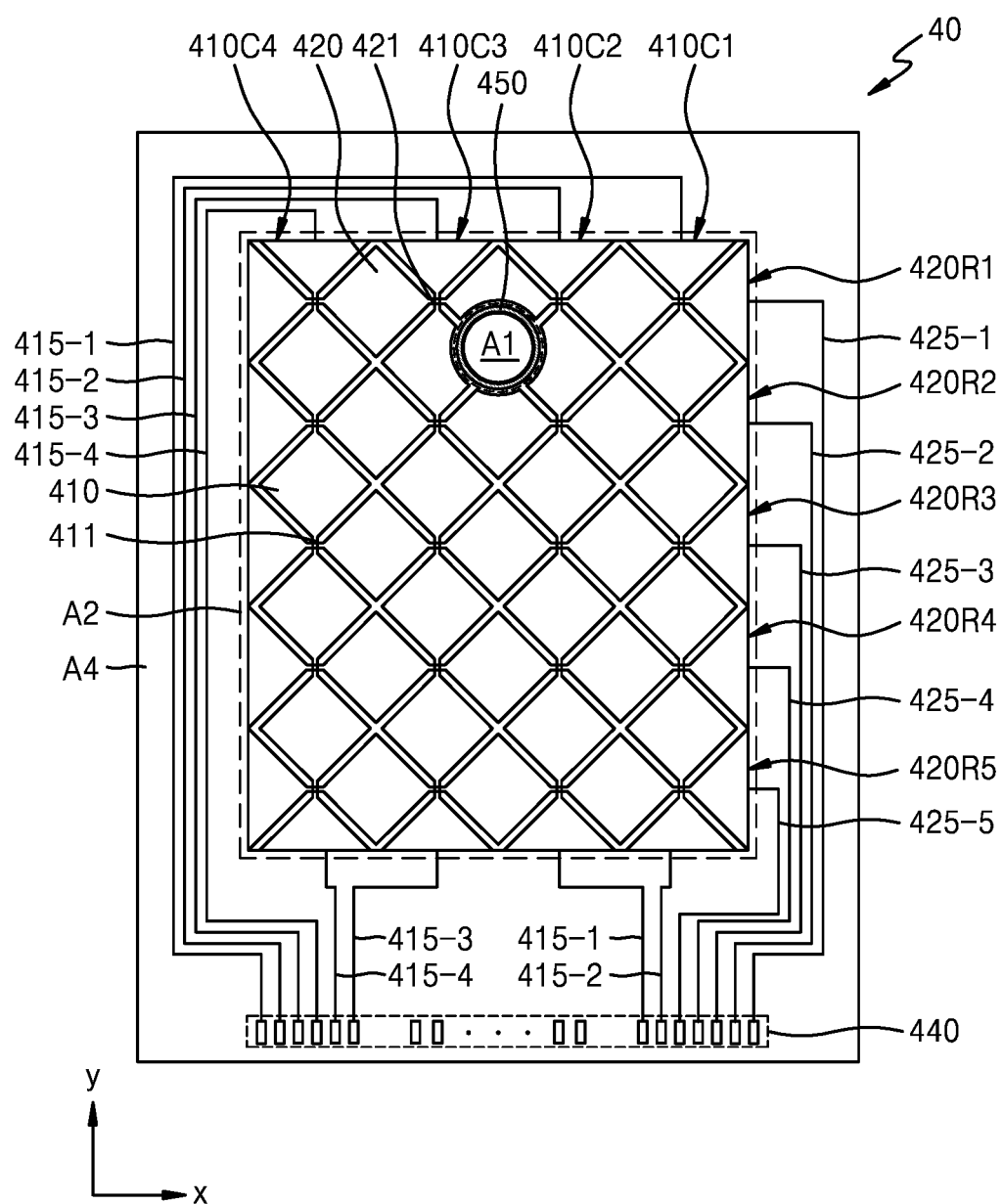
FIG. 9 is a top plan view of an input sensing section on a display panel according to an exemplary embodiment of the present inventive concepts.

FIG. 9 is a schematic top plan view of the input sensing section 40 on a display panel according to an exemplary embodiment of the present inventive concepts.

Referring to FIG. 9, the input sensing section 40 may include first sensing electrodes 410, first trace lines 415-1 through 415-4 connected to the first sensing electrodes 410, second sensing electrodes 420, and second trace lines 425-1 through 425-5 connected to the second sensing electrodes 420. The first sensing electrodes 410 and the second sensing electrodes 420 may be arranged in the second area A2, and the first trace lines 415-1 through 415-4 and the second trace lines 425-1 through 425-5 may be arranged in the fourth area A4.

The first sensing electrodes 410 may be arranged in the Y direction and the second sensing electrodes 420 may be arranged in the X direction crossing the Y direction. The first sensing electrodes 410 arranged in the Y direction may be connected to each other via a first connecting electrode 411 therebetween, and may form first sensing lines 410C1 through 410C4. The second sensing electrodes 420 arranged in the X direction may be connected to each other via a second connecting electrode 421 therebetween, and may form second sensing lines 420R through 420R5. The first sensing lines 410C1 through 410C4 and the second sensing lines 420R1 through 420R5 may cross each other. For example, the first sensing lines 410C1 through 410C4 may be perpendicular to the second sensing lines 420R1 through 420R5. While the exemplary embodiment shown in FIG. 9 includes four first sensing lines 410C1 through 410C4 and five second sensing lines 420R1 through 420R5 for convenience of explanation, exemplary embodiments of the present inventive concepts are not limited thereto and the number of first sensing lines and second sensing lines arranged in the first area A1 may vary.

The first sensing lines 410C1 through 410C4 may be connected to pads of a sensing signal pad unit 440 through the first trace lines 415-1 through 415-4 provided in the fourth area A4. In an exemplary embodiment, the signal pad unit 440 may be disposed in the fourth area A4 on a bottom edge of the input sensing section 40 (e.g., in the Y direction). For example, the first trace lines 415-1 through 415-4 may have a double routing structure in which they are connected to each of a top and a bottom of the first sensing lines 410C1 through 410C4. The first trace lines 415-1 through 415-4 connected to the top and bottom of the first sensing lines 410C1 through 410C4 may be connected to corresponding pads, respectively.

The second sensing lines 420R1 through 420R5 may be connected to pads of the sensing signal pad unit 440 through the second trace lines 425-1 through 425-5 provided in the fourth area A4 (e.g., a right side of the fourth area A4 in the X direction). For example, the second trace lines 425-1 through 425-5 may be connected to corresponding pads, respectively.

The first area A1 is an area where a component may be arranged, as described above with reference to FIGS. 2A and 2B. Therefore, no sensing electrodes may be arranged in the first area A1. A metal layer 450 may be arranged in the vicinity of the first area A1, for example, in the third area A3, as will be described later in detail.

FIG. 9 illustrates a double routing structure in which the first trace lines 415-1 through 415-4 are connected to each of the top and bottom of the first sensing lines 410C1 through 410C4. This double routing structure may increase sensing sensitivity. However, exemplary embodiments of the present inventive concepts are not limited thereto. According to another exemplary embodiment, the first trace lines 415-1 through 415-4 may have a single routing structure in which they are connected to only the top or bottom of the first sensing lines 410C1 through 410C4.

Figure 10:
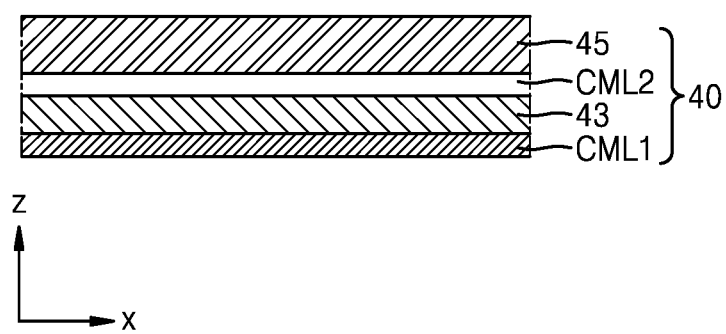
FIG. 10 is a cross-sectional view of a stacking structure of the input sensing section according to an exemplary embodiment of the present inventive concepts.

FIG. 10 is a cross-sectional view of a stacking structure of the input sensing section 40 according to an exemplary embodiment of the present inventive concepts.

Referring to FIG. 10, the input sensing section 40 may include a first conductive layer CML1 and a second conductive layer CML2. A first insulating layer 43 may be provided between the first conductive layer CML and the second conductive layer CML2 (e.g., in the Z direction), and a second insulating layer 45 may be provided on the second conductive layer CML2. The first sensing electrodes 410, the first connecting electrodes 411, the second sensing electrodes 420, and the second connecting electrodes 421 described above with reference to FIG. 9 may each be included in the first conductive layer CML1 or the second conductive layer CML2.

The first and second conductive layers CML1 and CML2 may include, for example, a metal layer or a transparent conductive layer. In an exemplary embodiment, the metal layer may include at least one compound selected from Mo, Mg, Ag, Ti, Cu, Al, or an alloy thereof. In an exemplary embodiment, the transparent conductive layer may include a transparent conductive oxide such as at least one compound selected from indium tin oxide (ITO), indium zinc oxide (IZO), zinc oxide (ZnO), or indium tin zinc oxide (ITZO). Alternatively, the transparent conductive layer may include a conductive polymer (e.g., PEDOT), metal nano wires, graphene, or the like.

The first and second conductive layers CML1 and CML2 may be single layers or multi-layers. In an exemplary embodiment in which the first and second conductive layers CML1 and CML2 are single layers, the first and second conductive layers CML1 and CML2 may each include a metal layer or a transparent conductive layer, and materials of the metal layer and the transparent conductive layer may be as described above. In an exemplary embodiment, the first or second conductive layer CML1 or CML2 may include a single metal layer. The single metal layer may include a Mo layer or an alloy layer of Mo and another metal element. In an exemplary embodiment, the first or second conductive layer CML1 or CML2 may include a multi-layered metal layer. The multi-layered metal layer may include, for example, three layers, such as a Ti/Al/Ti layer, or two layers, such as Mo/Mg layers. Alternatively, the multi-layered metal layer may include a metal layer and a transparent conductive layer. The first and second conductive layers CML1 and CML2 may have a different stacking structure or may have an identical stacking structure. For example, the first conductive layer CML1 may include a metal layer and the second conductive layer CML2 may include a transparent conductive layer. Alternatively, the first and second conductive layers CML1 and CML2 may include the same metal layers.

Materials of the first and second conductive layers CML1 and CML2, and layouts of sensing electrodes included in the first and second conductive layers CML1 and CML2 may be determined by taking into account sensing sensitivity. An RC delay may affect sensing sensitivity. Since sensing electrodes that include a metal layer have less resistance than sensing electrodes that include a transparent conductive layer, an RC value may be reduced. Accordingly, a charging time period of a capacitor defined between the sensing electrodes may be reduced. The sensing electrodes including a transparent conductive layer are not visible to a user, as compared with sensing electrodes including a metal layer. Therefore, an input area may be increased by utilizing sensing electrodes including a transparent conductive layer, thereby increasing capacitance.

Each of the first and second insulating layers 43 and 45 may include an inorganic insulative material or/and an organic insulative material. In an exemplary embodiment, the inorganic insulative material may include at least one compound selected from silicon oxide, silicon nitride, or silicon oxynitride, and the organic insulative material may include at least one polymer organic material.

In an exemplary embodiment, some of the first and second sensing electrodes 410 and 420 and first and second connecting electrodes 411 and 421 described above with reference to FIG. 9 may be located in the first conductive layer CML1 and the remaining thereof may be located in the second conductive layer CML2.

In an exemplary embodiment, the first conductive layer CML1 may include the first connecting electrodes 411 of FIG. 9 and the second conductive layer CML2 may include the first and second sensing electrodes 410 and 420 of FIG. 9 and the second connecting electrodes 421 of FIG. 9. According to another exemplary embodiment, the first conductive layer CML1 may include the first and second sensing electrodes 410 and 420 of FIG. 9 and the second connecting electrodes 421 of FIG. 9, and the second conductive layer CML2 may include the first connecting electrodes 411 of FIG. 9. According to another exemplary embodiment, the first conductive layer CML1 may include the first sensing electrodes 410 of FIG. 9 and the first connecting electrodes 411 of FIG. 9, and the second conductive layer CML2 may include the second sensing electrodes 420 of FIG. 9 and the second connecting electrodes 421 of FIG. 9. In this embodiment, the first sensing electrodes 410 and the first connecting electrodes 411 are included on the same layer and are integrally formed with each other, and the second sensing electrodes 420 and the second connecting electrodes 421 are also included on the same layer and may be integrally formed with each other. Thus, an insulating layer between the first conductive layer CML1 and the second conductive layer CML2 may include no contact holes. According to another exemplary embodiment, the first conductive layer CML1 may include the first sensing electrodes 410 of FIG. 9, the first connecting electrodes 411 of FIG. 9, and a second auxiliary electrode, and the second conductive layer CML2 may include the second sensing electrodes 420 of FIG. 9, the second connecting electrodes 421 of FIG. 9, and a first auxiliary electrode. In this embodiment, the first sensing electrodes 410 and the first connecting electrodes 411 may be included on the same layer and integrally formed with each other, and the second sensing electrodes 420 and the second connecting electrodes 421 may also be included on the same layer and integrally formed with each other. In an exemplary embodiment, the first auxiliary electrode may have the same shape as each of the first sensing electrodes 410, and the first auxiliary electrode and the first sensing electrode 410 may be electrically connected to each other through a contact hole of an insulating layer therebetween. Similarly, the second auxiliary electrode may have the same shape as each of the second sensing electrodes 420, and the second auxiliary electrode and the second sensing electrode 420 may be electrically connected to each other through a contact hole of an insulating layer therebetween.

FIG. 10 illustrates that the input sensing section 40 includes the first conductive layer CML1, the first insulating layer 43, the second conductive layer CML2, and the second insulating layer 45. However, according to another embodiment, a layer including an inorganic insulative material or an organic insulative material may be further arranged below the first conductive layer CML1 (e.g., in the Z direction).

Figure 11A:
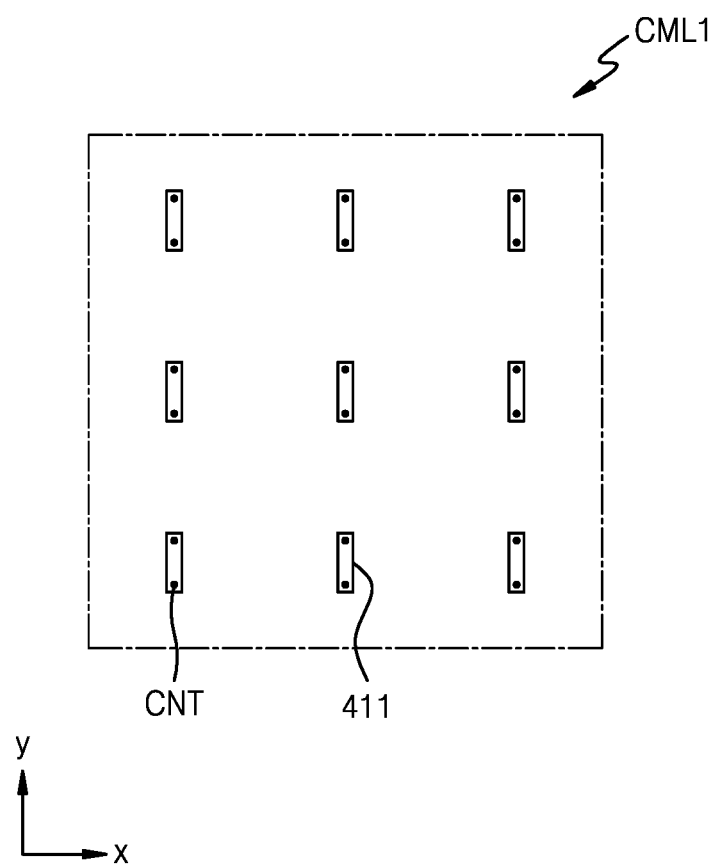
FIG. 11A is a top plan view of a first conductive layer of the input sensing section according to an exemplary embodiment of the present inventive concepts.
Figure 11B:
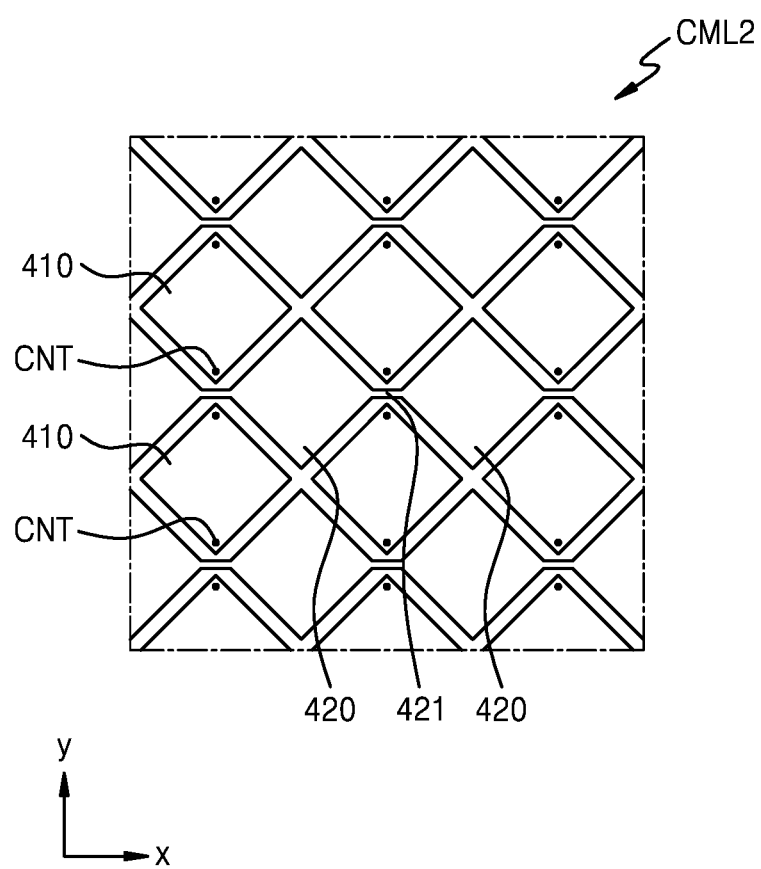
FIG. 11B is a top plan view of a second conductive layer of the input sensing section according to an exemplary embodiment of the present inventive concepts.

FIG. 11A is a top plan view of the first conductive layer CML1 of the input sensing section 40, according to an exemplary embodiment of the present inventive concepts, and FIG. 11B is a top plan view of the second conductive layer CML2 in the input sensing section 40, according to an exemplary embodiment of the present inventive concepts.

As shown in the exemplary embodiments of FIGS. 11A, and 11B, the first conductive layer CML1 may include the first connecting electrodes 411, and the second conductive layer CML2 may include the first sensing electrodes 410, the second sensing electrodes 420, and the second connecting electrodes 421.

The second sensing electrodes 420 may be connected to each other by the second connecting electrodes 421 provided on the same layer as the second sensing electrodes 420. For example, in an exemplary embodiment, the second sensing electrodes 420 may include the same material as the material included in the second connecting electrodes 421 and may be integrally formed. The first sensing electrodes 410 may be connected to each other by the first connecting electrodes 411 provided on a different layer (e.g., the first conductive layer CML1). As shown in FIG. 11A, the first insulating layer 43 may include a contact hole CNT. The first connecting electrode 411 may be electrically connected to neighboring first sensing electrodes 410 on the second conductive layer CML2 (e.g., first sensing electrodes 410 overlapping the first connecting electrode 411 in the Z direction) through a contact hole CNT provided in the first insulating layer 43.

In exemplary embodiments in which each of the first and second sensing electrodes 410 and 420 includes a transparent conductive layer, the first and second sensing electrodes 410 and 420 may have a rectangular or diamond shape as shown in FIG. 11B and may have an area corresponding to the aforementioned shape, and thus may have a relatively large input area compared to a mesh-type sensing electrode described below and may have a high capacitance. In exemplary embodiments in which each of the first and second sensing electrodes 410 and 420 includes a transparent conductive layer, the second conductive layer CML2 may be formed of a transparent conductive material and the first conductive layer CML1 may be formed of metal.

Although the exemplary embodiments of FIGS. 11A-11B show the first conductive layer CML1 including the first connecting electrodes 411 and the second conductive layer CML2 including the first sensing electrodes 410, the second sensing electrodes 420, and the second connecting electrodes 421, exemplary embodiments of the present inventive concepts are not limited thereto. For example, in another exemplary embodiment, the second conductive layer CML2 may include the first connecting electrodes 411 and the first conductive layer CML1 may include the first sensing electrodes 410, the second sensing electrodes 420, and the second connecting electrodes 421.

Figure 12A:
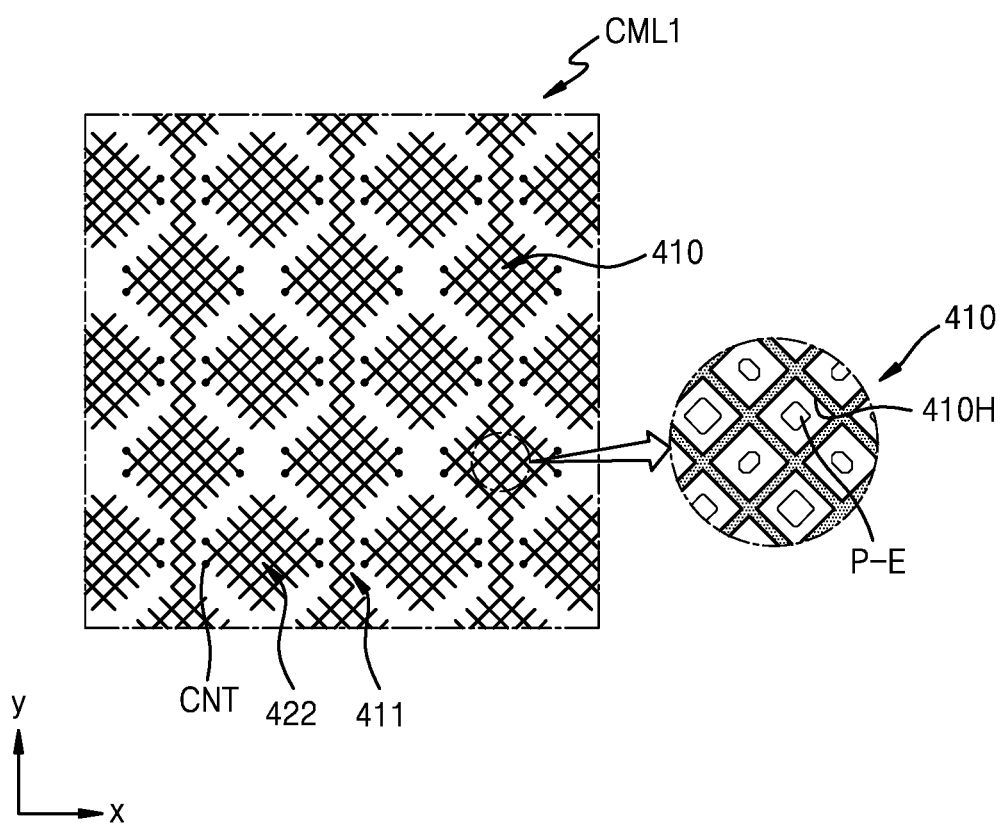
FIG. 12A is a top plan view and a magnified view of a first conductive layer of the input sensing section according to an exemplary embodiment of the present inventive concepts.
Figure 12B:
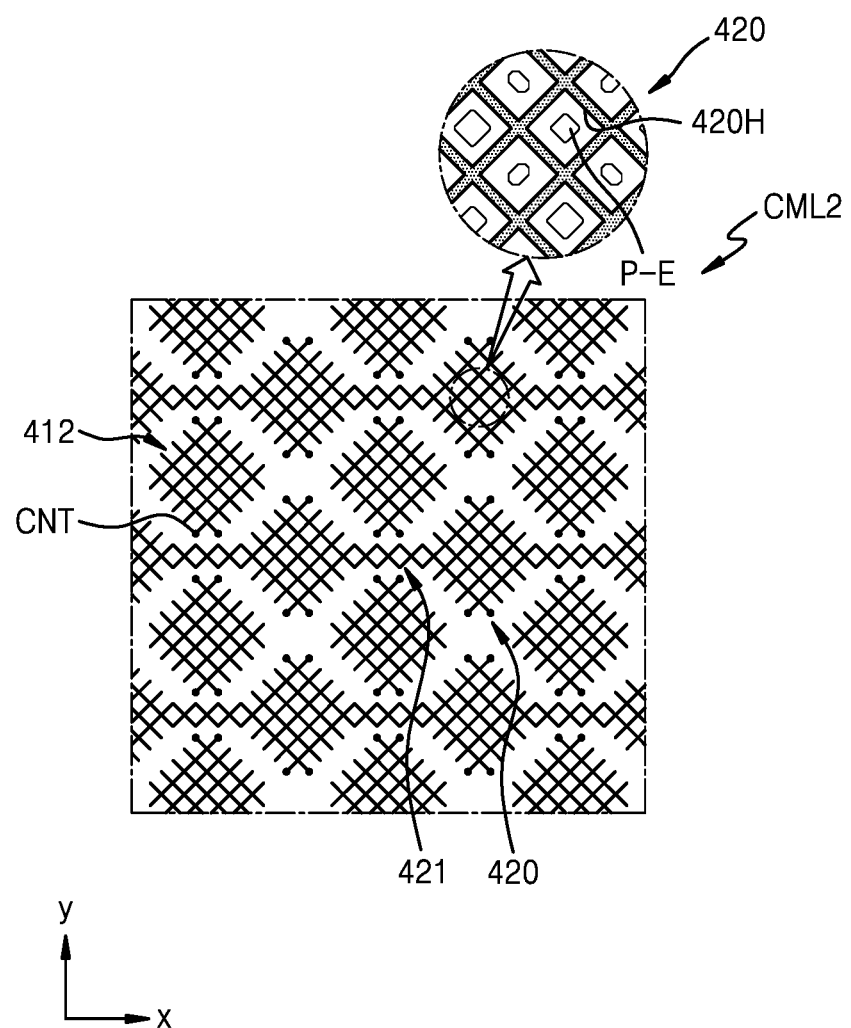
FIG. 12B is a top plan view and a magnified view of a second conductive layer of the input sensing section according to an exemplary embodiment of the present inventive concepts.

FIG. 12A is a top plan view of the first conductive layer CML1 of the input sensing section 40, according to an exemplary embodiment of the present inventive concepts, and FIG. 12B is a top plan view of the second conductive layer CML2 of the input sensing section 40, according to an exemplary embodiment of the present inventive concepts.

Referring to FIGS. 10, 12A, and 12B, the first and second sensing electrodes 410 and 420 and the first and second connecting electrodes 411 and 421 may have a mesh (or grid or lattice) shape. In exemplary embodiments in which the first and second sensing electrodes 410 and 420 include a metal layer, the first and second sensing electrodes 410 and 420 may have a mesh shape as shown in FIGS. 12A and 12B to prevent visibility of the metal layer to a user or/and to transmit the light emitted from a light-emitting diode of each pixel.

As shown in the magnified views of FIGS. 12A and 12B, the first and second sensing electrodes 410 and 420 may be mesh-shaped metal layers including holes 410H and 420H, respectively. The holes 410H and 420H may be provided to overlap a light-emission area P-E of a pixel. The first and second connecting electrodes 411 and 421 may include mesh-shaped metal layers, respectively.

As shown in FIG. 12A, the first sensing electrodes 410 may be connected to each other by the first connecting electrodes 411 provided on the same layer as the layer on which the first sensing electrodes 410 are provided. Similarly, as shown in FIG. 12B, the second sensing electrodes 420 may be connected to each other by the second connecting electrodes 421 provided on the same layer as the layer on which the second sensing electrodes 420 are provided.

As shown in the exemplary embodiment of FIG. 12A, the first conductive layer CML1 may include second auxiliary electrodes 422. The second auxiliary electrodes 422 may overlap the second sensing electrodes 420, respectively (e.g., overlapping in the Z direction). The second auxiliary electrodes 422 of the first conductive layer CML1 may be electrically connected to the second sensing electrodes 420 of the second conductive layer CML2 through contact holes CNT formed in a first insulating layer.

The second conductive layer CML2 may include first auxiliary electrodes 412 as shown in FIG. 12B, and the first auxiliary electrodes 412 may overlap the first sensing electrodes 410, respectively (e.g., overlapping in the Z direction). The first auxiliary electrodes 412 of the second conductive layer CML2 may be electrically connected to the overlapping first sensing electrodes 410 of the first conductive layer CML1 through the contact holes CNT formed in the first insulating layer.

Figure 13A:
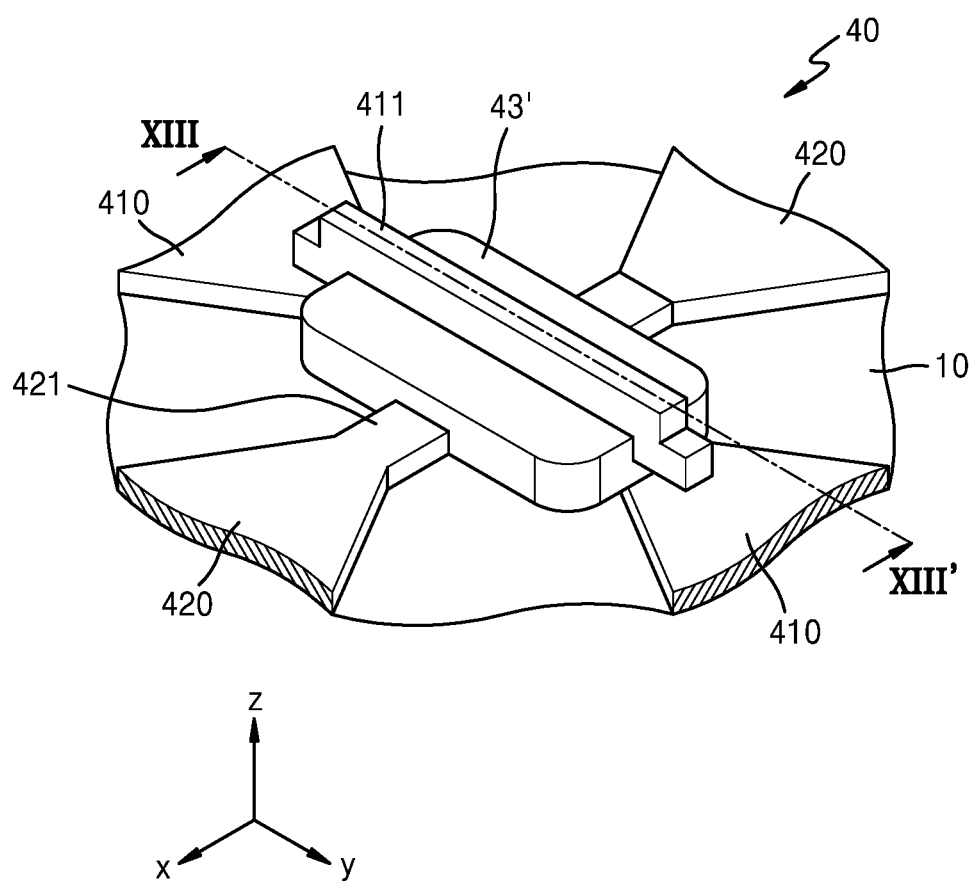
FIG. 13A is a perspective view of a portion of an input sensing section according to an exemplary embodiment of the present inventive concepts.
Figure 13B:
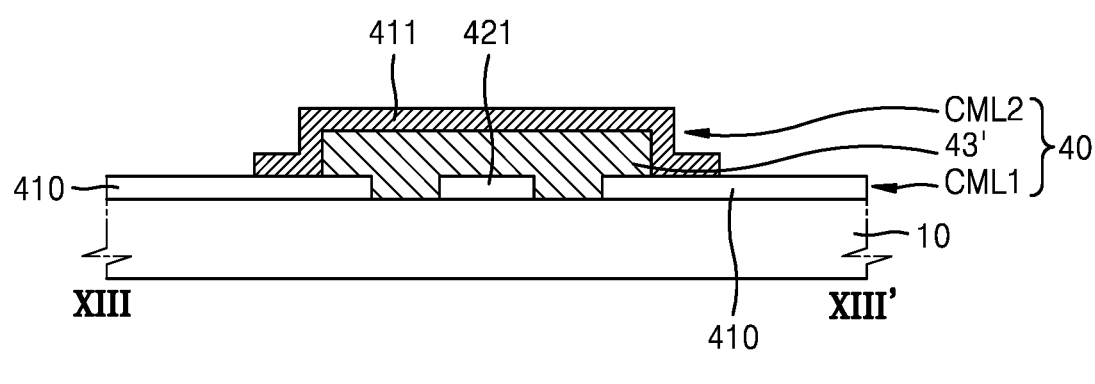
FIG. 13B is a cross-sectional view taken along line XIII-XIII' of FIG. 13A of a input sensing section according to an exemplary embodiment of the present inventive concepts.

FIG. 13A is a perspective view of a portion of the input sensing section 40 according to an exemplary embodiment of the present inventive concepts, and FIG. 13B is a cross-sectional view taken along line XIII-XIII' of FIG. 13A according to an exemplary embodiment of the present inventive concepts.

Referring to FIGS. 10, 13A, and 13B, two first sensing electrodes 410 (e.g., arranged in the Y direction) may be connected to each other by a first connecting electrode 411, and two second sensing electrodes 420 (e.g., arranged in the X direction) may be connected to each other by a second connecting electrode 421. The first sensing electrodes 410, the second sensing electrodes 420, and the second connecting electrodes 421 may be formed on the same layer, such as the first conductive layer CML1 or the second conductive layer CML2.

The first connecting electrode 411 may extend in the Y direction and may cross the second connecting electrode 421 extending in the X direction. The first connecting electrode 411 may be located on a first insulating layer 43' of an island type (hereinafter, referred to as a first insulating pattern) arranged between the first and second connecting electrodes 411 and 421. The first insulating pattern 43' may be arranged at every intersection of the first and second connecting electrodes 411 and 421.

In an exemplary embodiment, each first insulating pattern 43' may include an organic material or an inorganic material. According to an exemplary embodiment, each first insulating pattern 43' may include a material selected from at least one of a photosensitive material, silicon oxide, titanium oxide, zinc oxide, silicon nitride, aluminum nitride, and tantalum oxide.

An insulating layer, such as the second insulating layer 45 described above with reference to FIG. 10, may be located on the first connecting electrode 411. The second insulating layer 45 may cover the rust and second sensing electrodes 410 and 420 and the first and second connecting electrodes 411 and 421 (e.g., in the Z direction).

FIGS. 13A and 13B illustrate that the first conductive layer CML1 is located directly on the display panel 10. However, according to another exemplary embodiment, an insulating layer including an inorganic or organic material may be disposed between the display panel 10 and the first conductive layer CML1 (e.g., in the Z direction).

Figure 14:
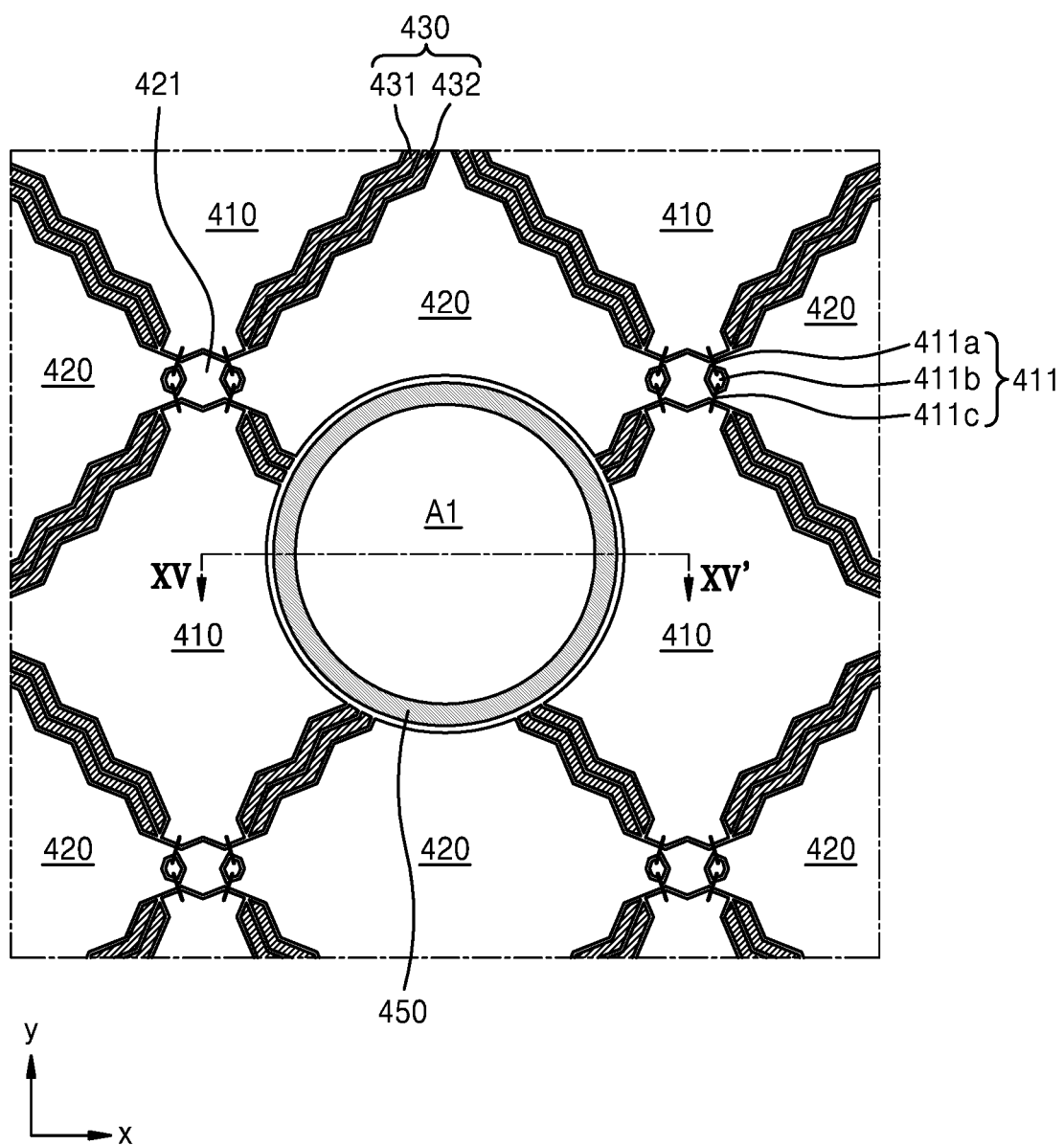
FIG. 14 is a top plan view of a portion of a display device according to an exemplary embodiment of the present inventive concepts.

FIG. 14 is a top plan view of a portion of a display device according to an exemplary embodiment of the present inventive concepts.

Referring to FIG. 14, the first sensing electrodes 410 may be arranged in the Y direction, the second sensing electrodes 420 may be arranged in the X direction, and adjacent second sensing electrodes 420 may be connected to each other through a second connecting electrode 421 located therebetween. Adjacent first sensing electrodes 410 may be connected to each other via a first connecting electrode 411. The first connecting electrode 411 may include an island portion 411b spaced apart from the first sensing electrodes 410 (e.g., in the Y direction). The island portion 411b may be arranged within a hole formed in the second connecting electrode 421, and may be spaced apart from the second connecting electrode 421 (e.g., in the Z direction) to be electrically insulated from the second connecting electrode 421.

One of the adjacent first sensing electrodes 410 (e.g., adjacent in the Y direction) may be connected to the island portion 411b through a first bridge portion 411a, and the other adjacent first sensing electrode 410 may be connected to the island portion 411b through a second bridge portion 411c. The first bridge portion 411a and the second bridge portion 411c may be spaced apart in the Y direction. The first connecting electrode 411 may include the first bridge portion 411a, the island portion 411b, and the second bridge portion 411c that are physically or electrically connected to each other. According to an exemplary embodiment, the island portions 411b may be arranged on the same layer as the layer on which the first sensing electrodes 410, the second sensing electrodes 420, and the second connecting electrodes 421 are arranged. For example, the second conductive layer CML2 of FIG. 10 may include the island portions 411b, the first sensing electrodes 410, the second sensing electrodes 420, and the second connecting electrodes 421. The first bridge portions 411a and the second bridge portions 411c may be arranged on a different layer from the layer on which the island portions 411b are arranged. For example, the first conductive layer CML1 of FIG. 10 may include the first bridge portions 411a and the second bridge portions 411c.

A dummy electrode 430 may be arranged between a first sensing electrode 410 and a second sensing electrode 420 that are adjacent to each other. For example, as shown in FIG. 14, the dummy electrode 430 may include a first dummy electrode 431 and a second dummy electrode 432 each extending along an edge of the first sensing electrode 410 or the second sensing electrode 420. For example, the first dummy electrode 431 and the second dummy electrode 432 may each extend in a zigzag shape. The first dummy electrode 431 may extend along the edges of the first sensing electrodes 410 and the second dummy electrode 432 may extend along edges of the second sensing electrodes 420. However, exemplary embodiments of the present inventive concepts are not limited thereto and the first dummy electrode and the second dummy electrode may have various arrangements. The dummy electrode 430 may be arranged to increase sensing sensitivity. The dummy electrode 430 may be a floating electrode.

In an exemplary embodiment, the first sensing electrodes 410 and the second sensing electrodes 420 arranged around the first area A1 may have different shapes from the other sensing electrodes. The first sensing electrode(s) 410 and the second sensing electrode(s) 420 adjacent to the first area A1 may have smaller areas than the other sensing electrodes.

For example, as shown in the exemplary embodiment of FIG. 14, each of the first sensing electrodes 410 and the second sensing electrodes 420 adjacent to the first area A1 may have a curved edge, and an arrangement of the respective adjacent curved edges of the first sensing electrodes 410 and the second sensing electrodes 420 may collectively form a circular shape that surrounds the first area A1. For example, in an exemplary embodiment, the adjacent curved edges of the first sensing electrodes 410 and second sensing electrodes 420 may correspond to the edge of the third area A3. However, in other exemplary embodiments, the third area A3 may be disposed further within the perimeter formed by the adjacent curved edges of the first sensing electrodes 410 and the second sensing electrodes 420.

Figure 15:
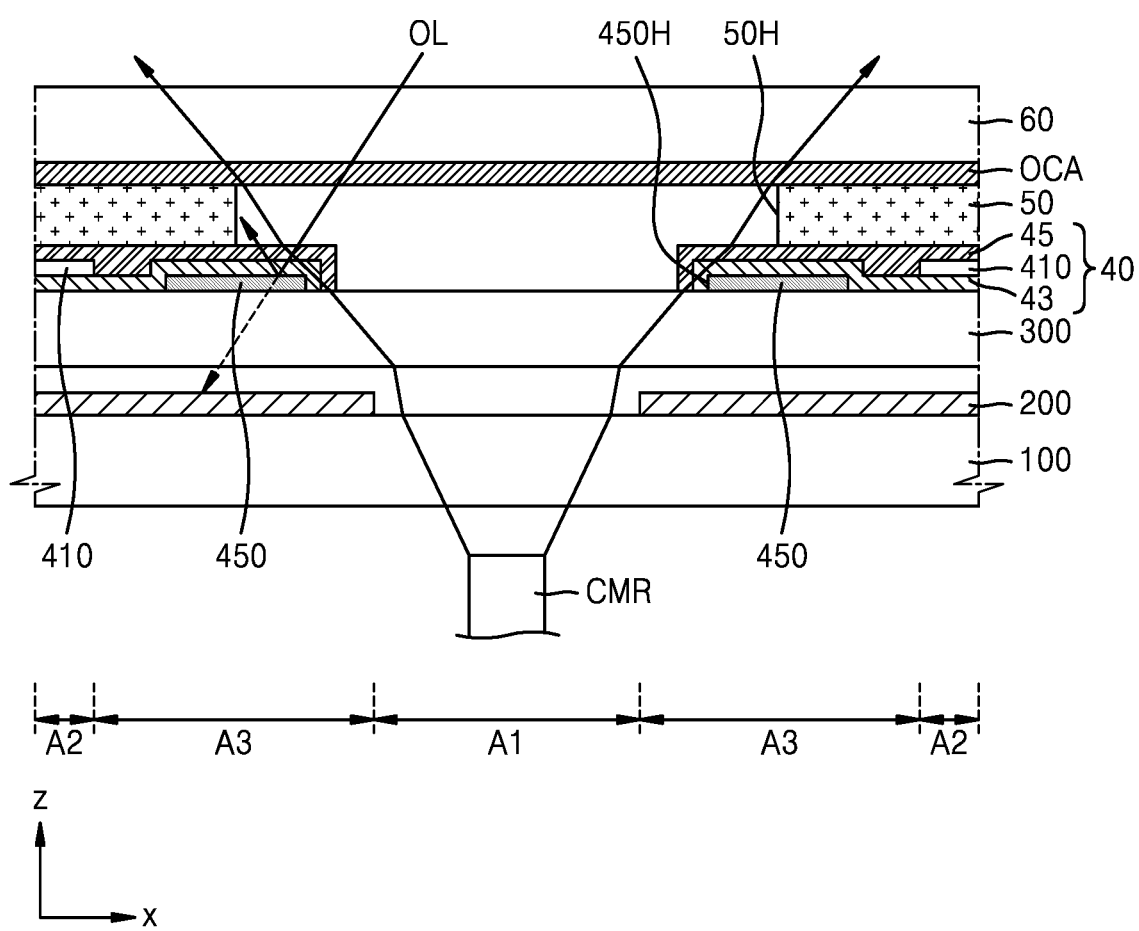
FIG. 15 is a cross-sectional view of a display device according to an exemplary embodiment of the present inventive concepts.

As shown in the exemplary embodiments of FIGS. 14-15, the metal layer 450 may be arranged in the third area A3 disposed between the first area A1 and the first and second sensing electrodes 410 and 420. Since the first sensing electrodes 410 and the second sensing electrodes 420 are arranged in the second area A2 which is an active area, light-emitting diodes, such as organic light-emitting diodes, may be arranged below the first sensing electrodes 410 and the second sensing electrodes 420. Since the first area A1 is capable of transmitting light, angled incident light (e.g., light traveling at an oblique angle with respect to a thickness direction of the device 1) from the outside may pass the first area A1 and reach a light-emitting diode. When light-emitting diodes are exposed to external light (e.g., incident solar light), a layer included in each light-emitting diode or a layer arranged around the light-emitting diode may shrink. However, according to an exemplary embodiment, the metal layer 450 arranged around the first area A1 may block external light from reaching a light-emitting diode.

The metal layer 450 may surround the first area A1 while having a certain width (e.g., length in the X and/or Y directions). In an exemplary embodiment, the metal layer 450 may have a ring shape that surrounds the first area A1, in a plan view (e.g., for the Z direction). In an exemplary embodiment, the metal layer 450 may include at least one compound selected from Mo. Mg, Ag, Ti, Cu, Al, or an alloy thereof. For example, the metal layer 450 may include Mo or may include MoMg. The metal layer 450 may be in a floating state in which it is electrically isolated from its surrounding elements, such as the first and second sensing electrodes 410 and 420 and the dummy electrodes 430.

FIG. 15 is a cross-sectional view taken along line XV-XV' of FIG. 14, according to an exemplary embodiment of the present inventive concepts.

Referring to the exemplary embodiment of FIG. 15, the display layer 200 arranged on the substrate 100 includes a plurality of pixels, for example, organic light-emitting diodes, arranged in the second area A2. Since the first area A1 is capable of transmitting light, a component such as a sensor or a camera CMR arranged in the first area A1 may emit light toward the outside and/or receive external light. Since light may travel in various directions, incident external light OL that is angled obliquely toward the substrate 100 may travel toward the display layer 200 as indicated by a dotted line when there are no metal layers 450. However, according to exemplary embodiments of the present inventive concepts, the metal layer 450 is arranged to surround the first area A1 and thus reflects the angled incident external light OL towards the window 60 and away from the display layer, thereby preventing the external light OL from reaching the display layer 200. The metal layer 450 may include an eighth hole 450H located in the first area A1.

The metal layer 450 may be located on an encapsulation member 3Y. For example, as shown in the exemplary embodiment of FIG. 15, the metal layer 450 may be disposed directly on an encapsulation member 300 (e.g., in the Z direction). However, exemplary embodiments of the present inventive concepts are not limited thereto. The encapsulation member 300 of FIG. 15 encapsulates the display layer 200, and thus may be a rigid encapsulation substrate as described above with reference to FIGS. 3A through 3C, or may be a flexible thin-film encapsulation layer as described above with reference to FIGS. 4A through 4C.

The metal layer 450 may be arranged below the first sensing electrodes 410 (e.g., in the Z direction) with the first insulating layer 43 of the input sensing section 40 disposed therebetween. For example, as shown in the exemplary embodiment of FIG. 15, the first insulating layer 43 may be disposed directly on a top surface of the encapsulation member 300 and top and side surfaces of the metal layer 450. The first sensing electrodes 410 may be covered by the second insulating layer 45. For example, as shown in the exemplary embodiment of FIG. 15, the second insulating layer 45 may be disposed directly on top and side surfaces of the first sensing electrodes 410 and the first insulating layer 43.

The optical functional section 50 may be disposed on the input sensing section 40. For example, a bottom portion of the optical functional section 50 may contact a top portion of the input sensing section 40. The optical functional section 50 may include the second hole 50H located in the first area A1. The optical functional section 50 may include an external light reflection component such as a phase retarder and/or a polarizer, to prevent reflection of the external light OL. Alternatively, the optical functional section 50 may include an external light reflection component such as a combination of a color filter and a black matrix or a destructive interference structure, to prevent reflection of the external light OL.

A width of the second hole 50H (e.g., a length in the X and/or Y directions) of the optical functional section 50 may be greater than the width of the eighth hole 450H of the metal layer 450. In exemplary embodiments in which the holes are circular (e.g., when viewed in a plan view from the Z direction), the respective widths may be described as diameters. A method of forming the second hole 50H of the optical functional section 50 and the eighth hole 450H of the metal layer 450 such that they have substantially the same diameters may restrict a field of view of a component, such as the camera CMR (e.g., a wide-angle camera) in the first area A1. The restriction of the field of view may be more noticeable when the optical functional section 50 includes an external light reflection component such as a relatively-thick polarizer. The restriction of the field of view may also be more noticeable due to a process error that may be generated in a process of aligning the second hole 50H of the optical functional section 50 with the first area A1 during the manufacture of a display device. However, according to an exemplary embodiment of the present inventive concepts, the second hole 50H of the optical functional section 50 is formed to have a larger diameter (e.g., width) than the eighth hole 450H of the metal layer 450, thereby preventing occurrence of the above-described field-of-view restriction and also preventing damage to a captured image of the camera CMR. The window 60 may be arranged on the optical functional section 50 through the transparent adhesive OCA. For example, as shown in the exemplary embodiment of FIG. 15 the window 60 may be disposed on the optical functional section 50 with the transparent adhesive OCA disposed therebetween (e.g., in the Z direction).

FIGS. 16A through 16D are cross-sectional views of a method of assembling a display device, according to exemplary embodiments of the present inventive concepts.

Figure 16A:
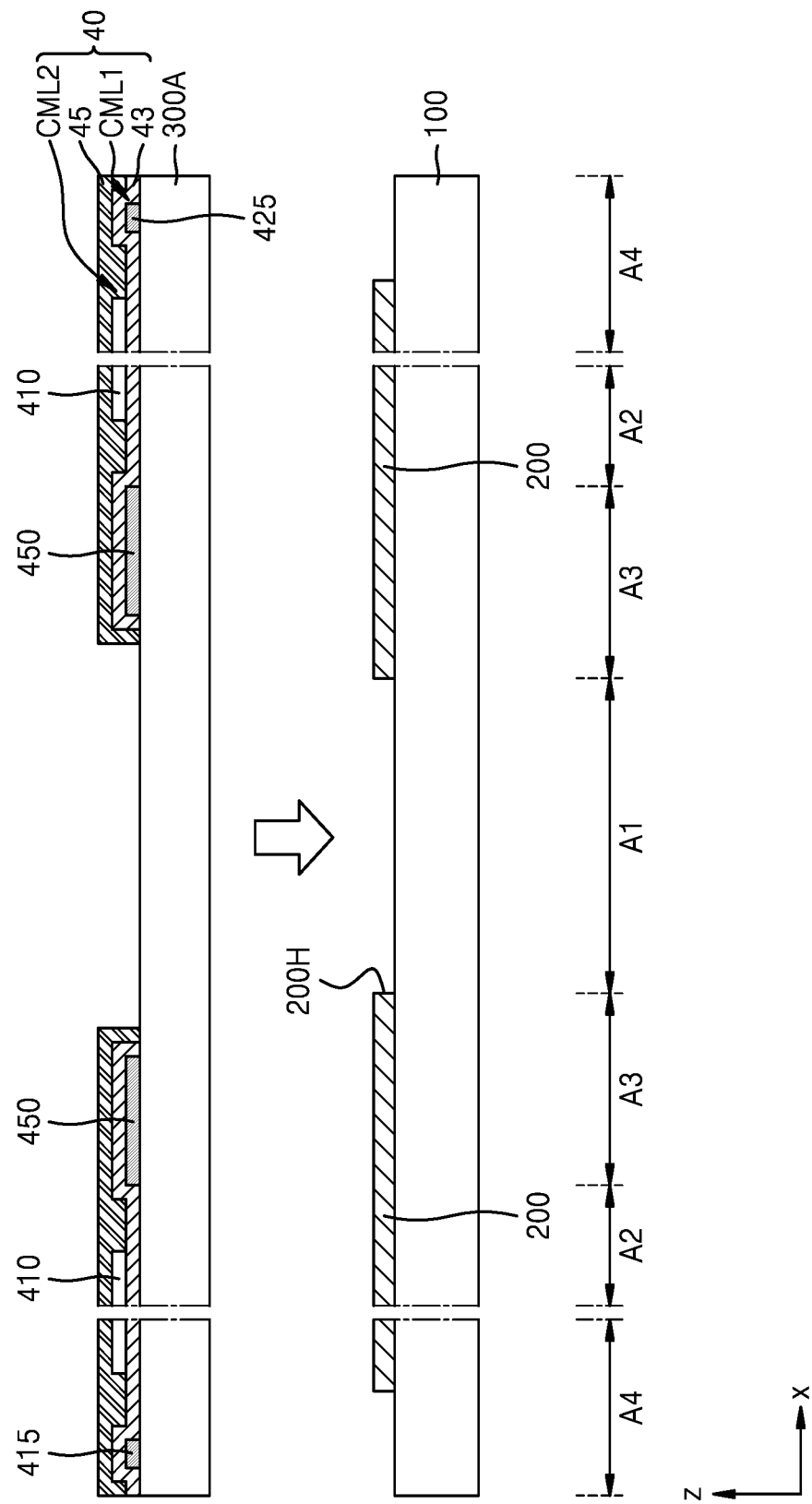
FIGS. 16A through 16D are cross-sectional views of a method of assembling a display device, according to exemplary embodiments of the present inventive concepts.

Referring to FIG. 16A, the display layer 200 is formed on the substrate 100. The display layer 200 may sequentially include insulating layers, pixel circuits, and light-emitting diodes as display elements respectively electrically connected to the pixel circuits. Each of the pixel circuits has electronic elements such as a transistor and a capacitor each including electrodes located between the insulating layers. The display layer 200 may be formed to include the fourth hole 200H. For example, in an exemplary embodiment, in a plurality of processes for respectively forming a plurality of layers that constitute the display layer 200, respective portions of the plurality of layers that correspond to the first area A1 may be removed, and the removed respective portions of the plurality of layers may overlap each other (e.g., in the Z direction) to thereby form the fourth hole 200H.

In an exemplary embodiment, in a separate process from the above-described process of forming the display layer 200, the metal layer 450 and the input sensing section 40 may be formed on the encapsulation substrate 300A. The input sensing section 40 may have a stacking structure in which the first conductive layer CML1, the first insulating layer 43, the second conductive layer CML2, and the second insulating layer 45 are stacked (e.g., in the Z direction). The sensing electrodes, the connecting electrodes, and the trace lines of the input sensing section 40 may be included in the first conductive layer CML1 or the second conductive layer CML2. As shown in the exemplary embodiment of FIG. 16A, the first conductive layer CML1 may include a first trace line 415 and a second trace line 425 on the fourth area A4 and the second conductive layer CML2 may include the first sensing electrodes 410.

In an exemplary embodiment, the metal layer 450 may be formed in a process of forming the first conductive layer CML1. In an exemplary embodiment, the metal layer 450 may include the same material as the material included in the first conductive layer CML1. For example, the metal layer 450 may include the same material as the material included in the first trace line 415 or/and the second trace line 425, and may be located on the same layer as the layer on which the second trace line 425 and/or first trace line 415 are located.

Figure 16B:
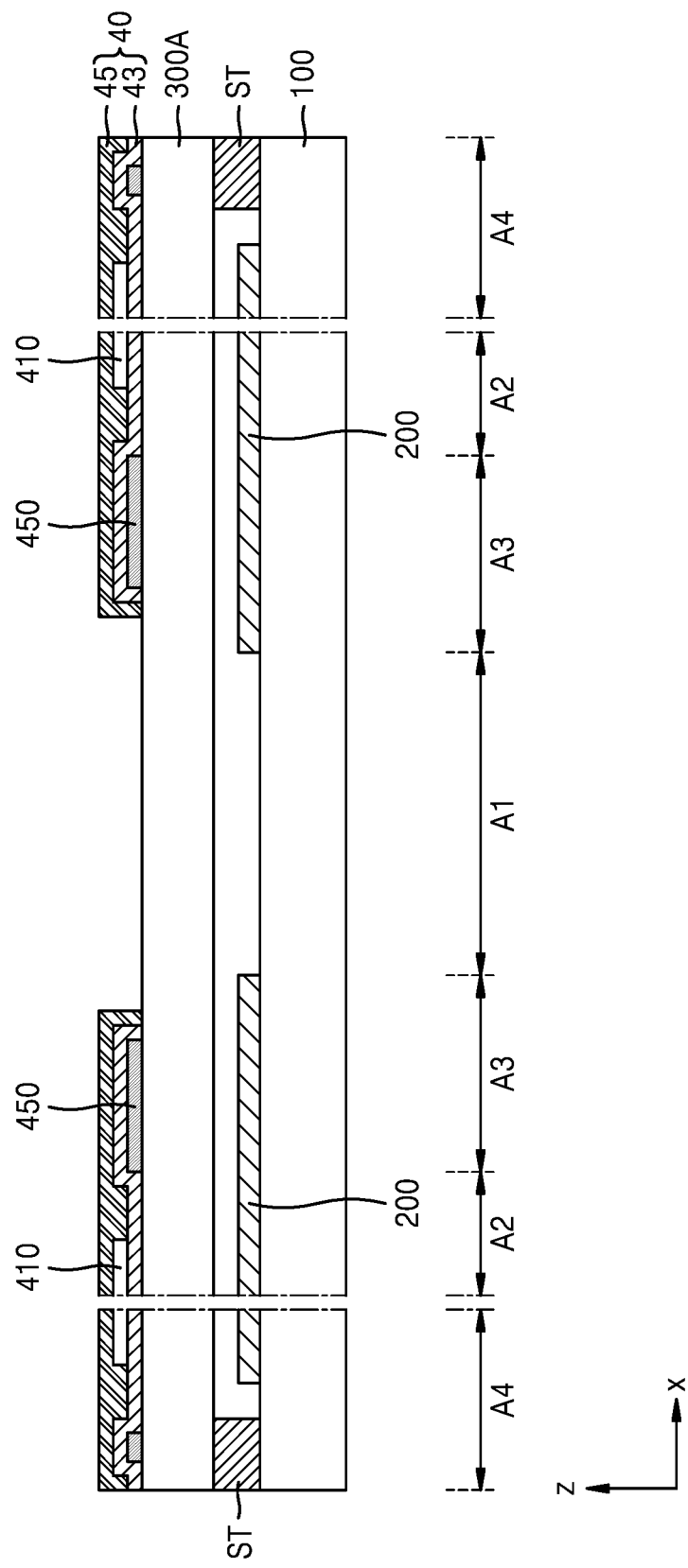

Referring to FIG. 16B, the substrate 100 on which the display layer 200 has been formed, and the encapsulation substrate 300A on which the metal layer 450 and the input sensing section 40 have been formed may be arranged to face each other. The substrate 100 and the encapsulation substrate 300A may be coupled to each other by forming the sealant ST therebetween. The sealant ST may be formed between an upper surface of the substrate 100 and a lower surface of the encapsulation substrate 300A in the fourth area A4. In an exemplary embodiment, the sealant ST may extend to entirely surround the display layer 200 (e.g., in the X and/or Y directions). In an exemplary embodiment, the sealant ST may include frit, which is a glass material for making glass. The frit may be cured, such as by exposure to a laser beam, etc. Alternatively, the sealant ST may include a material such as an epoxy.

Figure 16C:
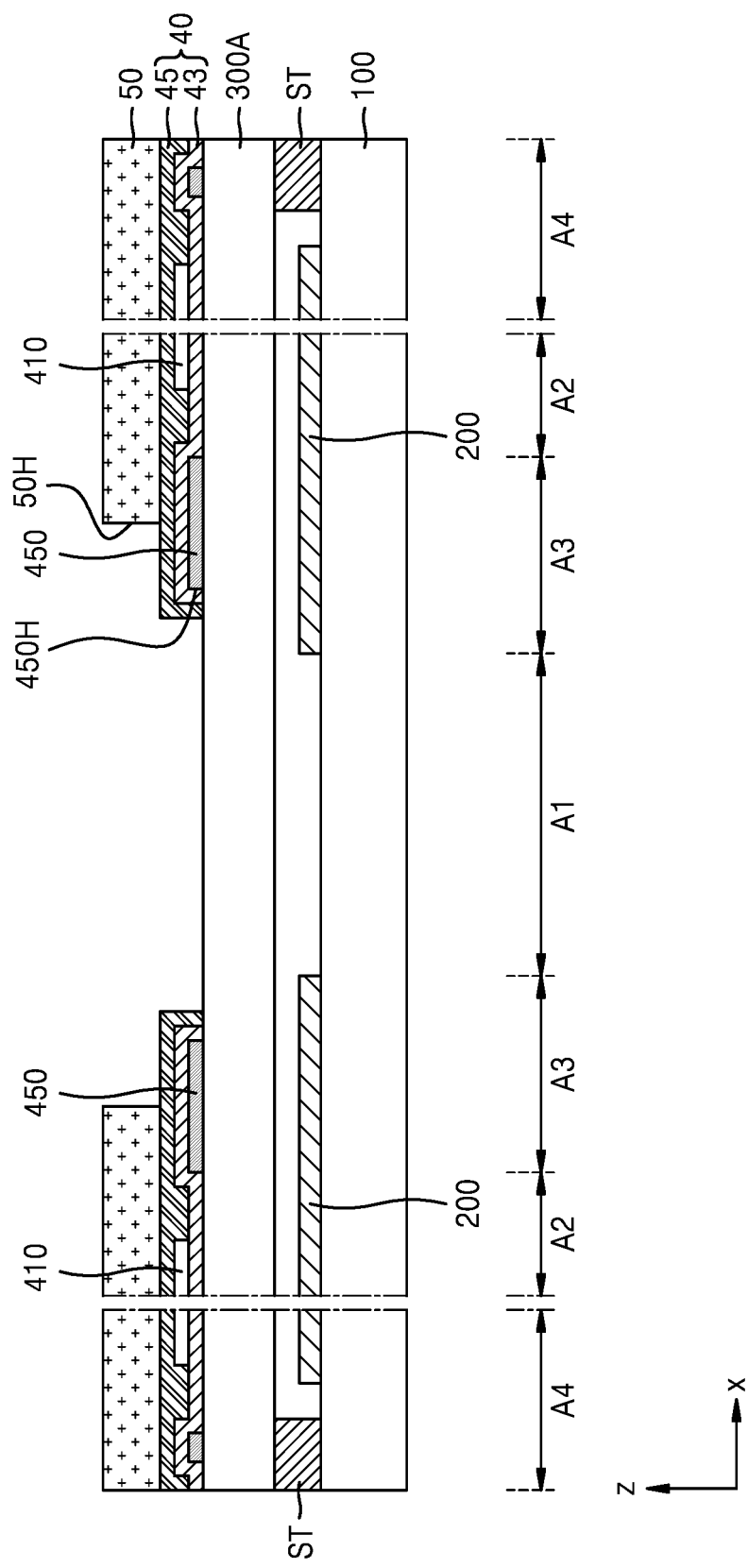

Referring to FIG. 16C, the optical functional section 50 is formed on the input sensing section 40. The optical functional section 50 may be formed on the input sensing section 40 such that the second hole 50H of the optical functional section 50 is located in the first area A1. As shown in the exemplary embodiment of FIG. 16C, the second hole 50H may also be disposed in the third area A3. The second hole 50H of the optical functional section 50 may be formed to be larger (e.g., a larger diameter in the X direction and/or Y direction) than the eighth hole 450H of the metal layer 450. Accordingly, the optical functional section 50 may overlap (e.g., in the Z direction) only a portion of the metal layer 450 (e.g., a partial portion) and the optical functional section 50 may not overlap a portion of the metal layer 450. In an exemplary embodiment, a layer including an inorganic material or an organic material may be disposed between the input sensing section 40 and the optical functional section 50.

Figure 16D:
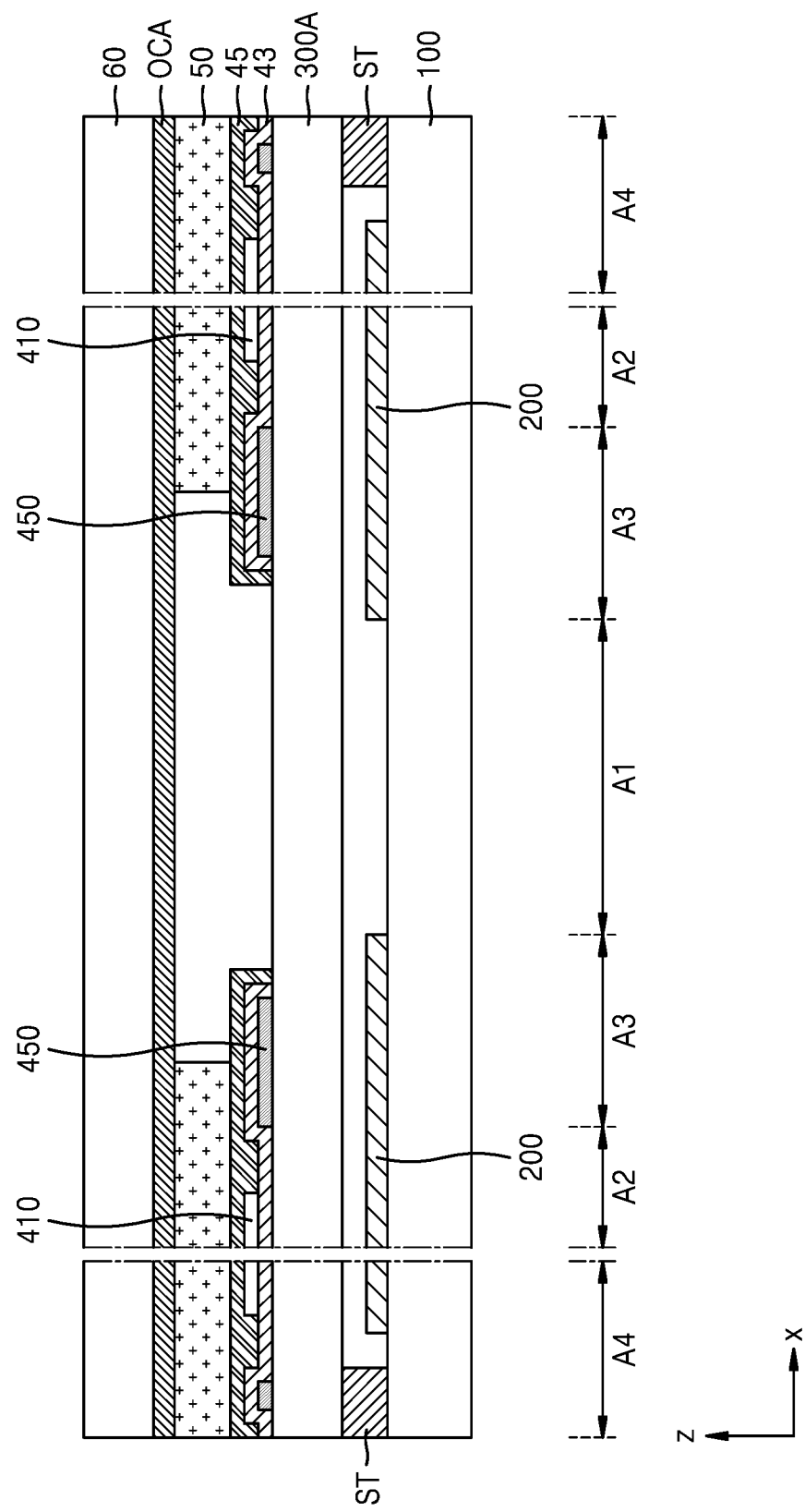

Referring to FIG. 16D, the window 60 may be attached to the optical functional section 50 by the transparent adhesive OCA arranged on a rear surface of the window 60. As shown in the exemplary embodiment of FIG. 16D, the transparent adhesive OCA may not include a hole corresponding to the first area A1 since the transparent adhesive OCA includes a material having a relatively high transmittance. Alternatively, the transparent adhesive OCA may have a hole corresponding to the first area A1.

Figure 17:
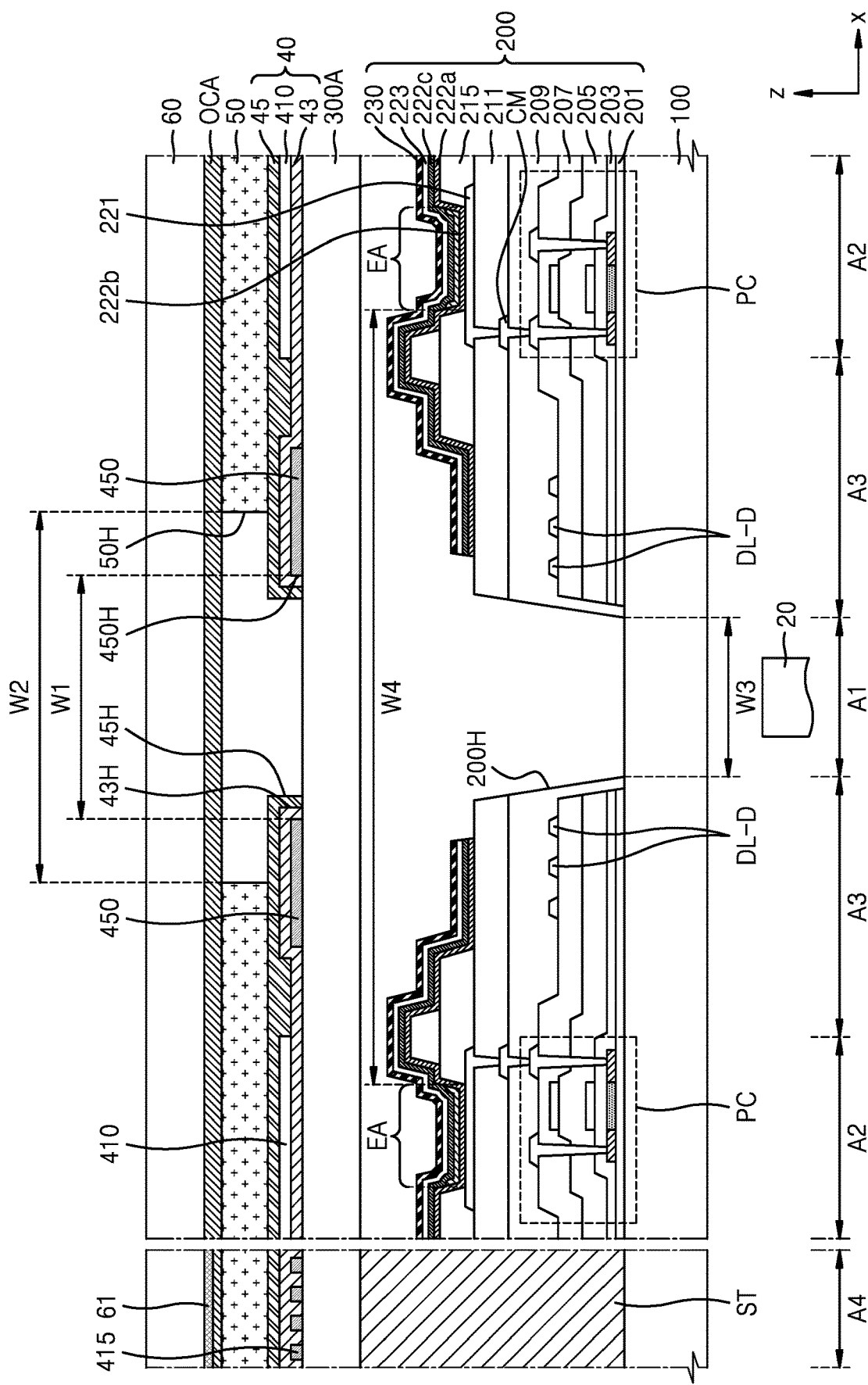
FIG. 17 is a cross-sectional view of a display device according to an exemplary embodiment of the present inventive concepts.

FIG. 17 is a cross-sectional view of a display device according to an exemplary embodiment of the present inventive concepts.

Referring to FIG. 17, the buffer layer 201, the gate insulating layer 203, the first interlayer insulating layer 205, the second interlayer insulating layer 207, the first organic insulating layer 209, and the second organic insulating layer 211 are arranged on the substrate 100. For example, as shown in the exemplary embodiment of FIG. 17, the buffer layer 201, the gate insulating layer 203, the first interlayer insulating layer 205, the second interlayer insulating layer 207, the first organic insulating layer 209, and the second organic insulating layer 211 may be consecutively stacked on each other (e.g., in the Z direction). Each pixel circuit PC may include a thin-film transistor and a storage capacitor, and a semiconductor layer and electrodes of the thin-film transistor and electrodes of the storage capacitor may be arranged on the aforementioned insulating layers.

The pixel electrode 221 may be connected to the contact metal CM via a contact hole of the second organic insulating layer 211, and the contact metal CM may be connected to the thin-film transistor of the pixel circuit PC via a contact hole of the first organic insulating layer 209. According to another exemplary embodiment, the contact metal CM may not be included on the substrate 100.

The pixel defining layer 215 arranged on the pixel electrode 221 may include an opening that overlaps the pixel electrode 221, and the opening of the pixel defining layer 215 may define a light-emission area. The light-emission area EA of FIG. 17 may corresponds to the light-emission area P-E of FIGS. 12A and 12B. The first functional layer 222a, the emission layer 222b, the second functional layer 222c, and the capping layer 230 may be sequentially stacked on the pixel defining layer 215 (e.g., in the Z direction). The materials and features of the display layer 200 arranged on the substrate 100 are the same as those described above with reference to FIG. 8.

The display device 1 may include the first area A1 between pixels, for example, light-emitting diodes each including a stack of the pixel electrode 221, the emission layer 222b, and the opposite electrode 223. The display layer 200 may include the fourth hole 200H located in the first area A1.

The fourth hole 200H may be formed by the through holes respectively formed in the insulating layers of the display layer 200 overlapping each other. The insulating layers of the display layer 200, for example, the buffer layer 201, the gate insulating layer 203, the first interlayer insulating layer 205, the second interlayer insulating layer 207, the first organic insulating layer 209, the second organic insulating layer 211, and the pixel defining layer 215, may include through holes located in the first area A1, respectively. The fourth hole 200H may be defined by an insulating layer defining a small hole from among the insulating layers of the display layer 200. For example, as shown in the exemplary embodiment of FIG. 17, the fourth hole 200H may be defined by a lateral surface of the first organic insulating layer 209.

Similar to the insulating layers of the display layer 200, the first functional layer 222a, the second functional layer 222c, the opposite electrode 223, and the capping layer 230 may respectively include holes formed by removing portions corresponding to the first area A1.

The encapsulation substrate 300A may be arranged to face the substrate 10. In the first area A1, the materials included in the display layer 200 are not arranged between the lower surface of the encapsulation substrate 300A and the upper surface of the substrate 10. For example, the upper surface of the substrate 100 may directly face the lower surface of the encapsulation substrate 300A in the first area A1 and there may not be any layers disposed therebetween.

In an exemplary embodiment, the encapsulation substrate 300A may include the same material as the substrate 100, and may have the same refractive index as the substrate 100. For example, each of the substrate 100 and the encapsulation substrate 300A may have a refractive index of about 1.3 to about 1.7, for example, a refractive index of about 1.5. However, exemplary embodiments of the present inventive concepts are not limited thereto.

The metal layer 450 may be arranged in the third area A3. The metal layer 450 may overlap (e.g., in the Z direction) respective third portions DL-D of a plurality of data lines arranged in the third area A3.

The metal layer 450 may directly contact the upper surface of the encapsulation substrate 300A. For example, a bottom portion of the metal layer 450 may be disposed directly on the upper surface of the encapsulation substrate 300A (e.g., in the Z direction). In an exemplary embodiment, the metal layer 450 may be formed in a process of forming the input sensing section 40, for example, a process of forming trace lines and first connecting electrodes. For example, FIG. 17 illustrates that the first trace lines 415 located in the fourth area A4 and the metal layer 450 are arranged directly on the upper surface of the encapsulation substrate 300A. At least one of the trace lines located in the fourth area A4, for example, the first trace lines 415, may overlap the sealant ST (e.g., in the Z direction).

The first insulating layer 43 formed of silicon nitride, silicon oxide, or silicon oxynitride may be arranged on the metal layer 450. For example, the first insulating layer 43 may be disposed directly on the metal layer 450 (e.g., in the Z direction). Sensing electrodes, such as the first sensing electrodes 410 and the second insulating layer 45 may be sequentially arranged on the first insulating layer 43 (e.g., in the Z direction). The first insulating layer 43 and the second insulating layer 45 may include a ninth hole 43H and a tenth hole 45H, respectively, located in the first area A1. End portions of the first insulating layer 43 defining the ninth hole 43H may cover an inner edge of the metal layer 450 (e.g., the edge adjacent to the first area A1 in the X direction), and end portions of the second insulating layer 45 defining the tenth hole 45H may cover the end portions of the first insulating layer 43. In exemplary embodiments, the first insulating layer 43 and the second insulating layer 45 may include the same material or may include different materials. Each of the first and second insulating layers 43 and 45 may include an inorganic insulative material or an organic insulative material.

The optical functional section 50 may be arranged to cover a portion of the metal layer 450, and the transparent adhesive OCA and the window 60 may be arranged on the optical functional section 50. A light-shielding unit 61 covering components arranged in the fourth area A4, such as the first trace lines 415, may be arranged on the rear surface of the window 60. In an exemplary embodiment, the light-shielding unit 61 covering a dead area may include a colored layer. For example, the light-shielding unit 61 may include layers of various colors such as white, black, silver, gold, and pink. In an exemplary embodiment, the light-shielding unit 61 may have a shape of a polygonal ring or frame surrounding the second area A2. For example, the light-shielding unit 61 may have a shape of an approximately quadrilateral ring or frame.

The second hole 50H of the optical functional section 50 may overlap the eighth hole 450H of the metal layer 450 (e.g., in the Z direction). In relation to an alignment error during an assembly process of a display device and/or the quality of an image captured by a camera due to the field of view of the camera when the component 20 is the camera, a first width W1 (e.g., length in the X direction and/or Y direction) of the eighth hole 45011 of the metal layer 450 may be less than a second width W2 of the second hole 50H of the optical functional section 50. The first width W1 of the eight hole 450H may be greater than a third width W3 of the fourth hole 200H of the display layer 200. The first, second, and third widths W1, W2, and W3 may be less than a distance between two adjacent pixels having the first area A1 therebetween, such as a distance W4 between the light-emission areas EA of the two adjacent pixels.

Although the exemplary embodiment of FIG. 17 includes the metal layer 450 arranged below the first insulating layer 43 (e.g., in the Z direction), exemplary embodiments of the present inventive concepts are not limited thereto. According to another exemplary embodiment, sensing electrodes including the first sensing electrodes 410, and second connecting electrodes may be arranged below the first insulating layer 43, trace lines may be arranged above the first insulating layer 43, and the metal layer 450 may be formed together when the trace lines are formed and thus may be arranged above the first insulating layer 43 (e.g., in the Z direction).

Figure 18:
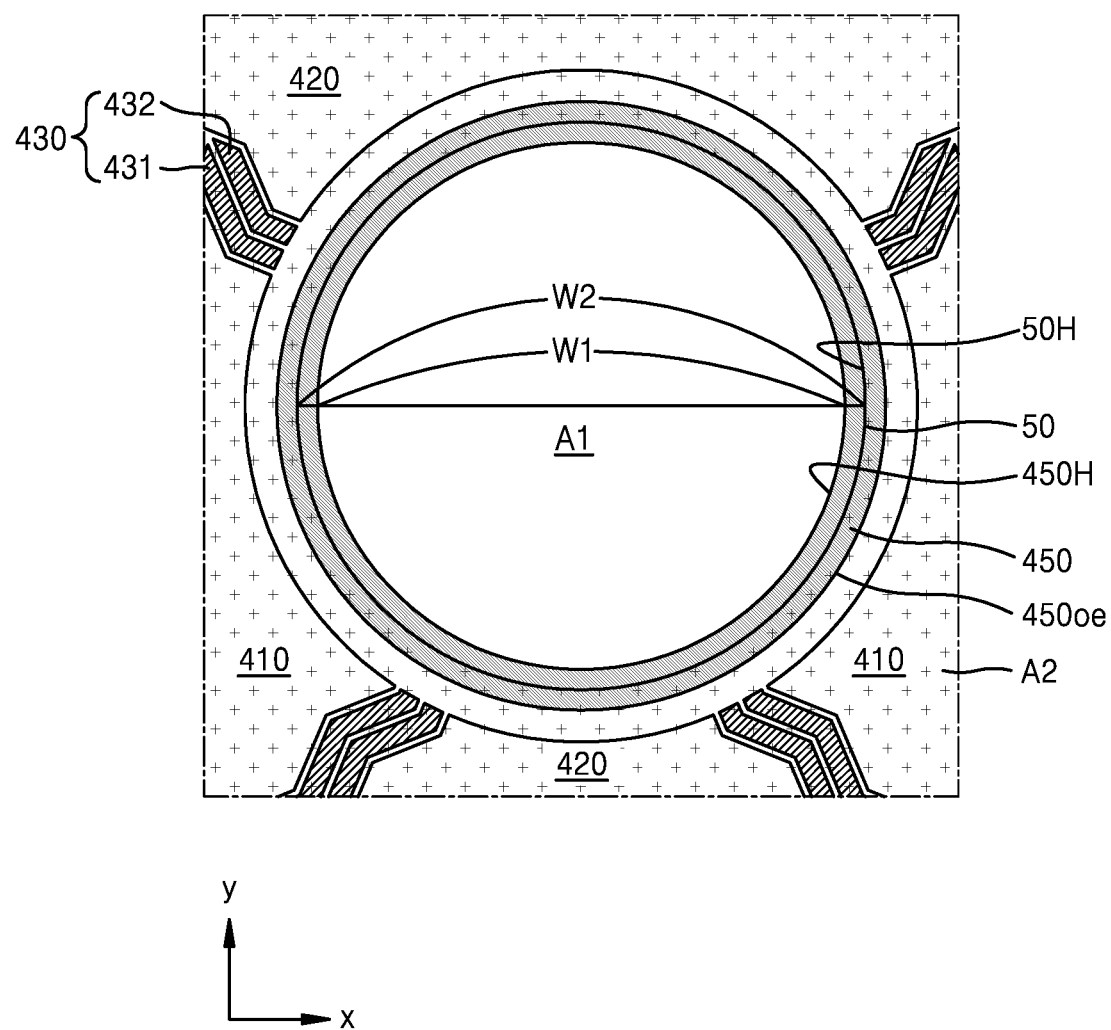
FIG. 18 is a top plan view of a portion of a display device according to an exemplary embodiment of the present inventive concepts.

FIG. 18 is a top plan view of a portion of a display device according to an exemplary embodiment of the present inventive concepts, and illustrates a relationship between a metal layer and an optical functional section.

Referring to FIG. 18, the second width W2 (e.g., length in the X direction) of the second hole 50H of the optical functional section 50 is formed to be greater than the first width W1 of the eighth hole 450H of the metal layer 450. Therefore, as shown in the exemplary embodiment of FIG. 18, the optical functional section 50 may cover a portion of the metal layer 450, for example, an external edge 450oe of the metal layer 450.

In an exemplary embodiment, in a plan view (e.g., from the Z direction), the optical functional section 50 may be arranged to cover the entire second area A2. For example, the optical functional section 50 may cover the first and second sensing electrodes 410 and 420 and the dummy electrodes 430.

Figure 19:
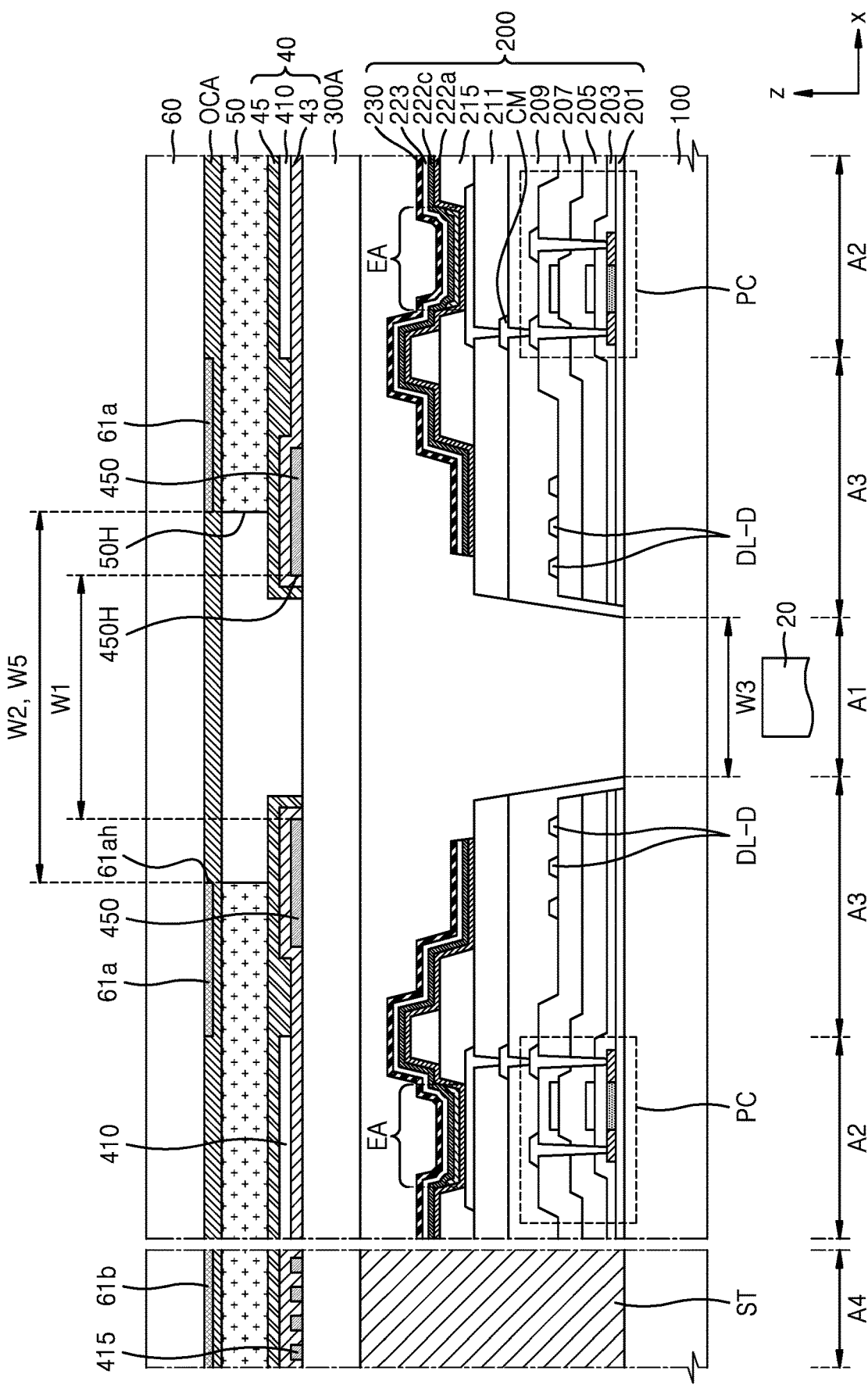
FIGS. 19 and 20 are cross-sectional views of a display device according to exemplary embodiments of the present inventive concepts.
Figure 20:
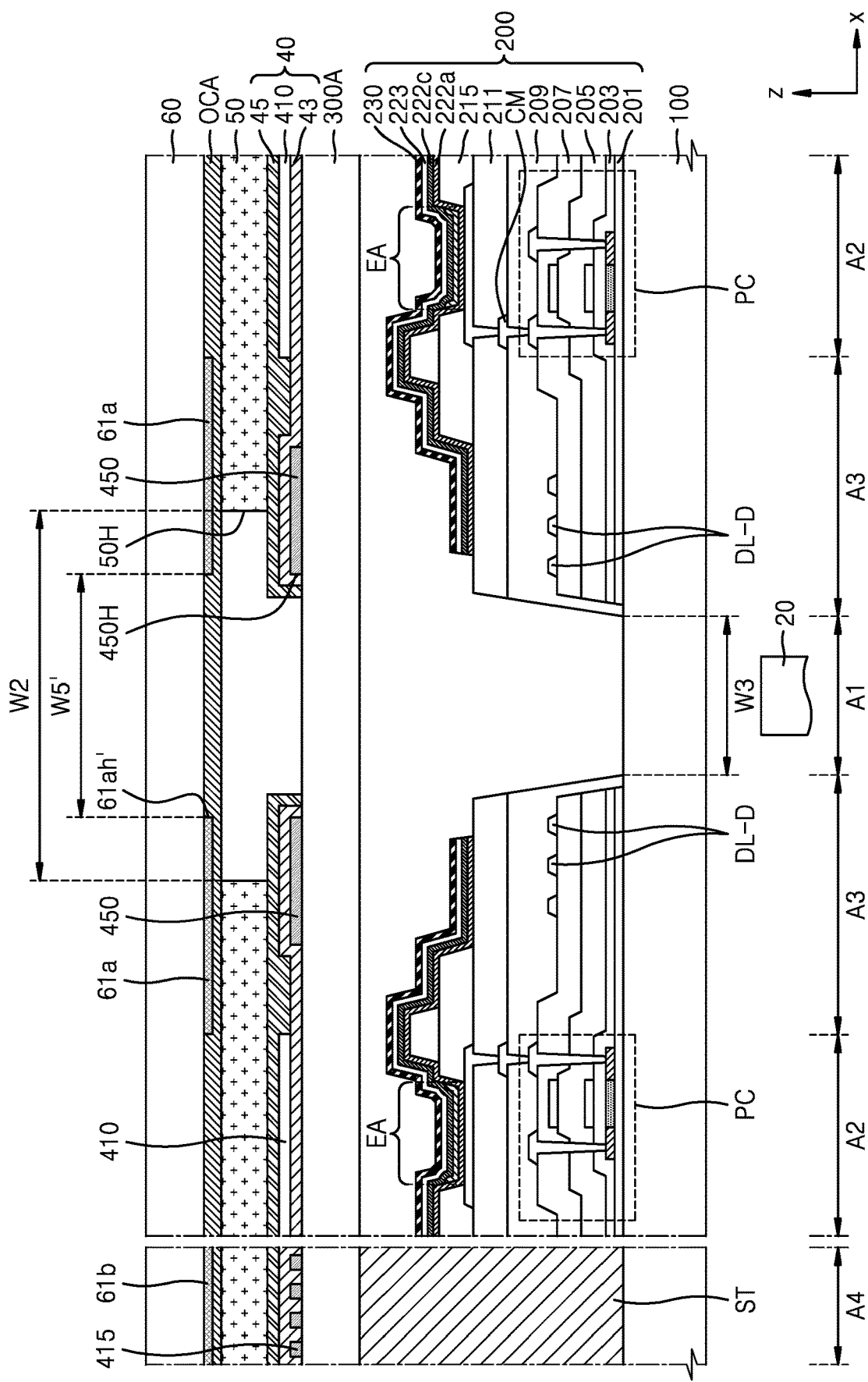

FIGS. 19 and 20 are schematic cross-sectional views of a display device according to an exemplary embodiment of the present inventive concepts.

Referring to FIGS. 19 and 20, as described above with reference to FIG. 17, the display layer 200 may be arranged on the substrate 100, and the display layer 200 may be covered by the encapsulation substrate 300A. The metal layer 450 and the input sensing section 40 may be arranged on the encapsulation substrate 300A, and the optical functional section 50 may be located on the input sensing section 40. A stacking structure from the substrate 100 to the optical functional section 50, and features according to the stacking structure are the same as those described above with reference to FIG. 17, and thus a difference therebetween will now be focused on and described.

A light-shielding unit may be arranged on the rear surface of the window 60. The light-shielding unit may include a first light-shielding unit 61a arranged in the third area A3, and a second light-shielding unit 61b arranged in the fourth area A4. In a plan view (e.g., as viewed from the Z direction), the first light-shielding unit 61a may have a shape of a ring surrounding the first area A1. The second light-shielding unit 61b may have a shape of a ring surrounding the second area A2. For example, the first light-shielding unit 61a may have a shape of a circular ring or frame surrounding the first area A1, and the second light-shielding unit 61b may have a shape of a polygonal ring or frame surrounding the second area A2. For example, the second light-shielding unit 61b may have a shape of an approximately quadrilateral ring or frame. However, exemplary embodiments of the present inventive concepts are not limited thereto and the first light-shielding unit 61a and the second light-shielding unit 61b may have various different shapes. The second light-shielding unit 61b may correspond to the light-shielding unit 61 of the fourth area A4 of FIG. 17.

The first light-shielding unit 61a and the second light-shielding unit 61b may be colored layers. The second light-shielding unit 61b and the first light-shielding unit 61a may have different colors. For example, in an exemplary embodiment, the first light-shielding unit 61a may have a black color, and the second light-shielding unit 61b may have various colors such as white, silver, gold, and pink.

In exemplary embodiments in which the component 20 includes a camera having a relatively narrow field of view or includes a sensor that is relatively free in terms of a field of view, the first light-shielding unit 61a as described above may be arranged on the rear surface of the window 60. The first light-shielding unit 61a formed to surround the first area A1 may include an eleventh hole 61ah located in the first area A1, and a fifth width W5 of the eleventh hole 61ah may be substantially equal to or greater than the second width W2 of the optical functional section 50 as shown in FIG. 19. Alternatively, as shown in FIG. 20, a fifth width W5' of an eleventh hole 61ah' may be substantially equal to or greater than the first width W1 of the eighth hole 450H of the metal layer 450.

Figure 21:
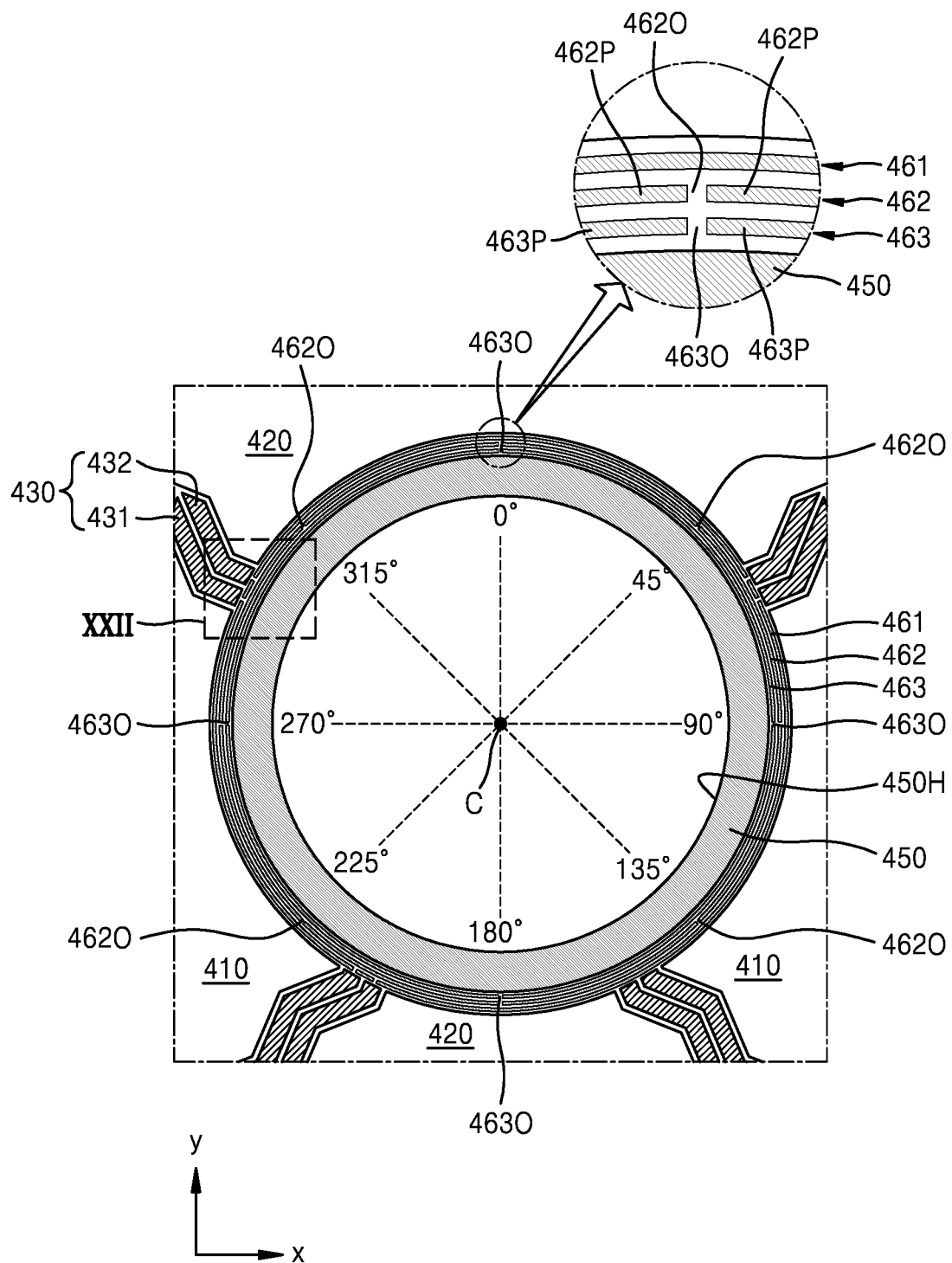
FIG. 21 is a top plan view and magnified view of a portion of a display device according to an exemplary embodiment of the present inventive concepts.
Figure 22:
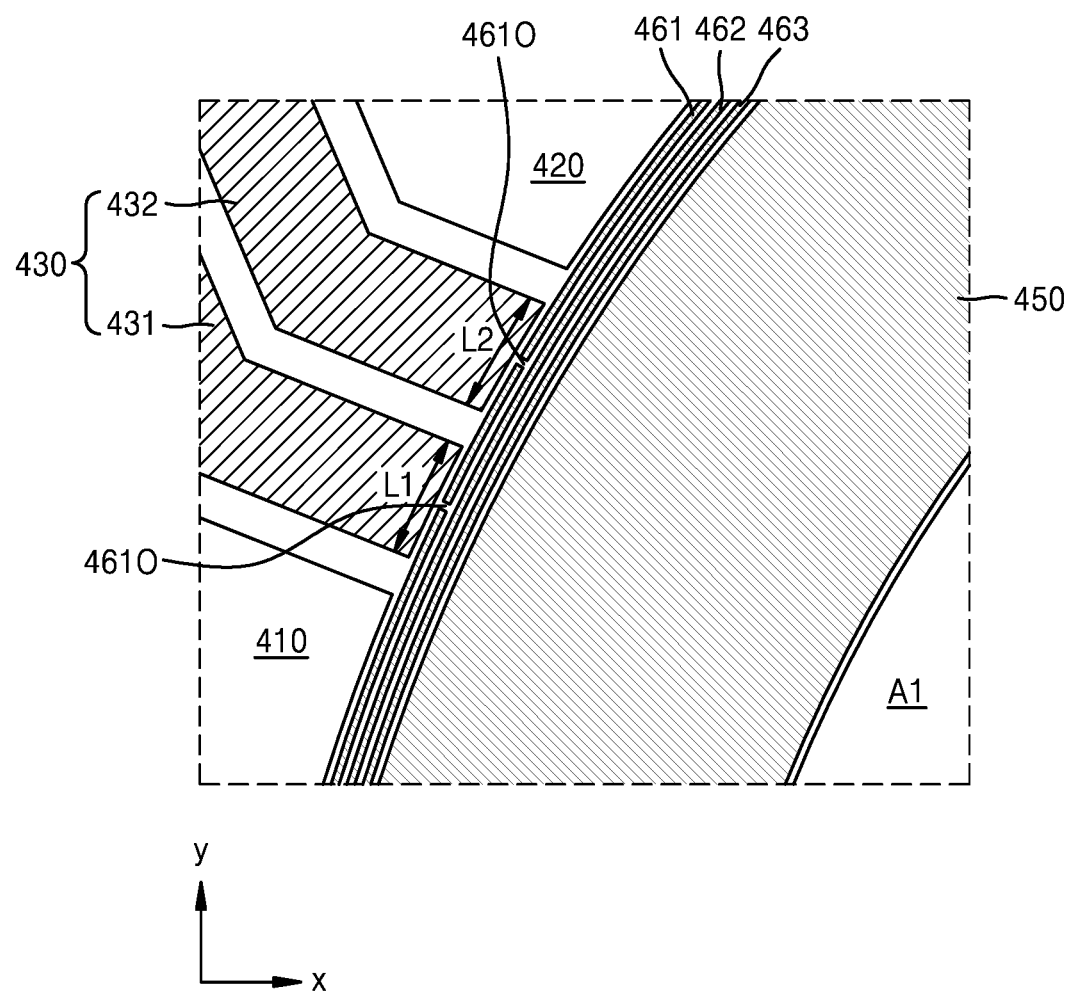
FIG. 22 is a magnified view of portion XXII of FIG. 21.

FIG. 21 is a top plan view of a portion of a display device according to an exemplary embodiment of the present inventive concepts, and FIG. 22 is a magnified plan view of a portion XXII of FIG. 21 according to an exemplary embodiment of the present inventive concepts.

Referring to FIG. 21, the display device may include one or more lines each extending on the periphery of the metal layer 450 in the third area A3. The one or more lines are configured to prevent damage to the input sensing section 40 due to electro-static discharge (ESD) that may flow in through the metal layer 450, and thus may be arranged outside the metal layer 450. The exemplary embodiment of FIG. 21 illustrates a first line 461, a second line 462, and a third line 463 located between the metal layer 450 and the first and second sensing electrodes 410 and 420 (e.g., in the X direction and/or Y direction) in the second area A2.

Each of the first line 461, the second line 462, and the third line 463 may have a shape of a ring having a smaller width (e.g., length in the X direction) than a width W0 of the metal layer 450. The first line 461, the second line 462, and the third line 463 may be spaced apart from one another. In an exemplary embodiment, each of the first line 461, the second line 462, and the third line 463 may include a conductive material.

Each of the first line 461, the second line 462, and the third line 463 may include an opening. According to an exemplary embodiment, referring to the magnified view on the upper side of FIG. 21, the third line 463 may include third material portions 463P spaced apart from each other with third opening portions 463O therebetween. In an exemplary embodiment, the third material portions 463P may include a conductive material, such as metal. Similarly, the second line 462 may include second material portions 462P spaced apart from each other with second opening portions 4620 therebetween. The second material portions 462P may include a conductive material, such as metal.

The third line 463 may include a plurality of third opening portions 4630. In an exemplary embodiment, third opening portions 4630 may be arranged at locations of 0°, 90°, 180°, and 270 with respect to a center C of the first area A1, and the third line 463 may include four third material portions 463P. However, exemplary embodiments of the present inventive concepts are not limited thereto and the third opening portions 4630 may be arranged at various different intervals or may be arranged at random intervals.

The second line 462 may include a plurality of second opening portions 4620. According to an exemplary embodiment, second opening portions 4620 may be arranged at locations of 0°, 45°, 90° 135° 180°, 225°, 270°, and 315° with respect to the center C of the first area A1, and accordingly the second line 462 may include eight second material portions 462P. However, exemplary embodiments of the present inventive concepts are not limited thereto.

In an exemplary embodiment, the third line 463 relatively close to the metal layer 450 (e.g., in the X direction and/or Y direction) may include a smaller number of material portions than the second line 462 that is relatively far from the metal layer 450, and the area of each of the second material portions 462P may be less than the area of each of the third material portions 463P. The area of a material portion included in the metal layer 450 may decrease in a direction away from the metal layer 450, such that the material portion may have a smaller charge amount in the direction away from the metal layer 450.

The first line 461 may also include an opening portion, and the opening portion of the first line 461 may be formed at a different location from the second opening portions 4620 and the third opening portions 4630.

Referring to FIG. 22, first opening portions 4610 of the first line 461 may be arranged adjacent to a dummy electrode 430 (e.g., immediately adjacent in the X and/or Y directions). For example, the first opening portions 4610 may be arranged adjacent to a first dummy electrode 431 and a second dummy electrode 432, respectively. In an exemplary embodiment, one first opening portion 4610 may be arranged adjacent to a center of a first width L1 of the first dummy electrode 431, and another first opening portion 4610 may be arranged adjacent to a center of a second width L2 of the second dummy electrode 432.

Since the display device includes the first line 461, the second line 462, and the third line 463 described above with reference to FIGS. 21 and 22, even when ESD flows in via the metal layer 450, the ESD may travel from the third line 463 to the second line 462. As the ESD travels from the third material portions 463P to the second material portions 462P having relatively smaller areas than the third material portions 463P, the quantity of electric change of the ESD may decrease. As the ESD travels toward the first line 461 via the second line 462, since the first opening portions 4610 are arranged adjacent to the dummy electrode 430, damage due to the ESD may be directed on the dummy electrode 430. Accordingly, damage to the first and second sensing electrodes 410 and 420 may be prevented.

Figure 23:
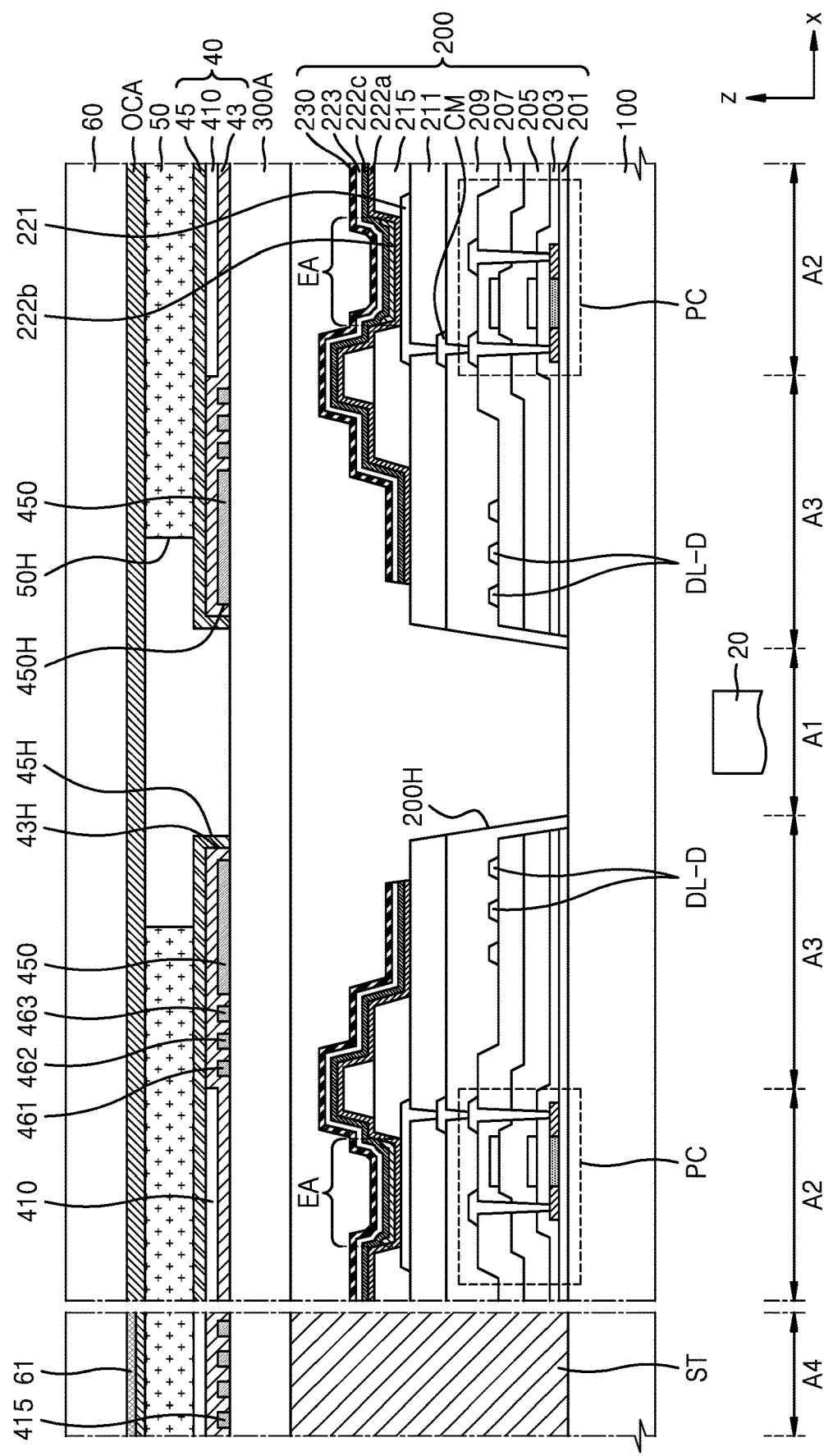
FIG. 23 is a cross-sectional view of a display device according to an exemplary embodiment of the present inventive concepts.

FIG. 23 is a schematic cross-sectional view of a display device according to exemplary embodiments of the present inventive concepts.

Referring to FIG. 23, the first line 461, the second line 462, and the third line 463 may be further arranged in the third area A3. The first line 461, the second line 462, and the third line 463 may be arranged on the same layer as the layer on which the metal layer 450 and/or the trace lines 415 are arranged. For example, the first line 461, the second line 462, the third line 463, the metal layer 450, and the trace lines 415 may be located on the encapsulation substrate 300A and may include the same material. For example, as shown in the exemplary embodiment of FIG. 23, bottom surfaces of the first line 461, the second line 462, the third line 463, the metal layer 450, and the trace lines 415 may directly contact top surfaces of the encapsulation substrate 300A.

In the exemplary embodiment of FIG. 23, the first line 461, the second line 462, and the third line 463, and the metal layer 450 are arranged below the first insulating layer 43 in FIG. 23. However, exemplary embodiments of the present inventive concepts are not limited thereto. For example, in another exemplary embodiment, sensing electrodes including the first sensing electrodes 410, and second connecting electrodes may be arranged below the first insulating layer 43, and the first line 461, the second line 462, the third line 463, the metal layer 450, and the trace lines 415 may be arranged above the first insulating layer 43.

Structures other than the first line 461, the second line 462, and the third line 463, and features of the other structures are the same as the structures described above with reference to FIG. 17, and thus redundant descriptions thereof will be omitted.

FIGS. 24A through 24F are magnified top plan views of a portion of a display device, according to embodiments.

Figure 24A:
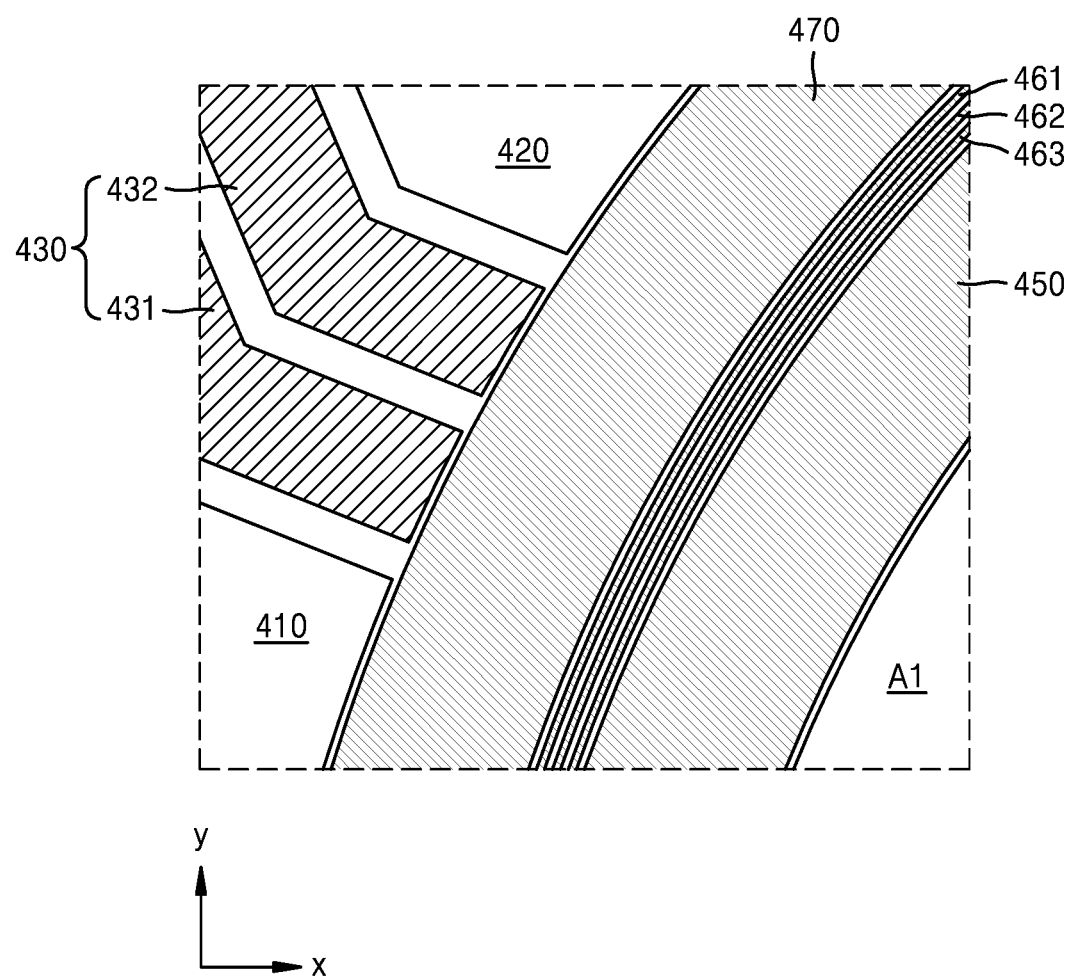
FIGS. 24A through 24F are top plan views of a portion of a display device, according to exemplary embodiments of the present inventive concepts.

Referring to FIG. 24A, the metal layer 450, the third line 463, the second line 462, and the first line 461 may be arranged around the first area A1. The metal layer 450, the third line 463, the second line 462, and the first line 461 may include the same features as described above with reference to FIGS. 21 and 22. However, as shown in the exemplary embodiment of FIG. 24A, each of the first line 461, the second line 462, and the third line 463 may not include any openings. As shown in FIG. 24A, a peripheral metal layer 470 may be further arranged around the first area A). The peripheral metal layer 470 may be arranged on the same layer as the layer on which the metal layer 450, the third line 463, the second line 462, and the first line 461 are arranged, and may include the same material as the material included in the metal layer 450, the third line 463, the second line 462, and the first line 461. The peripheral metal layer 470 may be in a floating state, similar to the metal layer 450. Alternatively, the peripheral metal layer 470 may be electrically connected to adjacent sensing electrodes. In this embodiment, the peripheral metal layer 470 may function as an auxiliary sensing electrode or as a connecting electrode that connects sensing electrodes to each other.

Figure 24B:
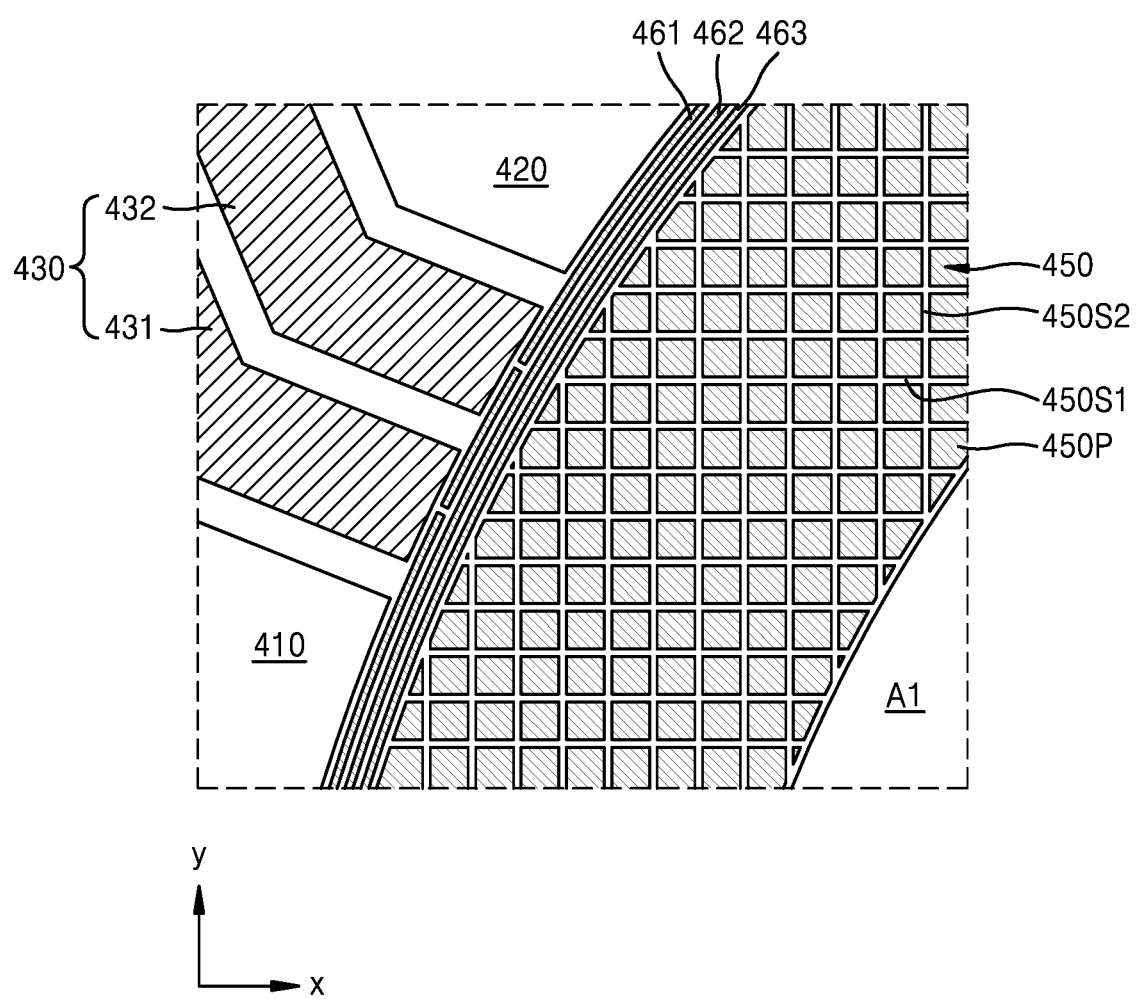
Figure 24C:
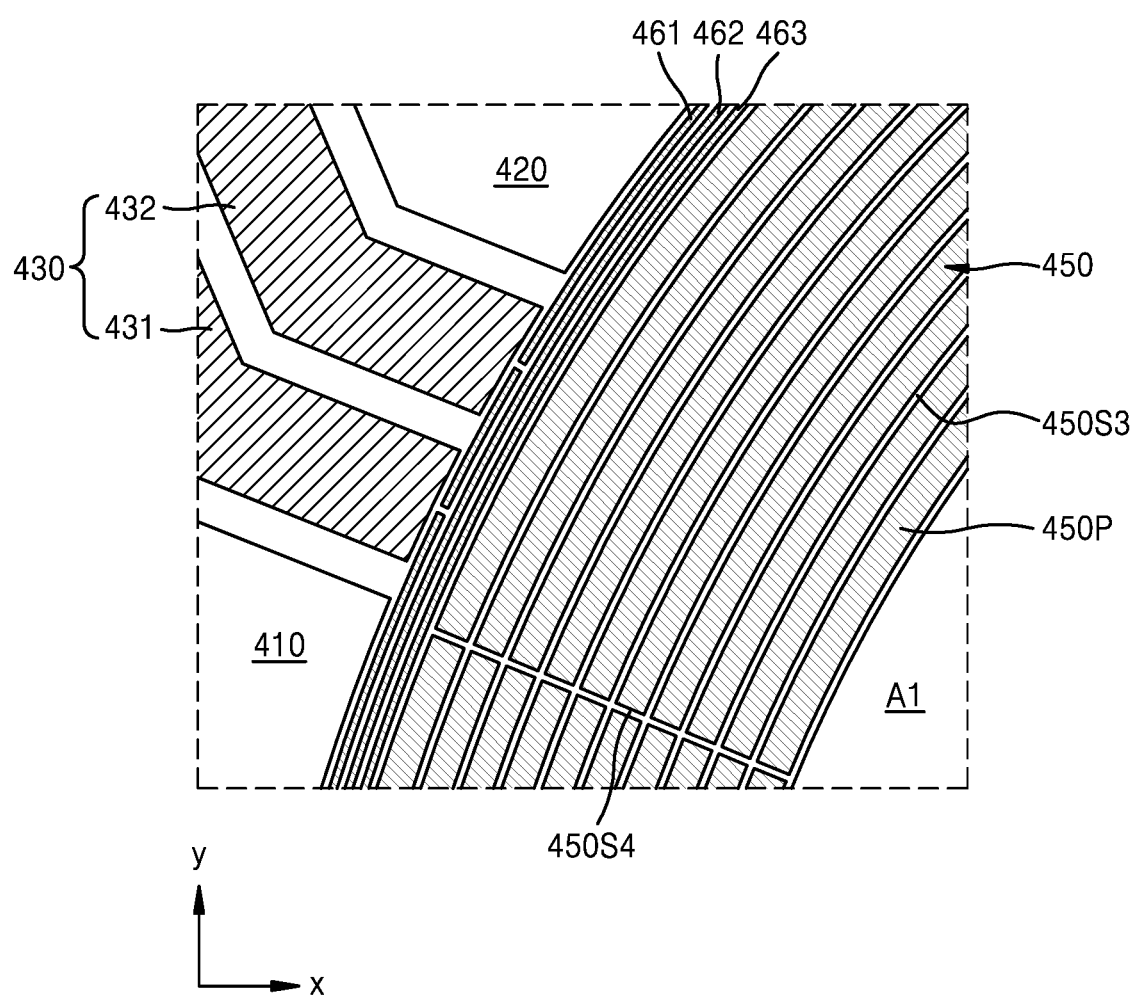

According to other exemplary embodiments, referring to FIGS. 248 and 24C, the metal layer 450, the third line 463, the second line 462, and the first line 461 may be arranged in the third area A3 and surround the first area A1. Detailed structures of the third line 463, the second line 462, and the first line 461 may be the same as described above with reference to FIGS. 21 and 22.

The metal layer 450 may include a plurality of material portions 450P spaced apart from each other by a plurality of slit lines. For example, as shown in FIG. 24B, the metal layer 450 may include a plurality of material portions 450P patterned by first slit lines 450S1 and second slit lines 450S2 that intersect each other. The first slit lines 450S1 may each extend in the X direction, and the second slit lines 450S2 may each extend in the Y direction. The plurality of material portions 450P may be arranged to be spaced apart from each other in column and row directions. However, exemplary embodiments of the present inventive concepts are not limited to this particular arrangement of first and second slit lines. In other exemplary embodiments, the slit lines may have various different arrangements.

For example, as shown in FIG. 24C, the metal layer 450 may include third slit lines 450S3 each extending in a circumferential direction of the first area A1, and fourth slit lines 450S4 intersecting the third slit lines 450S3. The metal layer 450 may include the plurality of material portions 450P due to the third slit lines 450S3 and the fourth slit lines 450S4.

Figure 24D:
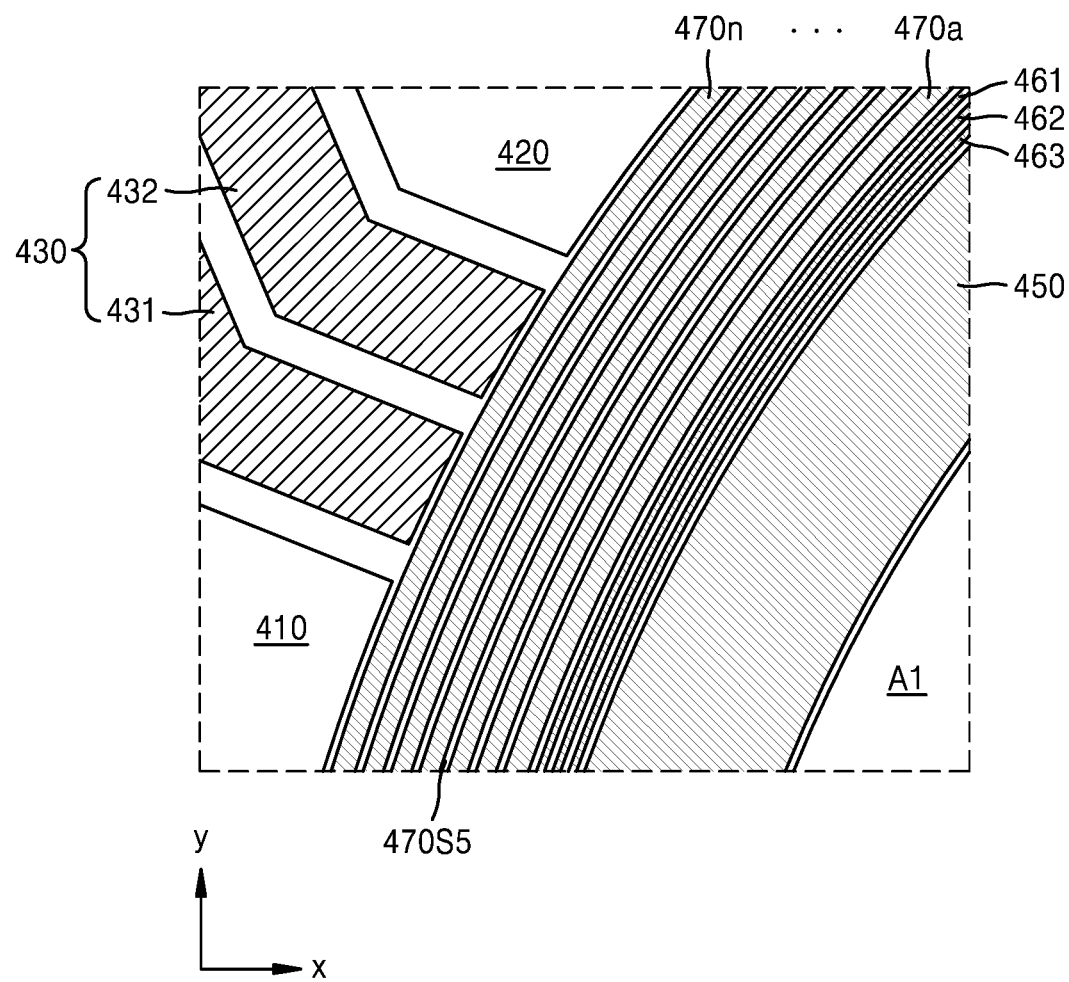

According to another exemplary embodiment, referring to FIG. 24D, the metal layer 450, the third line 463, the second line 462, and the first line 461 may be arranged around the first area A1. The metal layer 450, the third line 463, the second line 462, and the first line 461 may include the same features as described above with reference to FIGS. 21 and 22. However, as shown in the exemplary embodiment of FIG. 24D, each of the first line 463, the second line 462, and the third line 461 may not include any openings. A peripheral metal layer 470 may be further arranged around the first area A1. The peripheral metal layer 470 may include a plurality of portions 470a through 470n separated from each other by fifth slit lines 470S5. The plurality of portions 470a, . . . , and 470n may each extend in a circumferential direction to surround the first area A1.

Figure 24E:
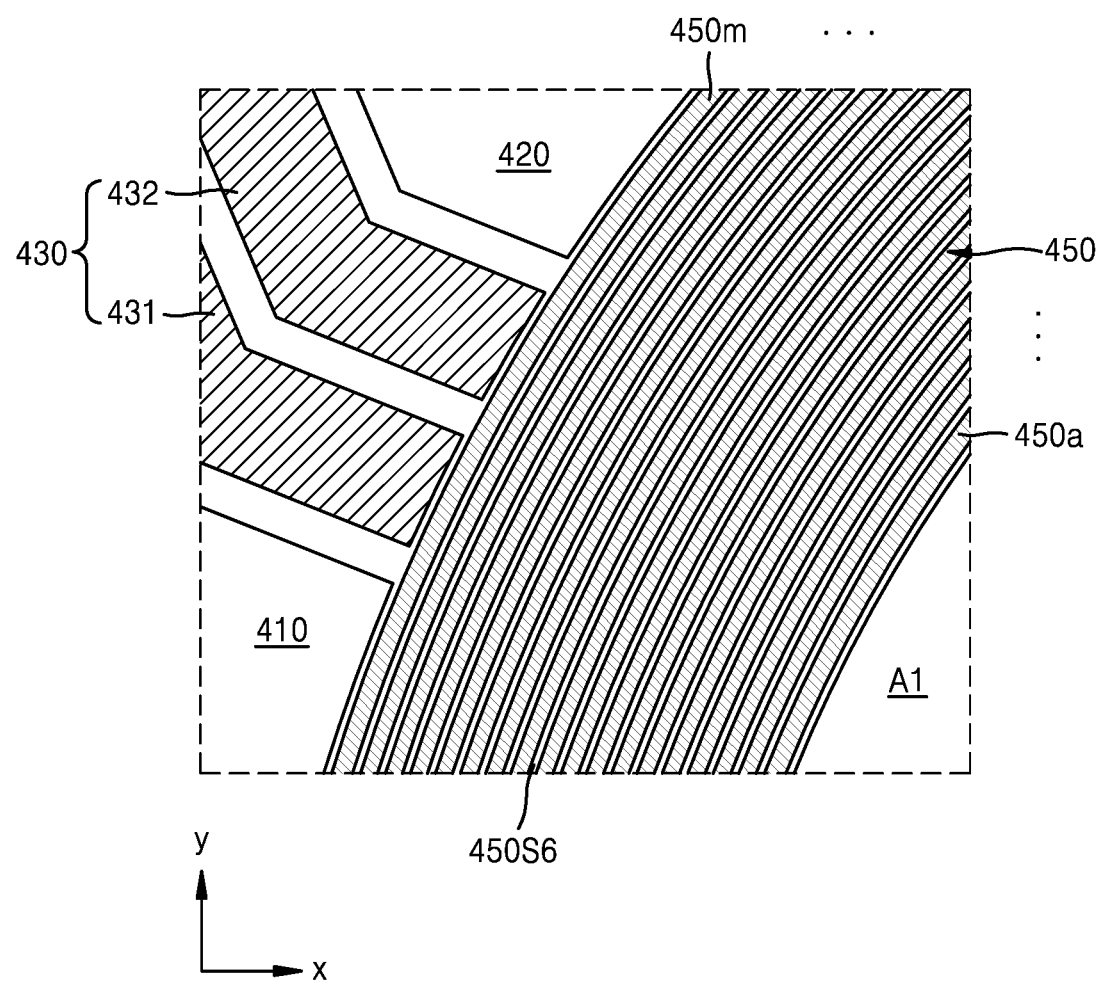

According to the exemplary embodiment of FIG. 24E, a metal layer 450 may be arranged around the first area A1, and the metal layer 450 may include a plurality of portions 450a through 450m separated from each other by sixth slit lines 450S6. The plurality of portions 450a through 450m may each extend in a circumferential direction to surround the first area A.

Figure 24F:
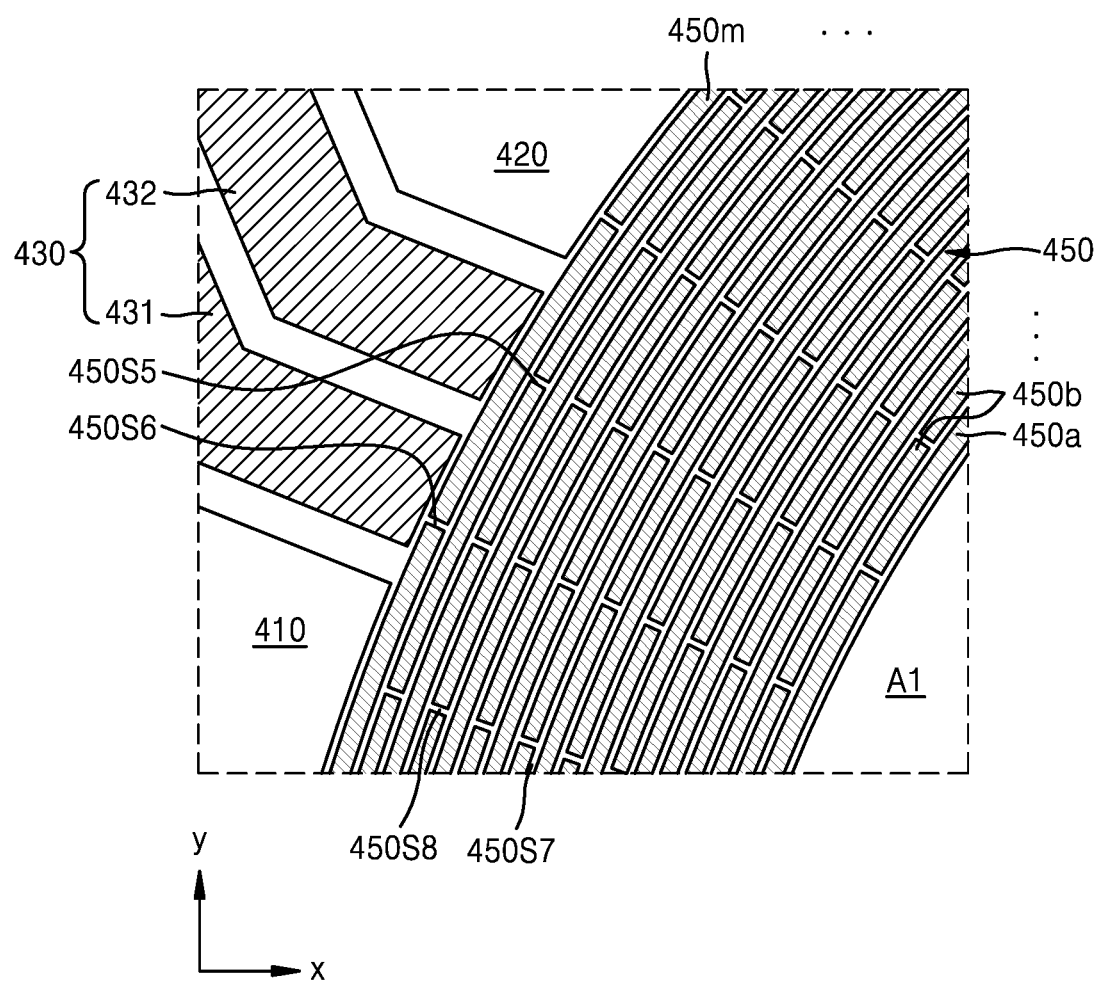

According to the exemplary embodiment of FIG. 24F, a metal layer 450 may be arranged around the first area A1, and the metal layer 450 may include a plurality of portions 450a through 450m separated from each other by seventh slit lines 450S7 and eighth slit lines 450S8. The seventh slit lines 450S7 may each extend in a circumferential direction to surround the first area A1. The eighth slit lines 450S8 may each extend to intersect the seventh slit lines 450S7. Each of the eighth slit lines 450S8 may not extend continuously, but may extend discontinuously such that portions of each eighth slit line 450S8 alternate with each other. Accordingly, a first material portion 450a of the metal layer 450 may overlap two adjacent second material portions 450b arranged outside the first material portion 450a, and an eighth slit line 450S8 between the two adjacent second material portions 450b may overlap the first material portion 450a.

Figure 25:
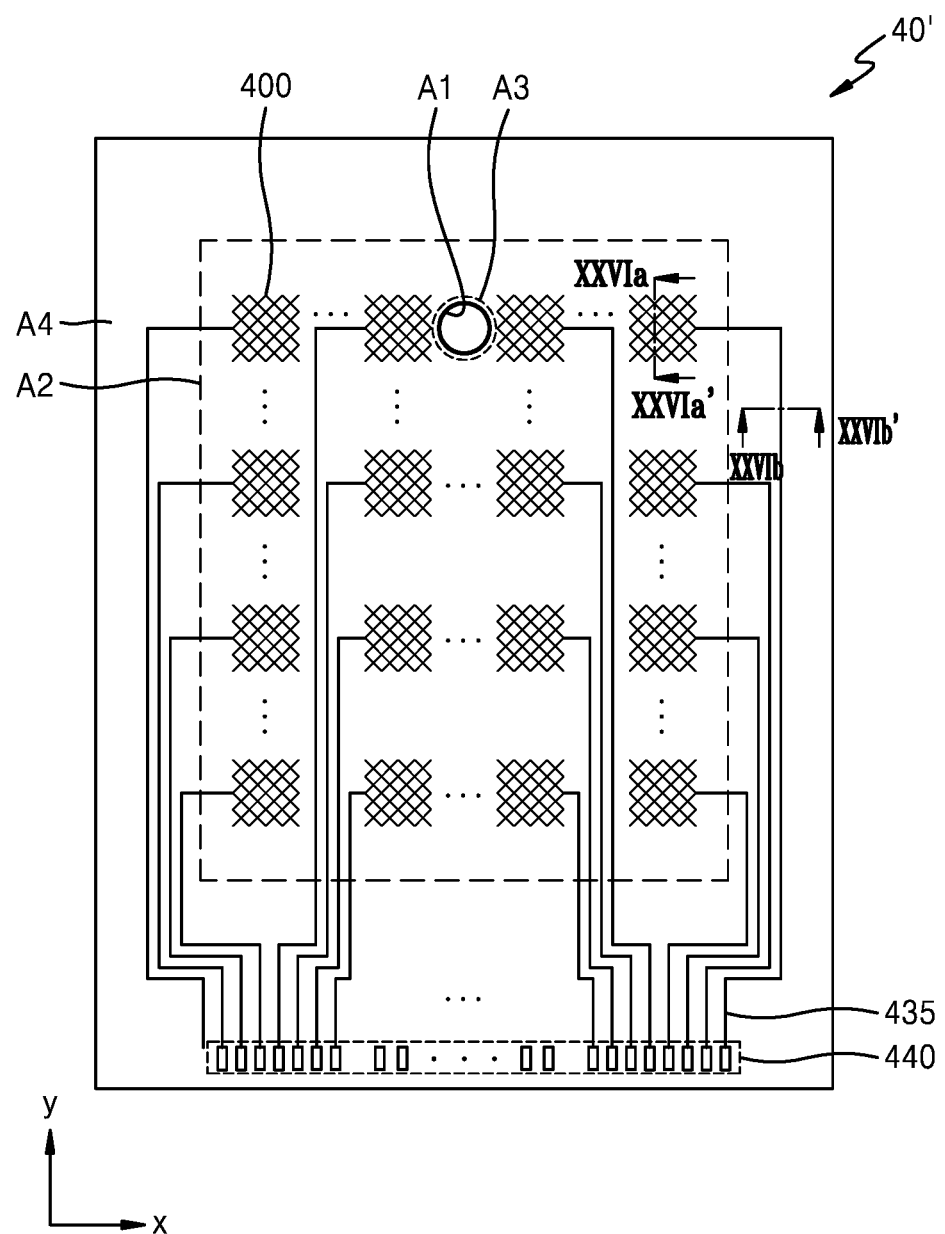
FIG. 25 is a top plan view of an input sensing section of a display device according to an exemplary embodiment of the present inventive concepts.

FIG. 25 is a top plan view of an input sensing section 40' of a display device according to an exemplary embodiment of the present inventive concepts.

Referring to FIG. 25, the input sensing section 40' may include a plurality of sensing electrodes 400 and a plurality of trace lines 435. The plurality of sensing electrodes 400 may be arranged in the second area A2 and each have unique coordinate information.

For example, as shown in the exemplary embodiment of FIG. 25, the plurality of sensing electrodes 400 may be arranged in, for example, a matrix shape. The plurality of sensing electrodes 400 may be arranged around the first area A1, and may be connected to the trace lines 435, respectively. Some of the trace lines 435 may be arranged in the second area A2, and others thereof may be arranged in the fourth area A4. In an exemplary embodiment, the plurality of sensing electrodes 400 may obtain coordinate information according to a self cap method or mutual cap method. Each of the sensing electrodes 400 may have a mesh structure.

Figure 26:
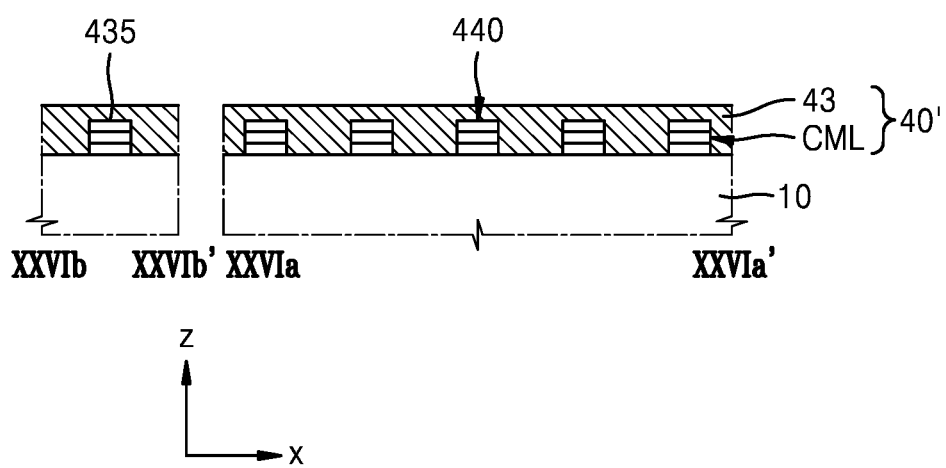
FIG. 26 is a cross-sectional view of an input sensing section of a display device taken along lines XXVIb-XXVIb' and XXVIa-XXVIa' of FIG. 25 according to an exemplary embodiment of the present inventive concepts.

FIG. 26 is a cross-sectional view of the input sensing section 40' according to an exemplary embodiments of the present inventive concepts, and illustrate cross-sections taken along lines XXVIa-XXVIa' and XXVIb-XXVIb' of FIG. 25.

Referring to FIG. 26, the input sensing section 40' may be arranged on the display panel 10, and may include the conductive layer CML including the sensing electrodes 400 and the first insulating layer 43 covering the conductive layer CML. The conductive layer CML may include the sensing electrodes 400 and the trace lines 435. For example, the sensing electrodes 400 and the trace lines 435 may be formed together in the same process and may include the same material.

In an exemplary embodiment, the conductive layer CML, for example, the sensing electrodes 400 and the trace lines 435, may include at least one compound selected from Mo, Mg, Ag, Ti, Cu, Al, or an alloy thereof. For example, the conductive layer CML may comprises a three-layered structure, e.g., Al/Ti/Al. The first insulating layer 43 may include an organic insulating material or/and an inorganic insulating material.

Figure 27:
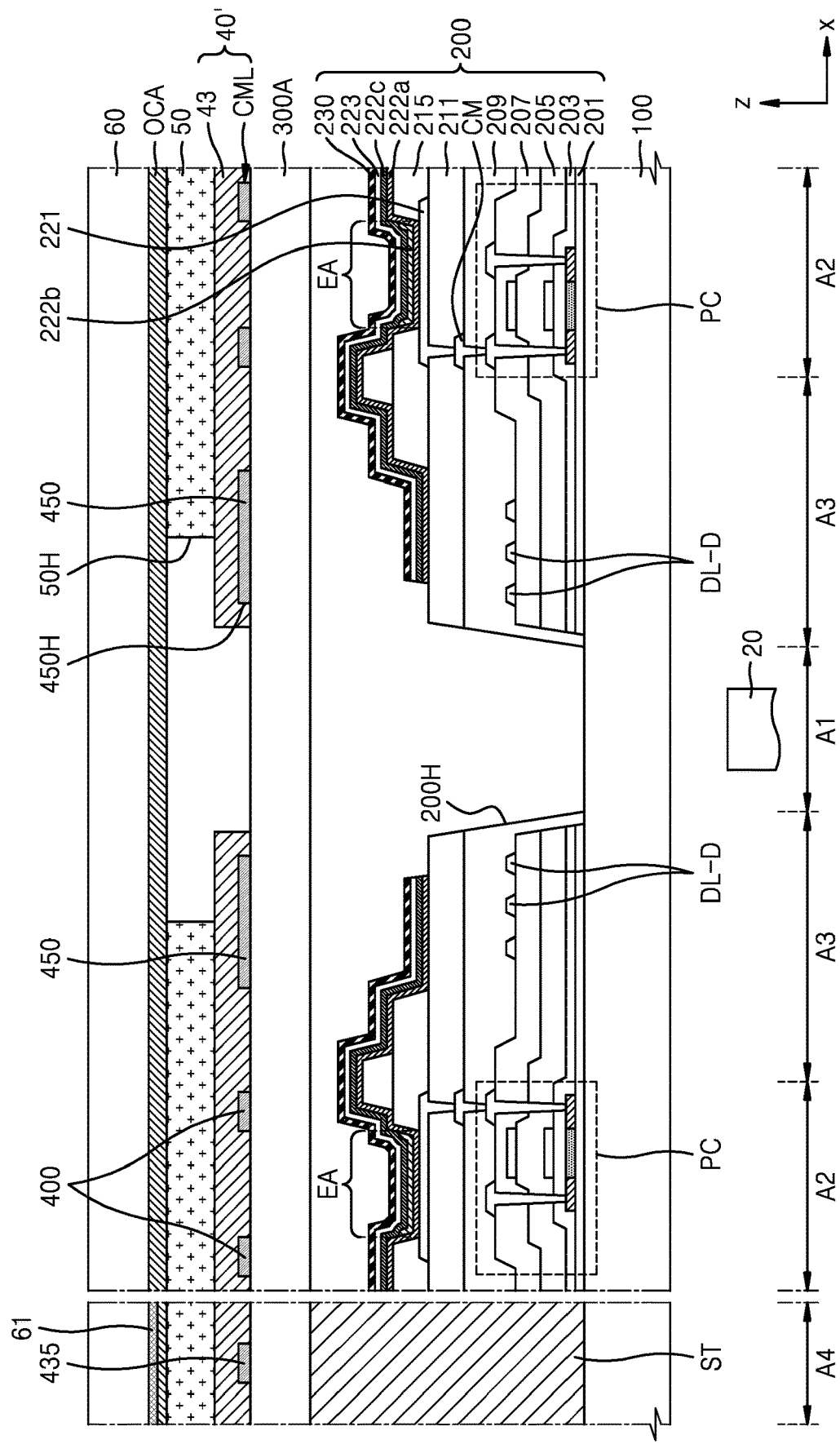
FIG. 27 is a cross-sectional view of a display device according to an exemplary embodiment of the present inventive concepts.

FIG. 27 is a schematic cross-sectional view of a display device according to an exemplary embodiment of the present inventive concepts.

Referring to FIG. 27, the input sensing section 40' on the encapsulation substrate 300A may include the sensing electrodes 400 and the trace lines 435. The sensing electrodes 400 and the trace lines 435 may be formed on the same layer and may include the same material. According to an exemplary embodiment, the sensing electrodes 400 and the trace lines 435 may be arranged on the encapsulation substrate 300A. For example, a bottom surface of the sensing electrodes 400 and the trace lines 435 may directly contact a top surface of the encapsulation substrate 300A.

Since the input sensing section 40' includes a single conductive layer in contrast with the input sensing section 40 described above with reference to FIG. 10 as including two conductive layers, the input sensing section 40' may have a reduced thickness.

The optical functional section 50 may be arranged on the input sensing section 40'. For example, a bottom surface of the optical functional section 50 may directly contact a top surface of the input sensing section 40'. In an exemplary embodiment, the metal layer 450 may be arranged in the third area A3 by taking into account an alignment margin capable of occurring during assembly of the optical functional section 50 including the second hole 50H and/or a field-of-view restriction capable of occurring when the component 20 is a camera. The second hole 50H of the optical functional section 50 may be formed to be larger than the eighth hole 450H of the metal layer 450 so that the optical functional section 50 covers a portion of the metal layer 450.

The metal layer 450 may also be formed in a process of forming the input sensing section 40', for example, a process of forming the sensing electrodes 400 and the trace lines 435. The metal layer 450 may be arranged on the same layer as the layer on which the sensing electrodes 400 and the trace lines 435 are arranged, and may include the same material as that included in the sensing electrodes 400 and the trace lines 435.

Other structural features are the same as described above with reference to FIG. 17, and thus redundant descriptions thereof will be omitted.

In FIG. 27, the encapsulation substrate 300A is illustrated as an encapsulation member. However, in another exemplary embodiment, the encapsulation member may include a thin-film encapsulation layer including at least one inorganic encapsulation layer and at least one organic encapsulation layer as described above with reference to FIG. 4A and the like.

Display devices according to exemplary embodiments of the present inventive concepts may protect a light-emitting device from external light and may prevent the light-emitting device from being damaged due to electro-static discharge. These effects are only examples, and the scope of the disclosure is not limited thereto.

It should be understood that exemplary embodiments described herein should be considered in a descriptive sense only and not for purposes of limitation. Descriptions of features or aspects within each exemplary embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display device comprising:
a display panel comprising two pixels spaced apart from each other and a transmission area between the two pixels;
an input sensing section disposed on the display panel and comprising sensing electrodes and trace lines electrically connected to the sensing electrodes;
a metal layer on the display panel, the metal layer disposed between the two pixels and surrounding the transmission area, the metal layer does not overlap the two pixels the metal layer comprising a first hole located in the transmission area, the first hole having a first width; and
an optical functional section on the metal layer, the optical functional section comprising a second hole that overlaps the first hole, the second hole having a second width that is greater than the first width.

2. The display device of claim 1, wherein the optical functional section covers only a partial portion of the metal layer.

3. The display device of claim 1, wherein the optical functional section comprises at least one optical device selected from a polarizer, a retarder, a destructive interference structure, or a structure of a color filter and a black matrix.

4. The display device of claim 1, wherein the metal layer comprises a material that is the same as a material of the trace lines.

5. The display device of claim 1, wherein the metal layer comprises at least one compound selected from molybdenum (Mo), magnesium (Mg), silver (Ag), titanium (Ti), copper (Cu), aluminum (Al), and an alloy of these materials.

6. The display device of claim 1, further comprising at least one line arranged outside the metal layer.

7. The display device of claim 6, wherein the at least one line comprises a plurality of material portions spaced apart from each other with an opening portion between the plurality of material portions, the material portions arranged along an outer edge of the metal layer.

8. The display device of claim 6, wherein the at least one line comprises:

a first line comprising a plurality of first material portions spaced apart from each other with at least one first opening portion between the plurality of first material portions, the first material portions arranged along an outer edge of the metal layer; and
a second line arranged along the outer edge of the metal layer and spaced apart from the first line, the second line comprising a plurality of second material portions spaced apart from each other and at least one second opening portion between the plurality of second material portions.

9. The display device of claim 8, wherein:
the at least one first opening portion overlaps one of the plurality of second material portions in a radial direction away from a center of the transmission area, and
the at least one second opening portion overlaps one of the plurality of first material portions in the radial direction away from the center of the transmission area.

10. The display device of claim 8, further comprising:
a dummy electrode located between adjacent sensing electrodes,
wherein the at least one first opening portion or the at least one second opening portion is adjacent to the dummy electrode.

11. The display device of claim 1, wherein the display panel further comprises:
a substrate;
a display layer on the substrate and comprising the two pixels; and
an encapsulation substrate on the display layer.

12. The display device of claim 11, wherein:
the display layer comprises a hole corresponding to the transmission area; and
an upper surface of the substrate and a lower surface of the encapsulation substrate face each other through the hole of the display layer.

13. The display device of claim 1, wherein the metal layer comprises a plurality of material portions spaced apart from each other.

14. The display device of claim 1, further comprising:
a window on the optical functional section; and
a transparent adhesive layer between the optical functional section and the window.

15. The display device of claim 14, wherein the window comprises a light-shielding unit that overlaps a portion of the metal layer.

16. A display device comprising:
a display panel comprising two pixels spaced apart from each other and a first area between the two pixels;
an input sensing section on the display panel and comprising sensing electrodes and trace lines electrically connected to the sensing electrodes; and
a metal layer on the display panel, the metal layer is configured to reflect external light in a direction away from the display panel, the metal layer is disposed between the two pixels and in surrounds the first area, the metal layer comprising a first hole located in the first area.

17. The display device of claim 16, wherein the metal layer comprises a material that is the same as a material of the trace lines.

18. The display device of claim 16, wherein the input sensing section comprises:
at least one conductive layer comprising the sensing electrodes or the trace lines; and an insulating layer on the conductive layer, wherein the metal layer comprises a material that is the same as a material of the at least one conductive layer.

19. The display device of claim 18, wherein the insulating layer comprises a hole having a width that corresponds to the first area.

20. The display device of claim 18, wherein the insulating layer covers an edge of the metal layer that defines the first hole.

21. The display device of claim 16, wherein the metal layer comprises at least one compound selected from molybdenum (Mo), magnesium (Mg), silver (Ag), titanium (Ti), copper (Cu), aluminum (Al), and an alloy of these materials.

22. The display device of claim 16, wherein the sensing electrodes comprise two sensing electrodes spaced apart from each other with the metal layer between the two sensing electrodes.

23. The display device of claim 22, further comprising at least one line arranged between an outer edge of the metal layer and the two sensing, electrodes.

24. The display device of claim 23, wherein the at least one line comprises a first line, the first line comprising a plurality of first material portions spaced apart from each other with at least one first opening portion between the plurality of first material portions.

25. The display device of claim 24, wherein the at least one line further comprises:
a second line disposed closer to the metal layer than the first line; and
the second line comprises a plurality of second material portions spaced apart from each other with at least cane second opening portion between the plurality of second material portions.

26. The display device of claim 25, wherein an area of each of the plurality of second material portions is greater than an area of each of the plurality of first material portions.

27. The display device of claim 24, further comprising:
a dummy electrode located between sensing electrodes adjacent to the metal layer from among the sensing electrodes,
wherein the first opening portion is adjacent to the dummy electrode.

28. The display device of claim 16, further comprising an optical functional section on the metal layer.

29. The display device of claim 28, wherein the optical functional section comprises a second hole overlapping the first hole, the second hole is larger than the first hole.

30. The display device of claim 28, wherein the optical functional section comprises at least one optical device selected from a polarizer, a retarder, a destructive interference structure, or a structure of a color filter and a black matrix.

31. The display device of claim 16, wherein the display panel further comprises:
a substrate;
a display layer on the substrate and comprising the two pixels; and
an encapsulation member on the display layer.

32. The display device of claim 31, wherein
the display layer comprises a hole having a width that corresponds to the first area; and
an upper surface of the substrate and a lower surface of the encapsulation member face each other through the hole of the display layer.

33. The display device of claim 32, wherein at least one of the substrate or the encapsulation member comprises a glass material.

34. A display device comprising:
a display layer having a plurality of pixels disposed in a second area of the display device;
a first area disposed between two adjacent pixels in the second area, the first area including a transmission area and a component disposed in the first area;
a third area disposed between the second area and the first area;
a metal layer disposed in the third area, the metal layer having a first hole locate in the transmission area, the first hole having a first width;
the display layer including a second hole located in the transmission area having a second width that is less than the first width; and
an optical functional section disposed on the metal layer, the optical functional section comprising a third hole that overlaps the second hole and first hole, the third hole having a third width that is greater than the first width,
wherein the first hole, second hole and third hole form a fourth hole that prevents a field of view restriction for the component.

35. A display device comprising:
a display panel comprising a plurality of pixels arranged in the display area, the plurality of pixels including two adjacent pixels spaced apart from each other with a transmission area disposed between the two adjacent pixels;
an input sensing section disposed on the display panel and comprising sensing electrodes and trace lines electrically connected to the sensing electrodes; and
a metal layer on the display panel, the metal layer disposed between the display area and the transmission area in a plan view, the metal layer comprising a first hole located in the transmission area.

36. The display device of claim 35, further comprising an optical functional section on the metal layer, wherein:
the first hole having a first width, and
the optical functional section comprises a second hole that overlaps the first hole, and the second hole has a second width that is greater than the first width.

* * * * *